US011043498B1

(12) United States Patent
Han et al.

(10) Patent No.: US 11,043,498 B1
(45) Date of Patent: Jun. 22, 2021

(54) SEMICONDUCTOR MEMORY DEVICE

(71) Applicant: SAMSUNG ELECTRONICS CO., LTD., Suwon-si (KR)

(72) Inventors: Sang-Il Han, Seoul (KR); Sunghee Han, Hwaseong-si (KR); Yoosang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/806,667

(22) Filed: Mar. 2, 2020

(30) Foreign Application Priority Data

Jan. 7, 2020 (KR) ........................ 10-2020-0001855

(51) Int. Cl.
*H01L 27/108* (2006.01)

(52) U.S. Cl.
CPC .. *H01L 27/10814* (2013.01); *H01L 27/10852* (2013.01); *H01L 27/10897* (2013.01)

(58) Field of Classification Search
CPC ......... H01L 27/10814; H01L 27/10897; H01L 27/10852
See application file for complete search history.

(56) References Cited

U.S. PATENT DOCUMENTS

| | | | |
|---|---|---|---|
| 8,580,681 B2 | 11/2013 | Sako | |
| 9,312,327 B2 | 4/2016 | Ozawa et al. | |
| 9,379,042 B2 | 6/2016 | Park et al. | |
| 10,109,635 B2 | 10/2018 | Kusumoto et al. | |
| 2018/0158526 A1* | 6/2018 | Kim ...................... | G11C 11/005 |

FOREIGN PATENT DOCUMENTS

| | | |
|---|---|---|
| KR | 10-2008-0017633 A | 2/2008 |
| KR | 10-2010-0085391 A | 7/2010 |

\* cited by examiner

*Primary Examiner* — Edward Chin
(74) *Attorney, Agent, or Firm* — Sughrue Mion, PLLC

(57) ABSTRACT

A semiconductor memory device is provided. The device includes a substrate including a cell region and a peripheral region; a plurality of lower electrodes disposed on the substrate in the cell region; a dielectric layer disposed on the plurality of lower electrodes; a metal containing layer disposed on the dielectric layer; a silicon germanium layer disposed on and electrically connected to the metal containing layer; a conductive pad disposed on and electrically connected to the silicon germanium layer; and an upper electrode contact plug disposed on and electrically connected to the conductive pad; The conductive pad extends from the upper electrode contact plug towards the peripheral region in a first direction, and the silicon germanium layer includes an edge portion that extends past the conductive pad in the first direction.

20 Claims, 53 Drawing Sheets

SEMICONDUCTOR MEMORY DEVICE

CROSS-REFERENCE TO RELATED APPLICATION

This application claims priority from Korean Patent Application No. 10-2020-0001855 filed on Jan. 7, 2020, in the Korean Intellectual Property Office, the entire contents of which are hereby incorporated by reference.

BACKGROUND

Embodiments of the present disclosure relate to a semiconductor memory device.

Due to their small-size, diverse functionality, and low-cost characteristics, semiconductor devices are increasingly viewed as important elements in the electronic industry. With the advancement of the electronic industry, there is an increasing demand for a semiconductor device with higher integration density. To increase the integration density of the semiconductor device, it is necessary to reduce linewidths of patterns constituting the semiconductor device. However, in order to reduce the linewidths of patterns, it is necessary to develop a novel and expensive lithography technology, and thus, it becomes more and more difficult to increase an integration density of a semiconductor memory device. Recently, a variety of new technologies are being studied to increase an integration density of a semiconductor memory device. For example, a structure, in which word lines are buried in a semiconductor substrate, is being studied for a next-generation dynamic random access memory (DRAM) device.

SUMMARY

One or more embodiments provide a semiconductor memory device with a reduced chip size and improved reliability.

According to an embodiment, a semiconductor memory device includes a substrate including a cell region and a peripheral region; a plurality of lower electrodes disposed on the substrate in the cell region; a dielectric layer disposed on the plurality of lower electrodes; a metal containing layer disposed on the dielectric layer; a silicon germanium layer disposed on and electrically connected to the metal containing layer; a conductive pad disposed on and electrically connected to the silicon germanium layer; an upper electrode contact plug disposed on and electrically connected to the conductive pad; a bit line that is disposed on the substrate in the cell region and extends in a first direction; and a plurality of word lines provided in the substrate in the cell region and extending in a second direction that crosses the first direction. The conductive pad extends from the upper electrode contact plug towards the peripheral region in the first direction, and the silicon germanium layer includes an edge portion that extends past the conductive pad in the first direction.

According to an embodiment, a semiconductor memory device includes a substrate including a cell region and a peripheral region; a plurality of lower electrodes disposed on the substrate in the cell region; a dielectric layer disposed on the plurality of lower electrodes; a metal containing layer disposed on the dielectric layer; a silicon germanium layer disposed on and electrically connected to the metal containing layer; a first conductive pad and a second conductive pad that are disposed on and electrically connected to the silicon germanium layer; a first upper electrode contact plug disposed on and electrically connected to the first conductive pad; a second upper electrode contact plug disposed on and electrically connected to the second conductive pad; an interlayer insulator disposed on a first portion of the silicon germanium layer between the first conductive pad and the second conductive pad, and a second portion of the silicon germanium layer between the second conductive pad and the peripheral region; a bit line that is disposed on the substrate in the cell region and extends in a first direction; and a plurality of word lines provided in the substrate in the cell region and extending in a second direction that crosses the first direction.

According to an embodiment, a method of manufacturing a a semiconductor memory device includes providing a substrate including a cell region and a peripheral region; forming a plurality of lower electrodes on the substrate in the cell region; forming a dielectric layer on the plurality of lower electrodes; forming a metal containing layer on the dielectric layer; forming a silicon germanium layer that is electrically connected to the metal containing layer on the metal containing layer; forming a conductive layer that is disposed in the cell region and the peripheral region of the substrate, and is in contact with a top surface of the silicon germanium layer and a side surface of the silicon germanium layer; forming a first etch mask pattern on the top surface of the silicon germanium layer; performing an etch process using the first etch mask pattern to laterally etch the side surface of the conductive layer; forming an interlayered insulating layer on the top surface and the side surface of the silicon germanium layer; forming a second etch mask pattern on the interlayered insulating layer, the second etch mask pattern defining a first opening that overlaps the cell region and a second opening that overlaps the peripheral region; performing an etch process using the second etch mask pattern to form an upper electrode contact hole in the cell region and a peripheral contact hole in the peripheral region, the peripheral contact hole being deeper than the upper electrode contact hole; and filling the upper electrode contact hole and the peripheral contact hole with a conductive material to form an upper contact plug in the upper electrode contact hole and a peripheral contact plug in the peripheral contact hole.

BRIEF DESCRIPTION OF THE DRAWINGS

The above and other aspects, features and advantages will become apparent from the following detailed description taken in conjunction with the accompanying drawings in which.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1A:
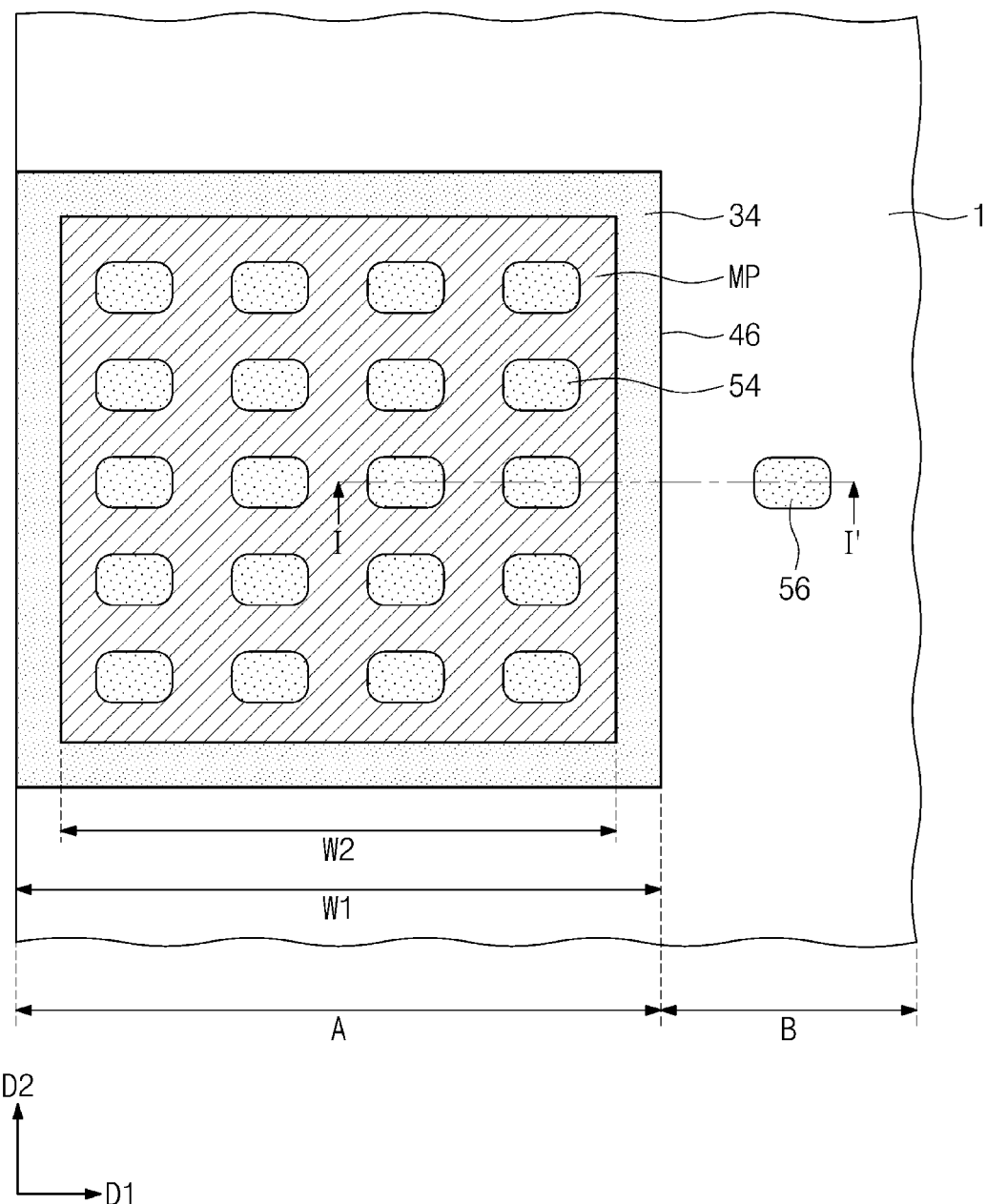
FIG. 1A is a plan view illustrating a semiconductor memory device according to an embodiment.
Figure 1B:
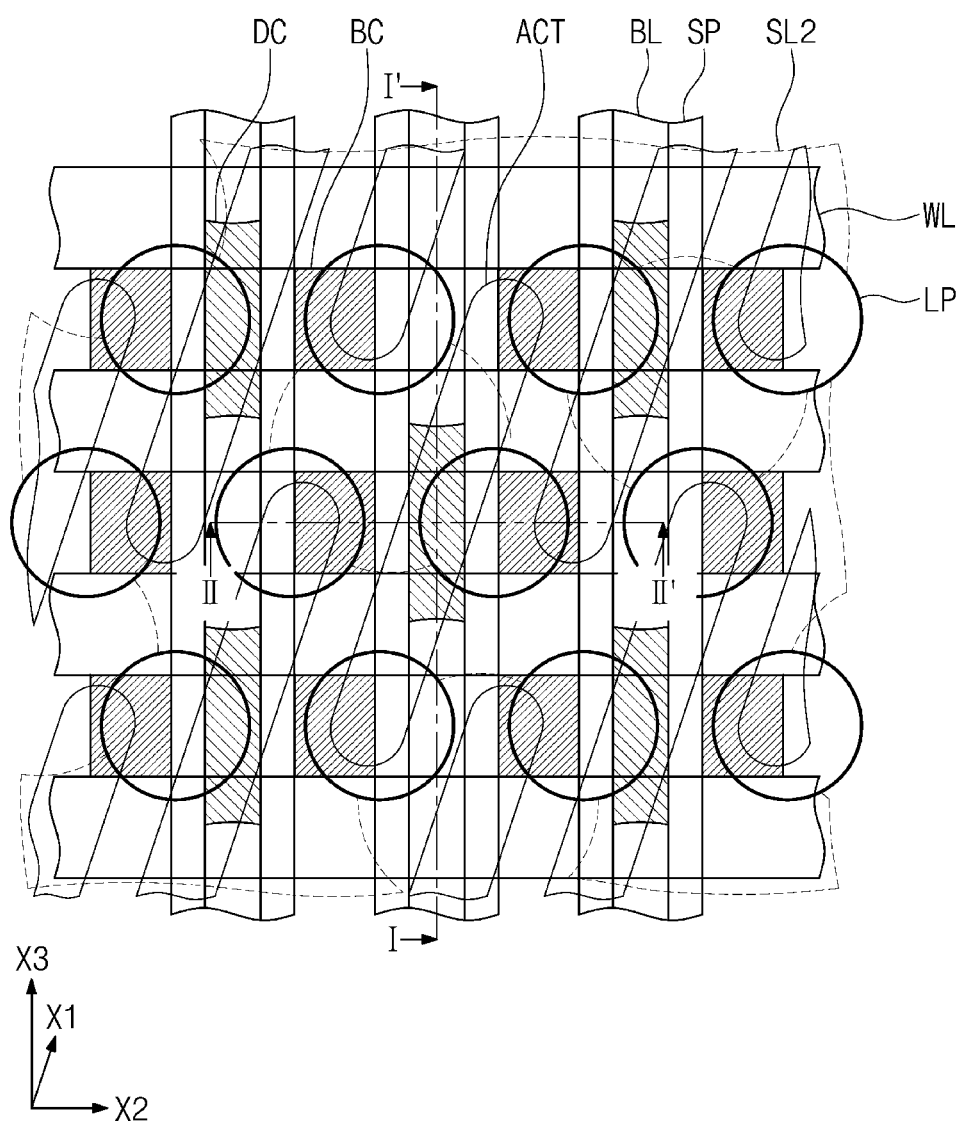
FIG. 1B is a plan view illustrating a cell region of a semiconductor memory device according to an embodiment.
Figure 2A:
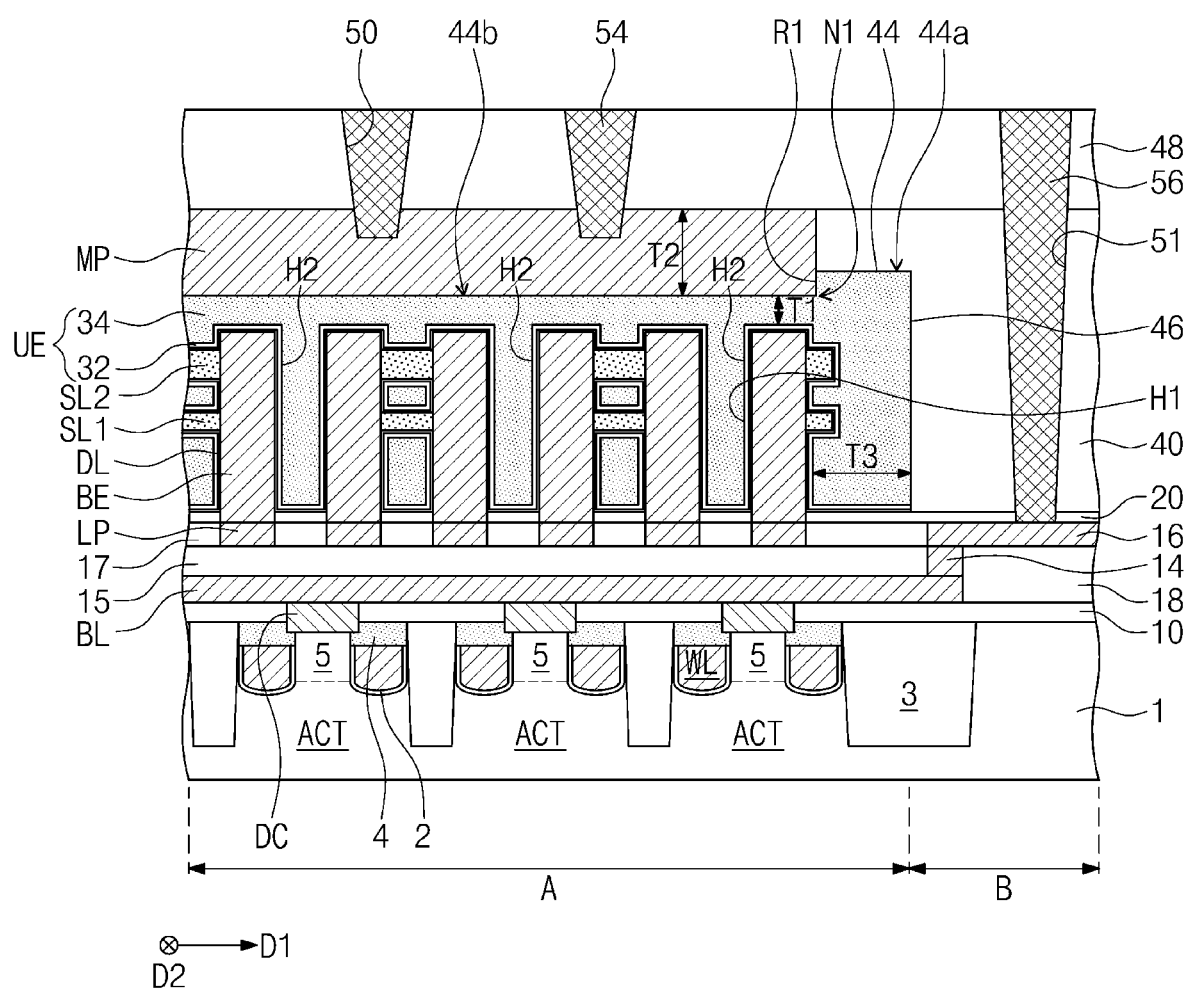
FIG. 2A is a sectional view taken along a line I-I' of FIG. 1A.
Figure 2B:
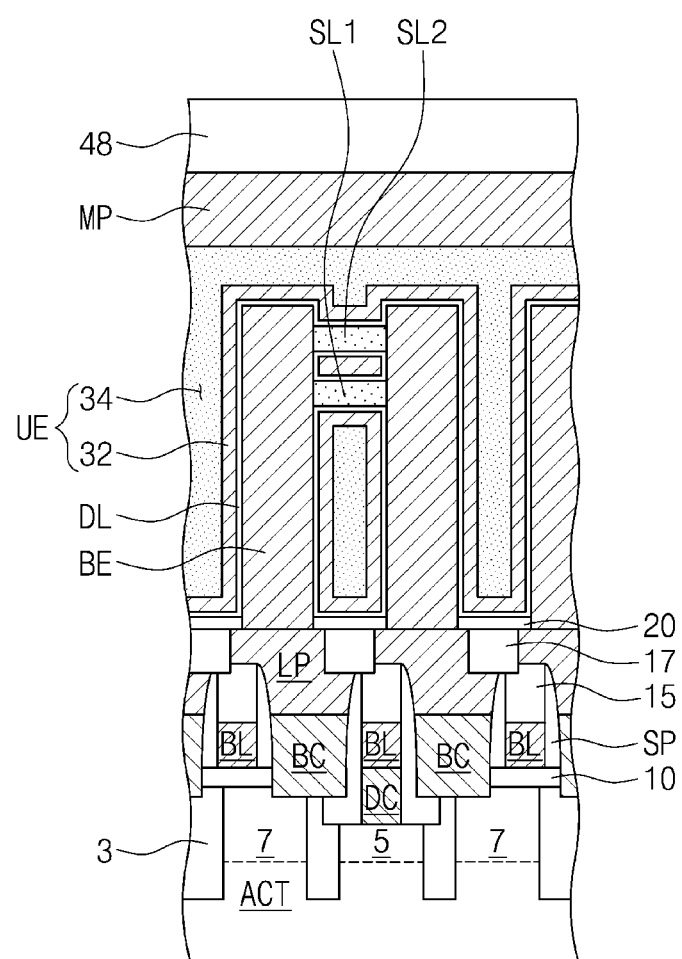
FIG. 2B is a sectional view taken along a line II-IF of FIG. 1B.

FIG. 1A is a plan view illustrating a semiconductor memory device according to an embodiment. FIG. 1B is a plan view illustrating a cell region of a semiconductor memory device according to an embodiment. FIG. 2A is a sectional view taken along a line I-I' of FIG. 1A. FIG. 2B is a sectional view taken along a line II-IF of FIG. 1B.

Referring to FIGS. 1A, 1B, 2A, and 2B, a semiconductor substrate 1 may have a cell region A and a peripheral region B. The cell region A may be a cell array region or may include memory cell blocks. The peripheral region B may be a peripheral circuit region or a core region. In the present embodiments, the semiconductor memory device may be a dynamic random access memory (DRAM) device.

Device isolation layers 3 may be disposed in the semiconductor substrate 1 to define active regions ACT. The device isolation layer 3 may separate the cell region A from the peripheral region B. Word lines WL may be buried in the semiconductor substrate 1. A cell gate insulating layer 2 may be interposed between the word lines WL and the semiconductor substrate 1, and word line capping patterns 4 may be disposed on the word lines WL. Top surfaces of the word line capping patterns 4 may be coplanar with a top surface of the semiconductor substrate 1. A first impurity injection region 5 may be disposed in a portion of the semiconductor substrate 1 at a side of each of the word lines WL, and a second impurity injection region 7 may be disposed in another portion of the semiconductor substrate 1 at an opposite side of each of the word lines WL. In an embodiment, the first impurity injection region 5 may serve as a source region of a memory cell transistor. The second impurity injection region 7 may serve as a drain region of the memory cell transistor.

In the cell region A, a first interlayered insulating layer 10 may be provided to cover the semiconductor substrate 1. The first interlayered insulating layer 10 may be formed of or include an insulating material (e.g., silicon oxide, silicon nitride, or silicon oxynitride).

A bit line BL may be provided on the cell region A of the semiconductor substrate 1 and may be electrically connected to the first impurity injection region 5 of the semiconductor substrate 1 through a bit line contact plug DC. The bit line BL may be spaced apart from the semiconductor substrate 1 with the first interlayered insulating layer 10 interposed therebetween, and the first interlayered insulating layer 10 may be provided to enclose the bit line contact plug DC. A bit line capping pattern 15 may be provided to cover a top surface of the bit line BL. The bit line capping patterns 15 may be formed of or include an insulating material (e.g., silicon nitride).

The second impurity injection region 7 may be connected to a lower electrode contact plug BC. A landing pad LP may be disposed on the lower electrode contact plug BC. The landing pads LP may be electrically disconnected from each other by a second interlayered insulating layer 17. The second interlayered insulating layer 17 may be formed of or include an insulating material (e.g., silicon oxide, silicon nitride, or silicon oxynitride).

The lower electrode contact plug BC may include a doped polysilicon pattern, and the landing pad LP may include a barrier metal layer and a metal pattern. The barrier metal layer may include, for example, at least one of a titanium layer or a titanium nitride layer. The metal pattern may be formed of or include, for example, tungsten.

A peripheral interlayered insulating layer 18 and a peripheral interconnection line 16 may be provided on the first interlayered insulating layer 10 and on the peripheral region B. A top surface of the peripheral interconnection line 16 may be located at the same level as a top surface of the landing pad LP. The peripheral interconnection line 16 may be electrically connected to the bit line BL through a via 14.

An etch stop layer 20 may be provided on the second interlayered insulating layer 17 and on the cell region A. The etch stop layer 20 may extend to the peripheral region B to cover the peripheral interconnection line 16. The etch stop layer 20 may be formed of or include an insulating material (e.g., silicon nitride, silicon oxide, and silicon oxynitride).

In the cell region A, a plurality of lower electrodes BE may be disposed on the second interlayered insulating layer 17 and may be connected to the landing pad LP, respectively. The lower electrodes BE, along with a dielectric layer DL, a metal-containing layer 32, and an upper electrode UE, may constitute a capacitor.

The lower electrode BE may be formed of a conductive material (e.g., doped polysilicon) or a metal-containing material (e.g., titanium nitride). Each of the lower electrodes BE may have a pillar shape or a cylindrical shape.

A first support pattern SL1 and a second support pattern SL2, which are spaced apart from each other in a direction normal to the top surface of the semiconductor substrate 1, may be provided between the lower electrodes BE. Side surfaces of adjacent ones of the lower electrodes BE may be connected to the first and second support patterns SL1 and SL2. The first and second support patterns SL1 and SL2 may be formed of or include, for example, silicon oxide. The first support pattern SL1 and the second support pattern SL2 may include a first support hole H1 and a second support hole H2, respectively. The first support hole H1 and the second support hole H2 may expose side surfaces of adjacent ones of the lower electrodes BE.

The dielectric layer DL may be provided on the cell region A to conformally cover the top and side surfaces of the lower electrodes BE, the top surface of the etch stop layer 20, and the exposed surfaces of the first and second support patterns SL1 and SL2. The dielectric layer DL may be formed of or include at least one of oxides, nitrides, silicides, oxynitrides, or silicon oxynitride containing one of hafnium (Hf), aluminum (Al), zirconium (Zr), and lanthanum (La). The dielectric layer DL may be conformally covered with the top surface of metal-containing layer 32. The metal-containing layer 32 may be, for example, a titanium nitride layer. A silicon germanium layer 34 may be disposed on the metal-containing layer 32 to fill spaces between the lower electrodes BE. The silicon germanium layer 34 may be doped with impurities and may have a conductive property. The metal-containing layer 32 and the silicon germanium layer 34 may constitute the upper electrode UE.

The silicon germanium layer 34 may include a top surface 44 and a side surface 46. The top surface 44 of the silicon germanium layer 34 may be located at positions overlapped with the lower electrodes BE, and the side surface 46 of the silicon germanium layer 34 may be adjacent to a side surface of the lower electrode BE, which is located at an edge of the cell region A.

A third interlayered insulating layer 40 may be disposed on the peripheral region B to cover the etch stop layer 20. The third interlayered insulating layer 40 may cover the side surface 46 of the silicon germanium layer 34 and may cover a portion of the top surface 44 of the silicon germanium layer 34. The third interlayered insulating layer 40 may be formed of or include at least one of plasma-enhanced tetra ethyl ortho silicate (PE-TEOS), boron phosphorus silicate glass (BPSG), phosphorus silicate glass (PSG), or high-density plasma (HDP) oxide.

A conductive pad MP may be provided on the top surface 44 of the upper electrode UE. The conductive pad MP may be formed of or include a conductive metallic material. For example, the conductive pad MP may be formed of or include tungsten (W) or titanium (Ti). The conductive pad MP may extend from an upper electrode contact plug 54 towards the peripheral region B in a first direction, and the silicon germanium layer 34 includes an edge portion that extends past the conductive pad in the first direction.

A portion of the top surface of the upper electrode UE may be in contact with the conductive pad MP. When viewed in a plan view, the conductive pad MP may be enclosed by the upper electrode UE. The upper electrode UE may have a first width W1 in a first direction D1 parallel to the top surface of the semiconductor substrate 1. The conductive pad MP may have a second width W2 in the first direction D1. The second width W2 may be less than the first width W1.

The upper electrode UE may have a recess R1, which is filled with a portion of the conductive pad MP. A portion of the top surface 44 of the upper electrode UE (e.g., an edge portion of the upper electrode UE) may not be covered with the conductive pad MP and may be exposed. Such an exposed portion 44a of the top surface 44 of the upper electrode UE may be located at a level different from the top surface 44b of the upper electrode UE, which are overlapped with the conductive pad MP. Thus, the top surface 44a of the edge portion of the silicon germanium layer 34, the top surface 44b of the silicon germanium layer 34 overlapped with the conductive pad MP, and a surface of the silicon germanium layer 34 connecting them may form a step structure N1. A level of a bottom surface of the conductive pad MP may be substantially the same as the level of the top surface 44b of the silicon germanium layer 34 overlapped with the conductive pad MP. The level of the bottom surface of the conductive pad MP may be lower than a level of the topmost portion 44a of the top surface 44 of the upper electrode UE.

In a related semiconductor device, the distance from the topmost surface of a lower electrode to a top surface of an upper electrode may be about 2600 angstroms (Å). According to an example embodiment, a distance T1 from the topmost surface of the lower electrode BE to the top surface of the upper electrode UE in contact with the conductive pad MP may be less than a thickness T2 of the conductive pad MP. As an example, the distance T1 from the topmost surface of the lower electrode BE to the top surface of the upper electrode UE in contact with the conductive pad MP may be about 1000 Å, and the thickness T2 of the conductive pad MP may be about 1500 Å. The shortest distance T3 from the side surface 46 of the silicon germanium layer 34 to a side surface of the lower electrode BE adjacent thereto may be less than the thickness T2 of the conductive pad MP. As an example, the shortest distance T3 from the side surface 46 of the silicon germanium layer 34 to the side surface of the lower electrode BE adjacent thereto may be about 1000 Å, and the thickness T2 of the conductive pad MP may be about 1500 Å.

The conductive pad MP and the third interlayered insulating layer 40 may be covered with a fourth interlayered insulating layer 48. The fourth interlayered insulating layer 48 may be formed of or include the same or similar material as the third interlayered insulating layer 40.

Upper electrode contact plugs 54 may be disposed on the cell region A to penetrate the fourth interlayered insulating layer 48 and a portion of the conductive pad MP and may be electrically connected to the upper electrode UE. The upper electrode contact plugs 54 may be disposed in upper electrode contact holes 50, respectively. The upper electrode contact plugs 54 may be formed of or include, for example, a metallic material (e.g., tungsten). The upper electrode contact plugs 54 may be formed of the same material as the conductive pad MP, but in an embodiment, the upper electrode contact plugs 54 may be formed of a metallic material different from the conductive pad MP. Bottom surfaces of the upper electrode contact plugs 54 may be located at a level that is lower than a level of a top surface of the conductive pad MP and may be higher than a level of the top surface 44 of the upper electrode UE.

A peripheral contact plug 56 may be provided on the peripheral region B to penetrate the fourth interlayered insulating layer 48, the third interlayered insulating layer 40, and the etch stop layer 20 and thereby to be electrically connected to the peripheral interconnection line 16. The peripheral contact plug 56 may be used to apply a voltage to the bit line BL through the peripheral interconnection line 16 and the via 14. The peripheral contact plug 56 may be provided in a peripheral contact hole 51

In an embodiment, the upper electrode UE may include the metal-containing layer 32, but embodiments are not limited to this example. For example, the upper electrode UE may be composed of only the silicon germanium layer 34, without the metal-containing layer 32.

According to an embodiment, the conductive pad may be provided on the silicon germanium layer constituting the upper electrode, and thus, it may be possible to reduce a thickness of the silicon germanium layer, compared with the case that the upper electrode is formed of only the silicon germanium layer. In addition, a width of the silicon germanium layer may be reduced at the edge portion of the silicon germanium layer, and this may make it possible to reduce a chip size of a semiconductor device. This is because a width of the silicon germanium layer 34 corresponds to a height of the silicon germanium layer 34. That is, to form a silicon germanium layer with an increased thickness results in an increased width of the silicon germanium layer.

When the upper electrode contact plugs are formed on the silicon germanium layer, the upper electrode contact plug may be in contact with the conductive pad, and thus, the contact plugs may not penetrate the silicon germanium layer. Accordingly, it may be possible to prevent the contact plugs from being connected to the lower electrodes and thereby to prevent a short circuit from being formed between the memory cells.

In addition, the conductive pad may be formed of a different material from the silicon germanium layer and may include a metal material with high conductivity, and thus, it may be possible to reduce electric resistance between the silicon germanium layer and the upper electrode contact plug.

Figure 3A:
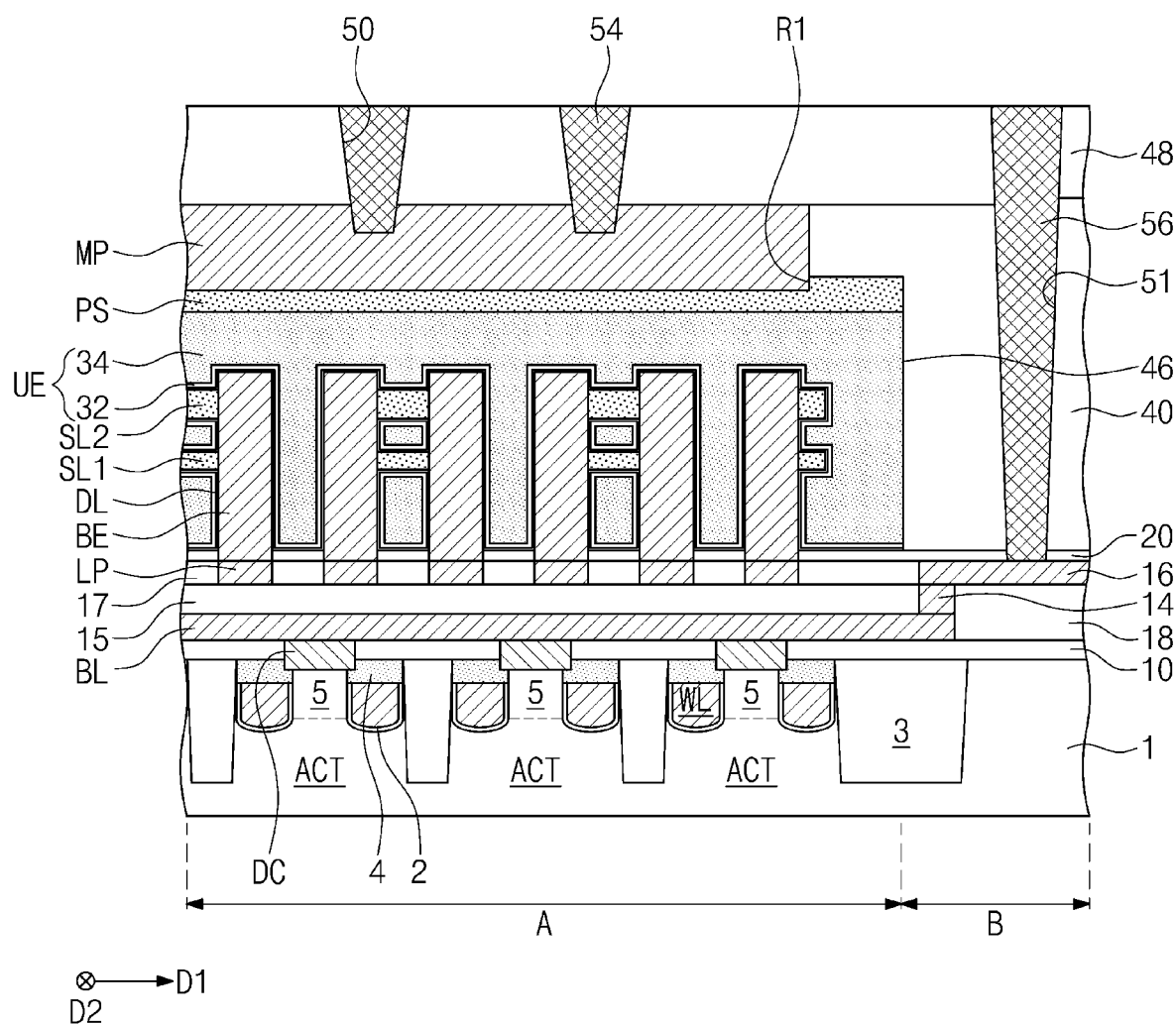
FIG. 3A is a sectional view of a semiconductor memory device according to an embodiment, corresponding to the line I-I' of FIG. 1A.

FIG. 3A is a sectional view of a semiconductor memory device according to an embodiment, corresponding to the line I-I' of FIG. 1A. For concise description, an element previously described with reference to FIG. 2A may be identified by the same reference number without repeating an overlapping description thereof.

Referring to FIGS. 1A and 3A, a poly-silicon layer PS may be provided on the silicon germanium layer 34. The poly-silicon layer PS may be doped with impurities (e.g., boron) and may have a conductive property. The poly-silicon layer PS may be in contact with a top surface of the silicon germanium layer 34. The poly-silicon layer PS may cover wholly, or substantially wholly, the top surface of the silicon germanium layer 34.

The third interlayered insulating layer 40 may cover top and side surfaces of the poly-silicon layer PS. The conductive pad MP and the silicon germanium layer 34 may be spaced apart from each other in a vertical direction, with the poly-silicon layer PS interposed therebetween. A portion of a top surface of the poly-silicon layer PS may be in contact with the conductive pad MP. When viewed in a plan view, the conductive pad MP may be enclosed by the poly-silicon layer PS. The poly-silicon layer PS may have the recess R1, and a portion of the conductive pad MP may fill the recess R1 of the poly-silicon layer PS. A portion of the top surface of the poly-silicon layer PS (e.g., an edge portion of the upper electrode UE) may not be veiled by the conductive pad MP and may be exposed. The exposed portion of the top surface of the poly-silicon layer PS may be located at a level different from the top surface of the poly-silicon layer PS, which are overlapped with the conductive pad MP.

Figure 3B:
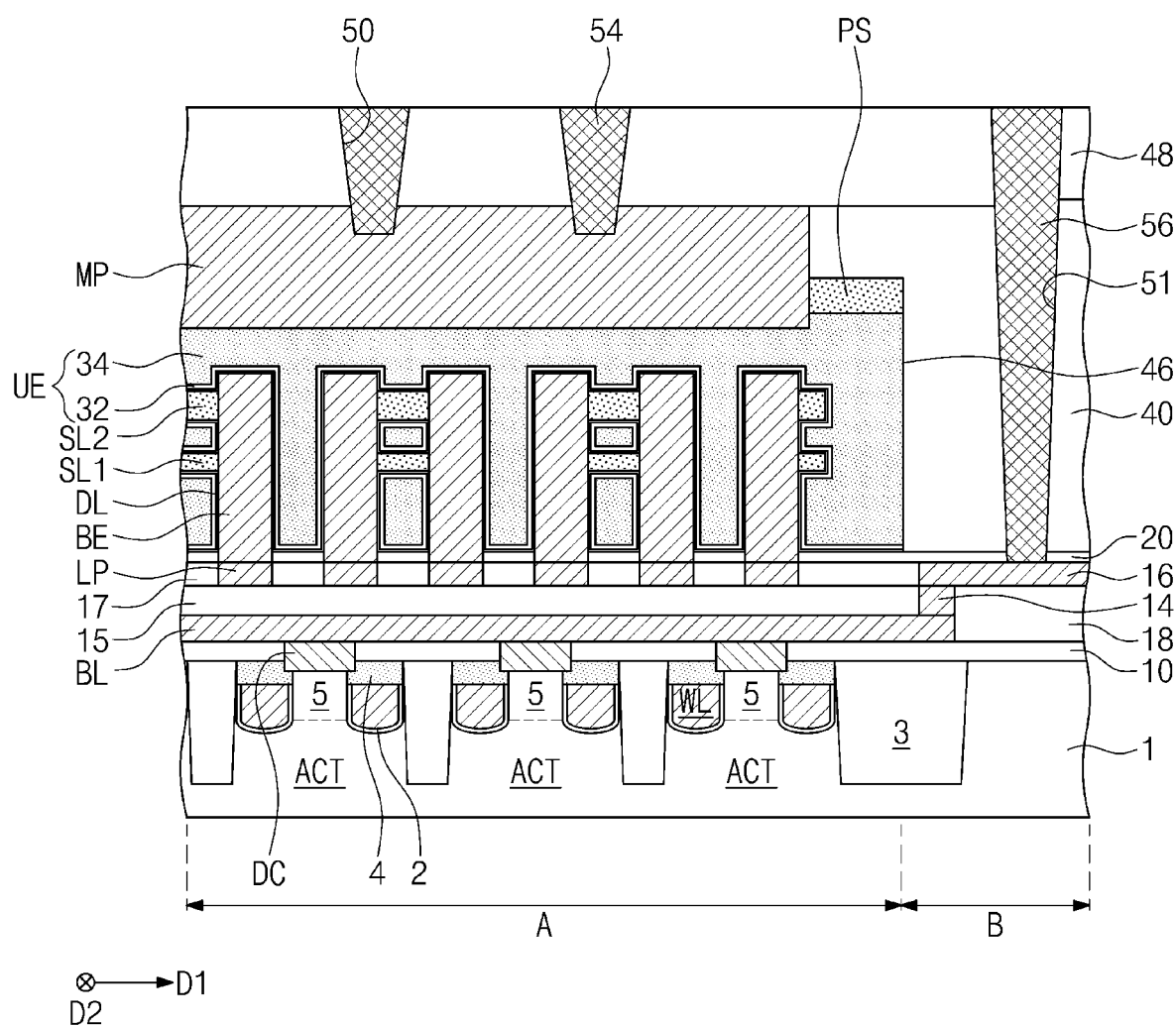
FIG. 3B is a sectional view of a semiconductor memory device according to an embodiment, corresponding to the line I-I' of FIG. 1A.

FIG. 3B is a sectional view of a semiconductor memory device according to an embodiment, corresponding to the line I-I' of FIG. 1A. For concise description, an element previously described with reference to FIG. 3A may be identified by the same reference number without repeating an overlapping description thereof.

Referring to FIGS. 1A and 3B, the conductive pad MP may penetrate of the poly-silicon layer PS and contact the silicon germanium layer 34.

Figure 4:
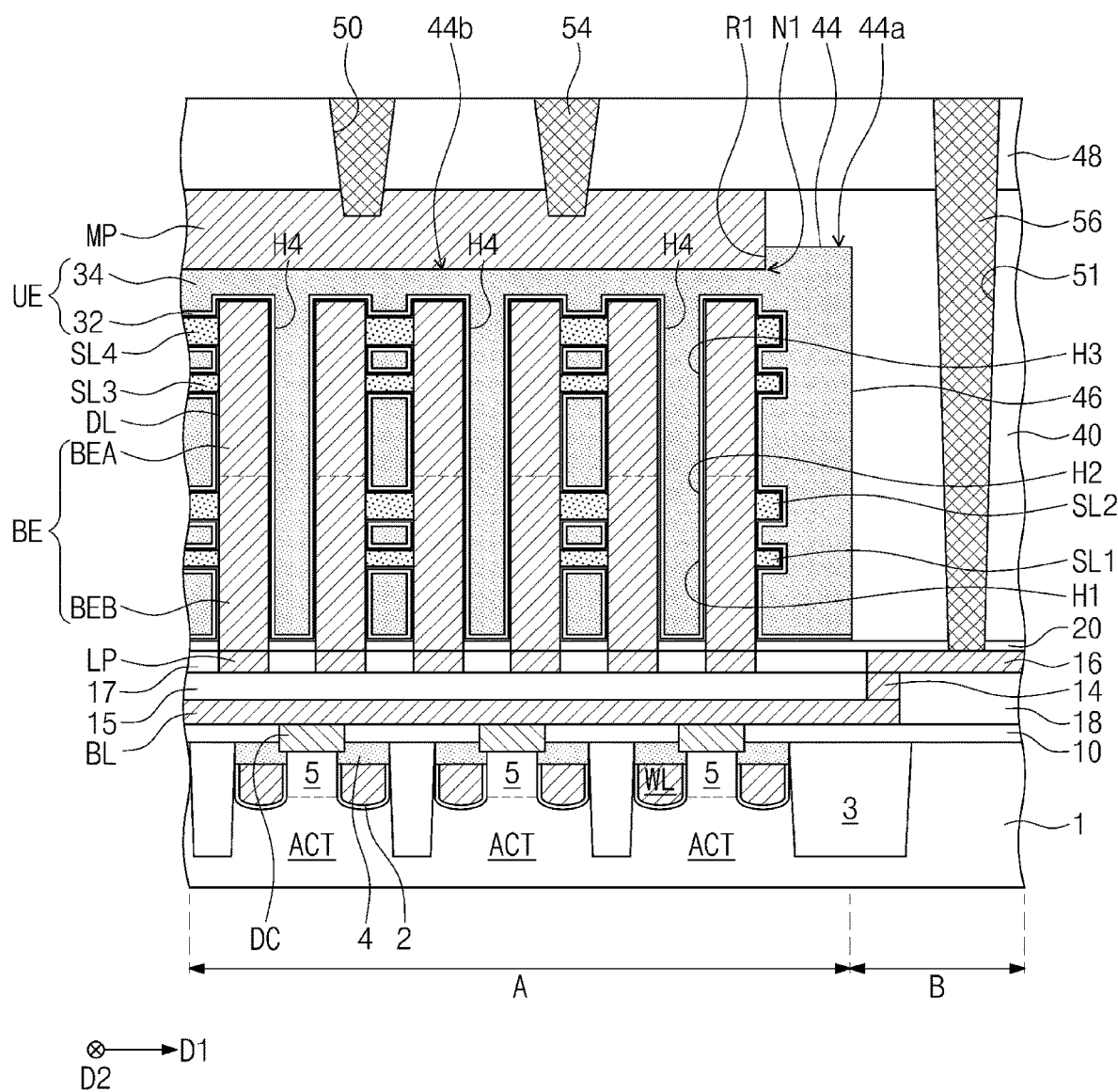
FIG. 4 is a sectional view of a semiconductor memory device according to an embodiment, corresponding to the line I-I' of FIG. 1A.

FIG. 4 is a sectional view of a semiconductor memory device according to an embodiment, corresponding to the line I-I' of FIG. 1A. For concise description, an element previously described with reference to FIG. 2A may be identified by the same reference number without repeating an overlapping description thereof.

Referring to FIGS. 1A and 4, each of the lower electrodes BE may include a first portion BEA and a second portion BEB. A first support pattern SL1, a second support pattern SL2, a third support pattern SL3, and a fourth support pattern SL4, which are spaced apart from each other in a direction normal to the top surface of the semiconductor substrate 1, may be provided between the lower electrodes BE.

Side surfaces of the first portions BEA of adjacent ones of the lower electrodes BE may be connected to the first and second support patterns SL1 and SL2. Side surfaces of the second portions BEB of adjacent ones of the lower electrodes BE may be connected to the third and fourth support patterns SL3 and SL4. The first to fourth support patterns SL1-SL4 may be formed of or include, for example, silicon oxide. The first, second, third, and fourth support patterns SL1, SL2, SL3, and SL4 may include a first support hole H1, a second support hole H2, a third support hole H3, a fourth support hole H4, respectively. The first to fourth support holes H1-H4 may expose side surfaces of adjacent ones of the lower electrodes BE.

The first and second portions BEA and BEB of the lower electrodes BE may be formed of or include the same material or different materials. The lower electrodes BE may be provided to have an interface between the first and second portions BEA and BEB, but in an embodiment, there may be no interface between the first and second portions BEA and BEB. In an embodiment, the first and second portions BEA and BEB may be formed of or include the same material, and this may make it possible to reduce resistance therebetween. As an example, the first and second portions BEA and BEB of the lower electrodes BE may be formed of doped polysilicon or a metal-containing material (e.g., titanium nitride).

On the cell region A, the side surfaces of the first and second portions BEA and BEB of the lower electrodes BE, the top surface of the etch stop layer 20, and the exposed surfaces of the first to fourth support patterns SL1-SL4 may be covered with the dielectric layer DL. The dielectric layer DL may be conformally covered with the metal-containing layer 32.

A height of the lower electrodes BE may be greater than or equal to 1.5 μm. The height of an object may be a length from a bottom surface of the object to a top surface of the object, which is measured in a direction perpendicular to the top surface of the substrate. The height of the lower electrodes BE may be, for example, about 2.1 μm. The height of the peripheral contact plug 56 on the peripheral region B may be greater than or equal to 2 μm.

Figure 5:
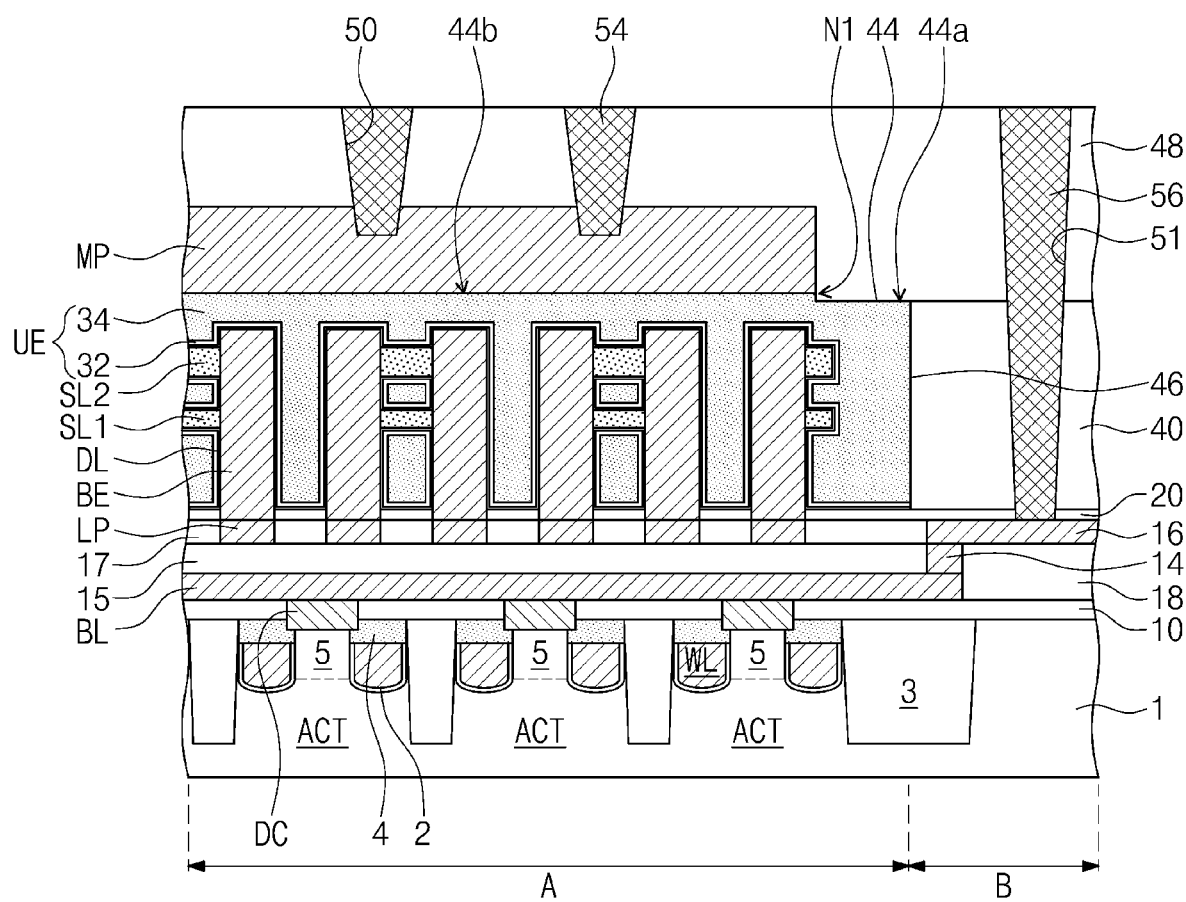
FIG. 5 is a sectional view of a semiconductor memory device according to an embodiment, corresponding to the line I-I' of FIG. 1A.

FIG. 5 is a sectional view of a semiconductor memory device according to an embodiment, corresponding to the line I-I' of FIG. 1A. For concise description, an element previously described with reference to FIG. 2A may be identified by the same reference number without repeating an overlapping description thereof.

Referring to FIGS. 1A and 5, the top surface 44a of the edge portion of the silicon germanium layer 34 may be located at a different level from the top surface 44b of the silicon germanium layer 34 overlapped with the conductive pad MP. For example, the level of the top surface 44a of the edge portion of the silicon germanium layer 34 may be lower than the level of the top surface 44b of the silicon germanium layer 34, which are overlapped with the conductive pad MP. Thus, the top surface 44a of the edge portion of the silicon germanium layer 34, the top surface 44b of the silicon germanium layer 34 overlapped with the conductive pad MP, and a surface of the silicon germanium layer 34 connecting them may form the step structure N1. The top surface 44b of the silicon germanium layer 34, on which the conductive pad MP is placed, may be positioned at the same level as the bottom surface of the conductive pad MP.

In certain embodiments, the level of the top surface 44a of the edge portion of the silicon germanium layer 34 may be substantially the same as the level of the top surface 44b of the silicon germanium layer 34, which are overlapped with the conductive pad MP.

In the silicon germanium layer 34, a surface roughness of the top surface 44 may be different from a surface roughness of the side surface 46. The surface roughness of the top surface 44 of the silicon germanium layer 34 may be less than the surface roughness of the side surface 46.

A top surface of the third interlayered insulating layer 40 may be coplanar with the top surface 44 of the edge portion of the silicon germanium layer 34. The third interlayered insulating layer 40 may cover the side surface 46 of the silicon germanium layer 34 but may not cover the top surface 44 of the silicon germanium layer 34. The fourth interlayered insulating layer 48 may cover an exposed portion of the top surface 44 of the silicon germanium layer 34 and the top and side surfaces of the conductive pad MP.

Figure 6:
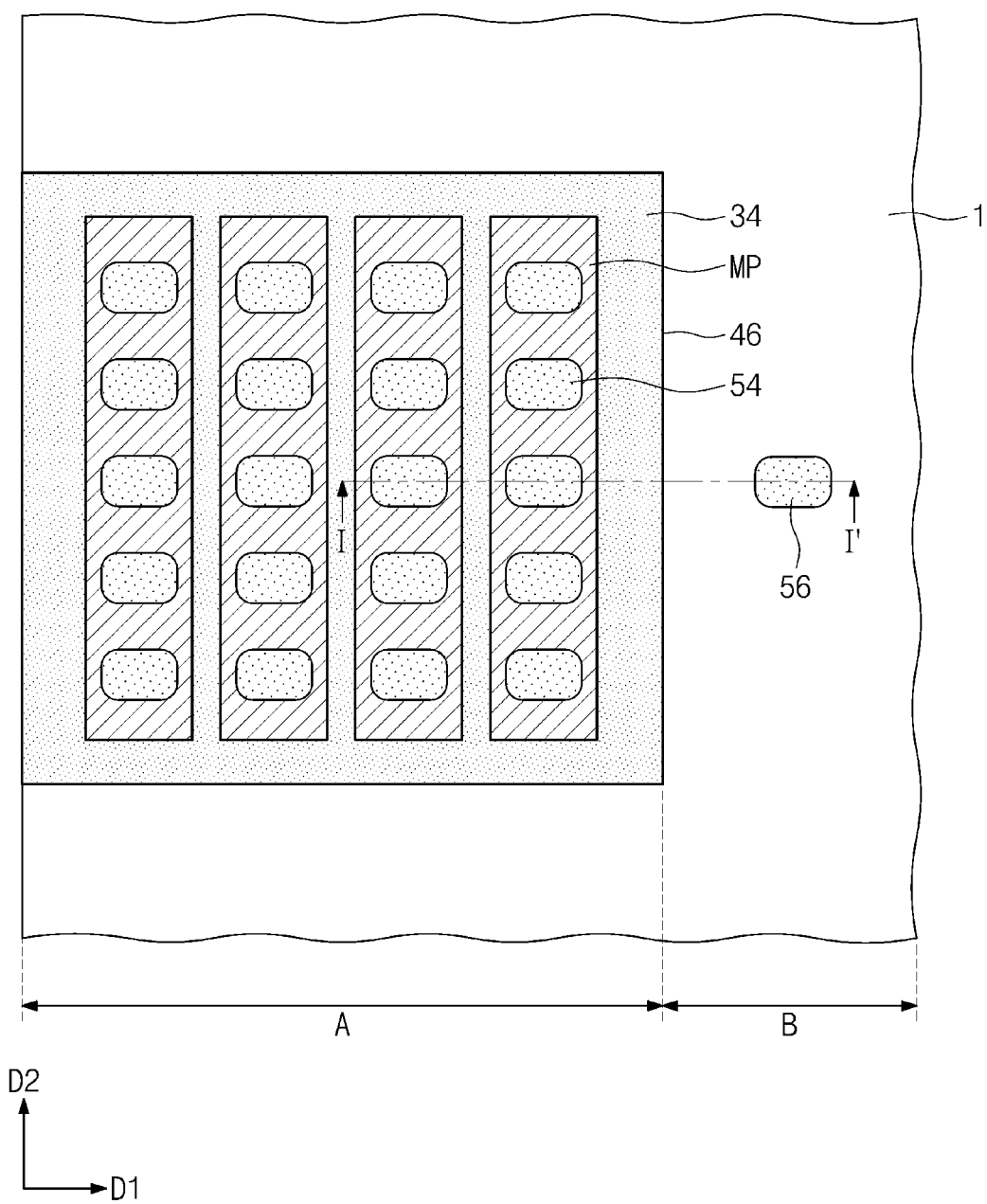
FIG. 6 is a plan view illustrating a semiconductor memory device according to an embodiment.
Figure 7:
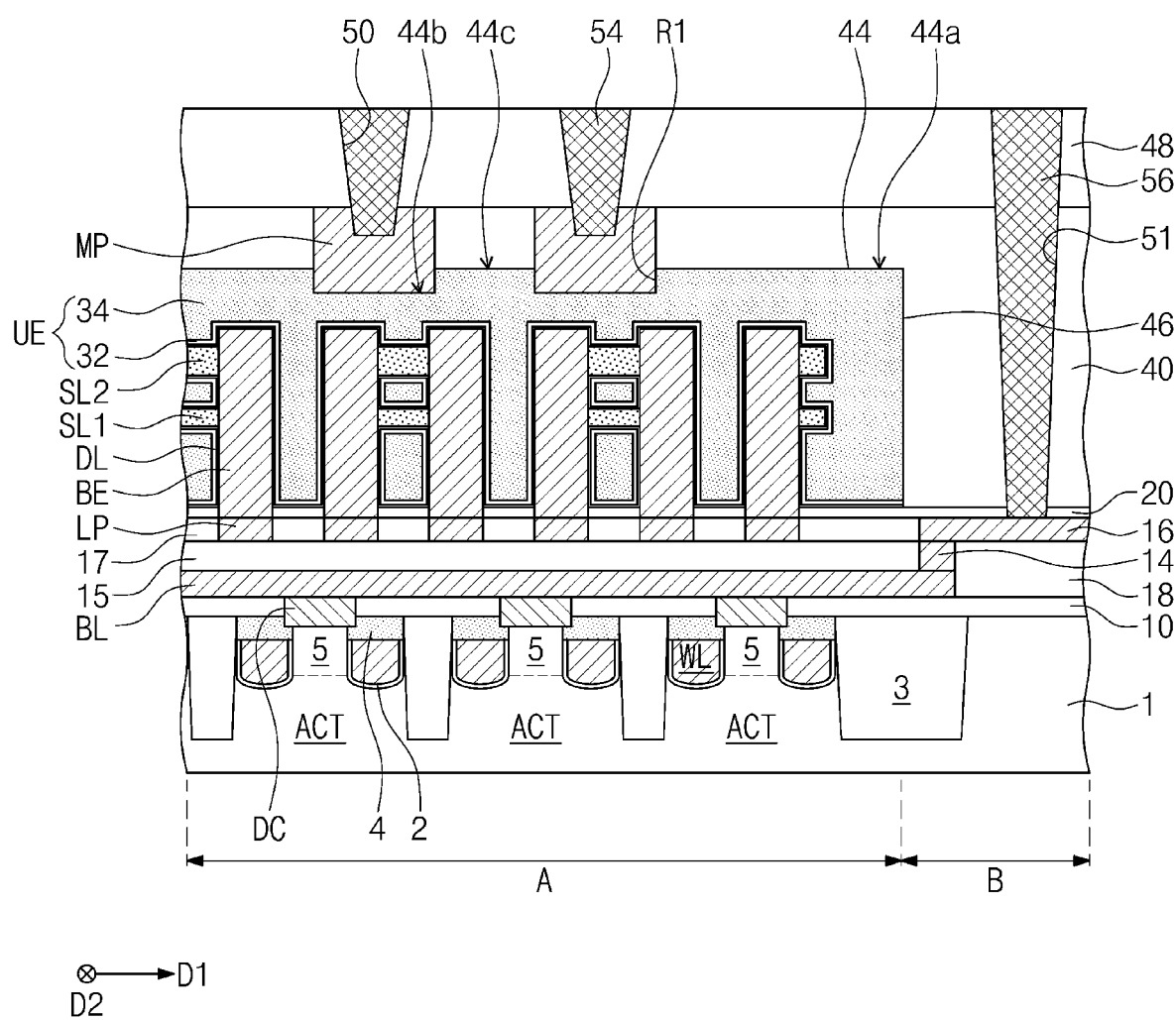
FIG. 7 is a sectional view of a semiconductor memory device according to an embodiment, corresponding to the line I-I' of FIG. 6.

FIG. 6 is a plan view illustrating a semiconductor memory device according to an embodiment. FIG. 7 is a sectional view of a semiconductor memory device according to an embodiment, corresponding to the line I-I' of FIG. 6. For concise description, an element previously described with reference to FIG. 2A may be identified by the same reference number without repeating an overlapping description thereof.

Referring to FIGS. 6 and 7, a plurality of line-shaped conductive pads MP may be provided on the top surface of the silicon germanium layer 34 to be spaced apart from each other in the first direction D1. The line-shaped conductive pads MP may extend in a second direction D2, which is parallel to the top surface of the semiconductor substrate 1 and is not parallel to the first direction D1. The upper electrode contact plugs 54 may be provided on each of the line-shaped conductive pads MP. The upper electrode contact plugs 54 may be partially extended into the line-shaped conductive pads MP.

The silicon germanium layer 34 may be provided to have a plurality of recesses R1. The recesses R1 may be spaced apart from each other in the first direction D1 and may extend in the second direction D2. A portion of each of the conductive pads MP may be provided to fill a corresponding one of the recesses R1.

The line-shaped conductive pads MP may be provided to expose portions of the top surface of the silicon germanium layer 34. The top surface 44c of the silicon germanium layer 34 between the recesses R1 and the top surface 44a of the edge portion of the silicon germanium layer 34 may be located at a level different from the top surface 44b of the silicon germanium layer 34 overlapped with the conductive pads MP (e.g., a bottom surface of the recess).

Regions between adjacent ones of the line-shaped conductive pads MP may be filled with the third interlayered insulating layer 40. The third interlayered insulating layer 40 may cover the top and side surfaces of the silicon germanium layer 3.

Figure 8:
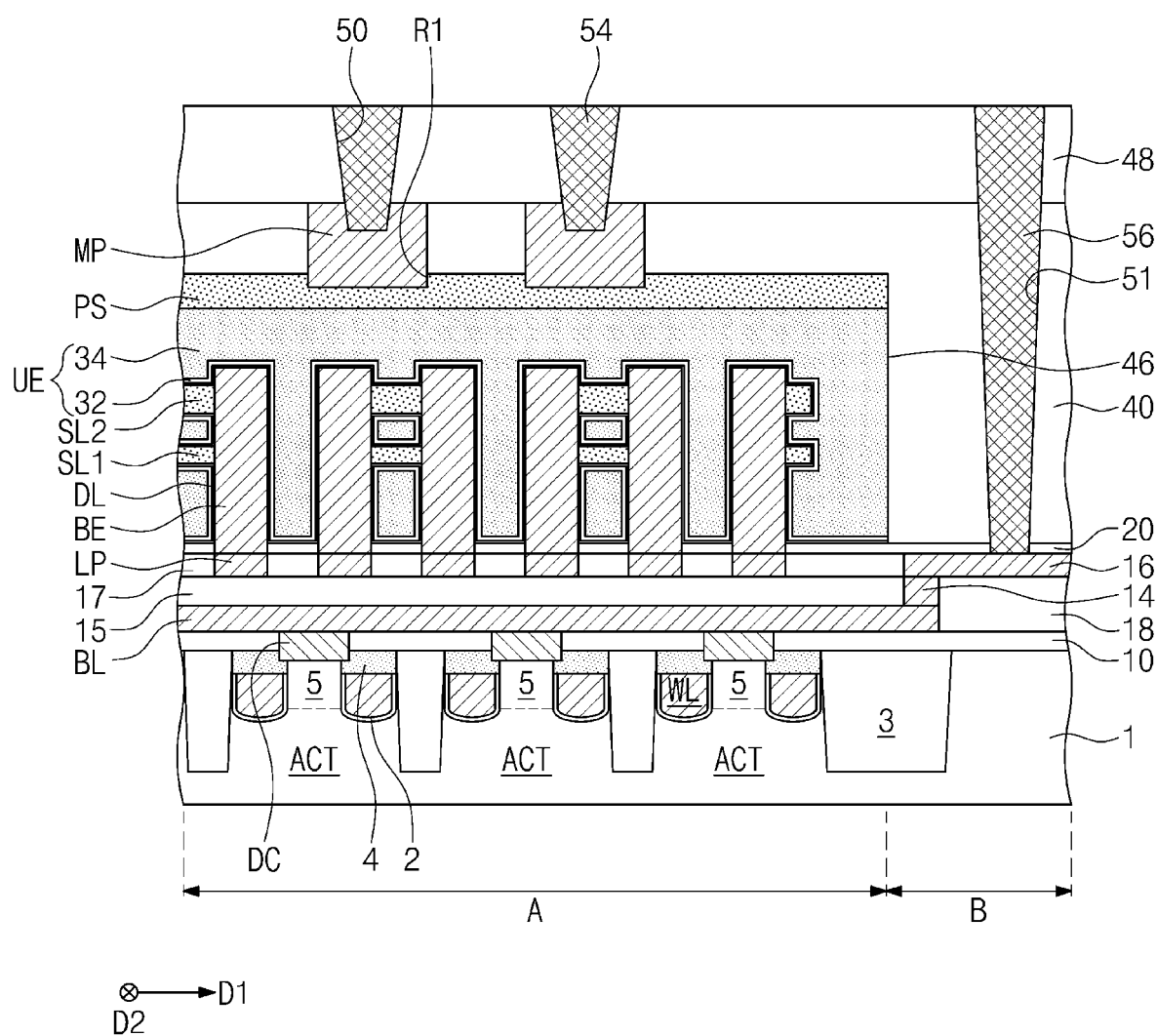
FIG. 8 is a sectional view of a semiconductor memory device according to an embodiment, corresponding to the line of FIG. 6.

FIG. 8 is a sectional view of a semiconductor memory device according to an embodiment, corresponding to the line I-I' of FIG. 6. For concise description, an element previously described with reference to FIG. 7 may be identified by the same reference number without repeating an overlapping description thereof.

Referring to FIGS. 6 and 8, poly-silicon layer PS may be provided on the silicon germanium layer 34.

The poly-silicon layer PS may be interposed between the line-shaped conductive pads MP and the silicon germanium layer 34. The poly-silicon layer PS may have a plurality of line-shaped recesses R1, and a portion of each of the conductive pads MP may fill a corresponding one of the recesses R1 of the poly-silicon layer PS. The line-shaped conductive pads MP may be provided to expose a portion of the top surface of the poly-silicon layer PS. The exposed portion of the top surface of the poly-silicon layer PS may be located at a different level from the top surfaces of the poly-silicon layer PS overlapped with the line-shaped conductive pads MP.

Figure 9:
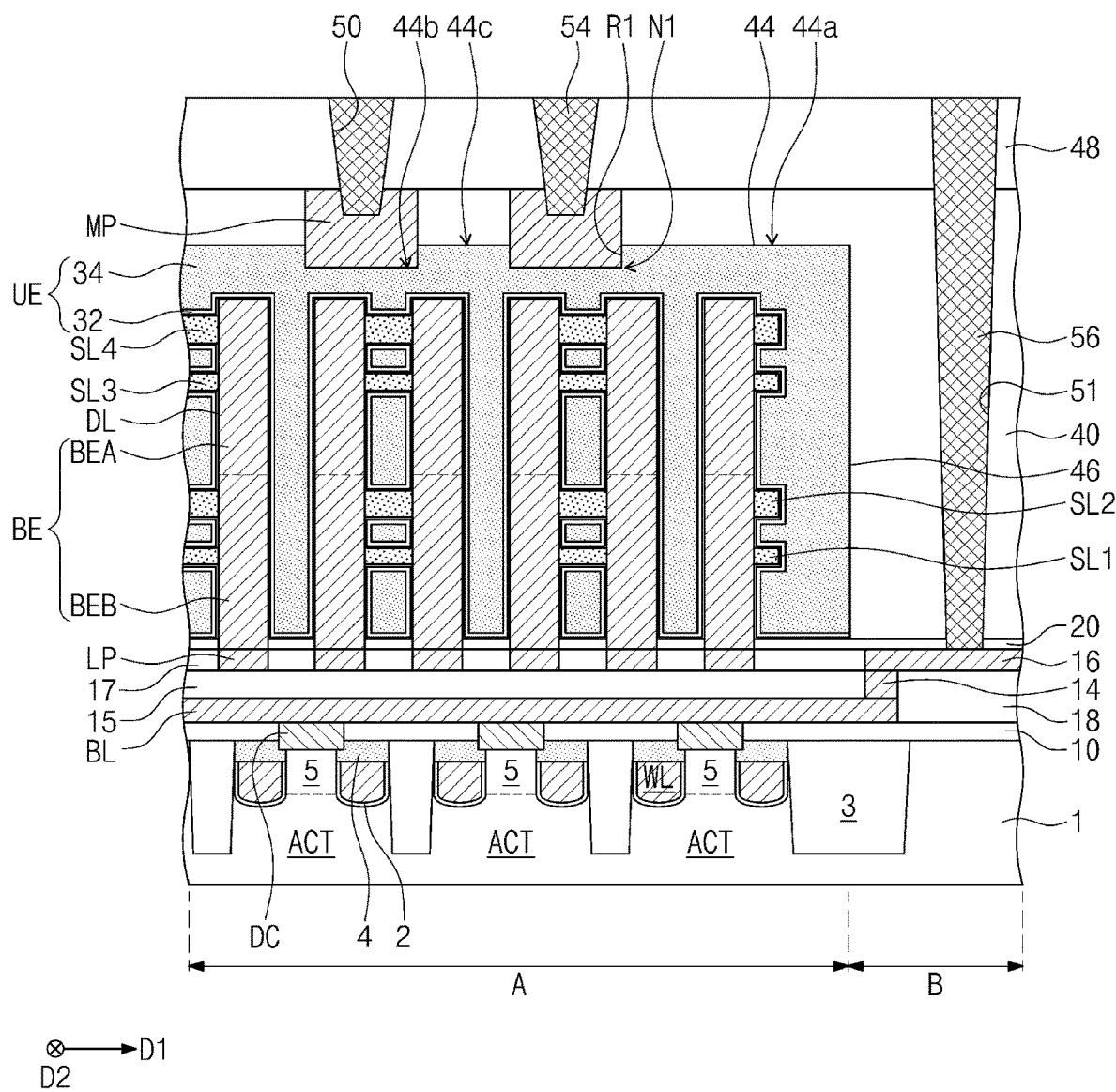
FIG. 9 is a sectional view of a semiconductor memory device according to an embodiment, corresponding to the line I-I' of FIG. 6.

FIG. 9 is a sectional view of a semiconductor memory device according to an embodiment, corresponding to the line I-I' of FIG. 6. For concise description, an element previously described with reference to FIG. 4 may be identified by the same reference number without repeating an overlapping description thereof.

Referring to FIGS. 6 and 9, each of the lower electrodes BE may include the first portion BEA and the second portion BEB. The first support pattern SL1, the second support pattern SL2, the third support pattern SL3, and the fourth support pattern SL4, which are spaced apart from each other in a direction normal to the top surface of the semiconductor substrate 1, may be provided between the lower electrodes BE. The line-shaped conductive pads MP may be provided on the top surface of the silicon germanium layer 34 to be spaced apart from each other in the first direction D1. The line-shaped conductive pads MP may extend in a second direction D2, which is parallel to the top surface of the semiconductor substrate 1 and is not parallel to the first direction D1.

Figure 10:
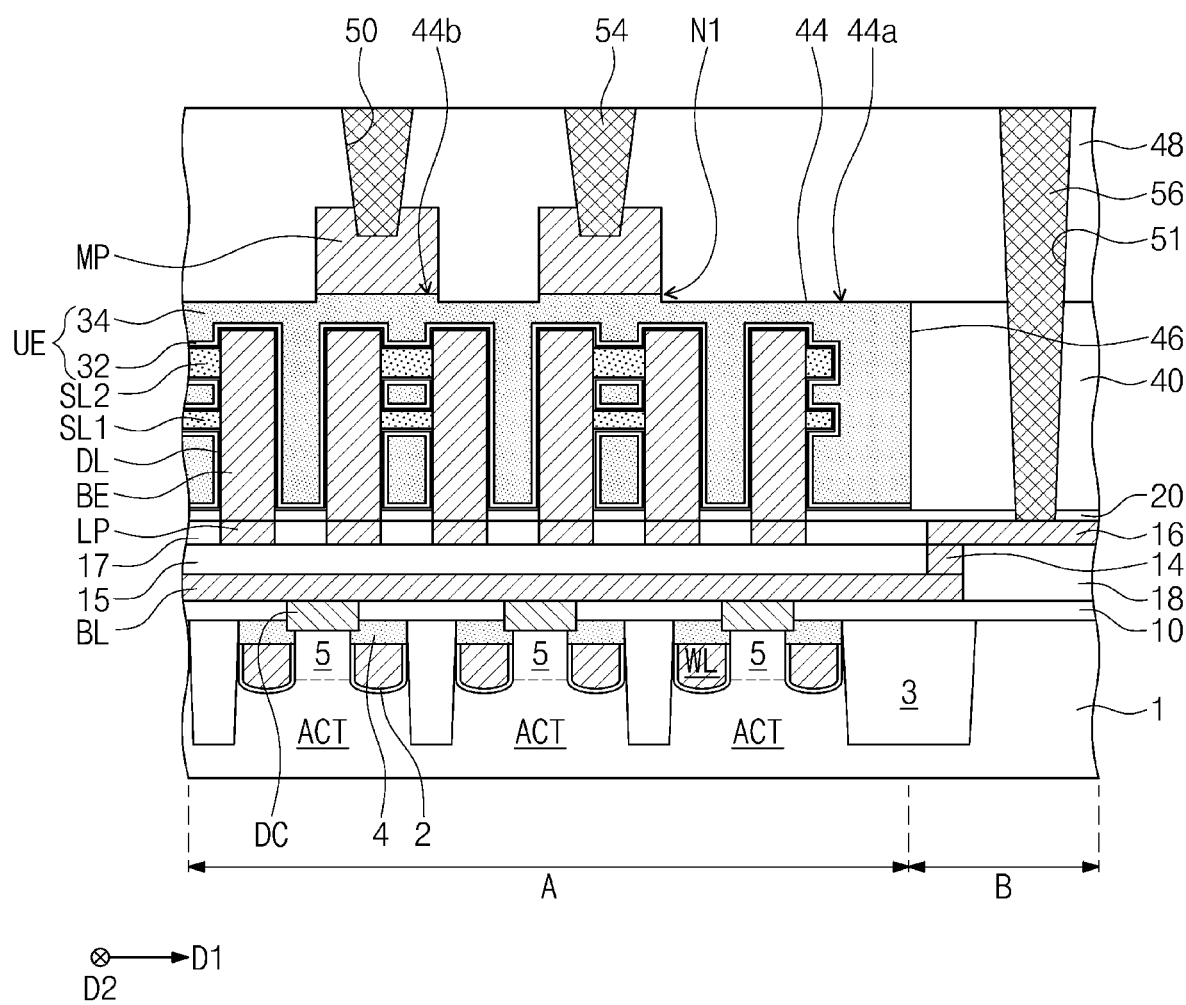
FIG. 10 is a sectional view of a semiconductor memory device according to an embodiment, corresponding to the line of FIG. 6.

FIG. 10 is a sectional view of a semiconductor memory device according to an embodiment, corresponding to the line I-I' of FIG. 6. For concise description, an element previously described with reference to FIG. 5 may be identified by the same reference number without repeating an overlapping description thereof.

Referring to FIGS. 6 and 10, the line-shaped conductive pads MP may be provided to expose the top surface of the silicon germanium layer 34.

The exposed top surface 44a of the silicon germanium layer 34 may be located at a different level from the top surface 44b of the silicon germanium layer 34 overlapped with the conductive pad MP. For example, the level of the exposed top surface 44a of the silicon germanium layer 34 may be lower than the level of the top surface 44b of the silicon germanium layer 34, which are overlapped with the conductive pad MP. Thus, the top surface 44a of the edge portion of the silicon germanium layer 34, the top surface 44b of the silicon germanium layer 34 overlapped with the conductive pad MP, and a surface of the silicon germanium layer 34 connecting them may form the step structure N1.

The bottom surface of the conductive pad MP may be positioned at substantially the same level as the top surface 44b of the silicon germanium layer 34, on which the conductive pad MP is placed.

In certain embodiments, the level of the top surface 44a of the edge portion of the silicon germanium layer 34 may be substantially the same as the level of the top surface 44b of the silicon germanium layer 34, which are overlapped with the conductive pad MP. In the silicon germanium layer 34, a surface roughness of the top surface 44 may be different from a surface roughness of the side surface 46. The surface roughness of the top surface 44 of the silicon germanium layer 34 may be less than the surface roughness of the side surface 46.

A top surface of the third interlayered insulating layer 40 may be coplanar with the top surface 44 of the edge portion of the silicon germanium layer 34. The third interlayered insulating layer 40 may cover the side surface 46 of the silicon germanium layer 34 but may not cover the top surface 44 of the silicon germanium layer 34. The fourth interlayered insulating layer 48 may cover an exposed portion of the top surface 44 of the silicon germanium layer 34 and the top and side surfaces of the conductive pad MP.

Figure 11:
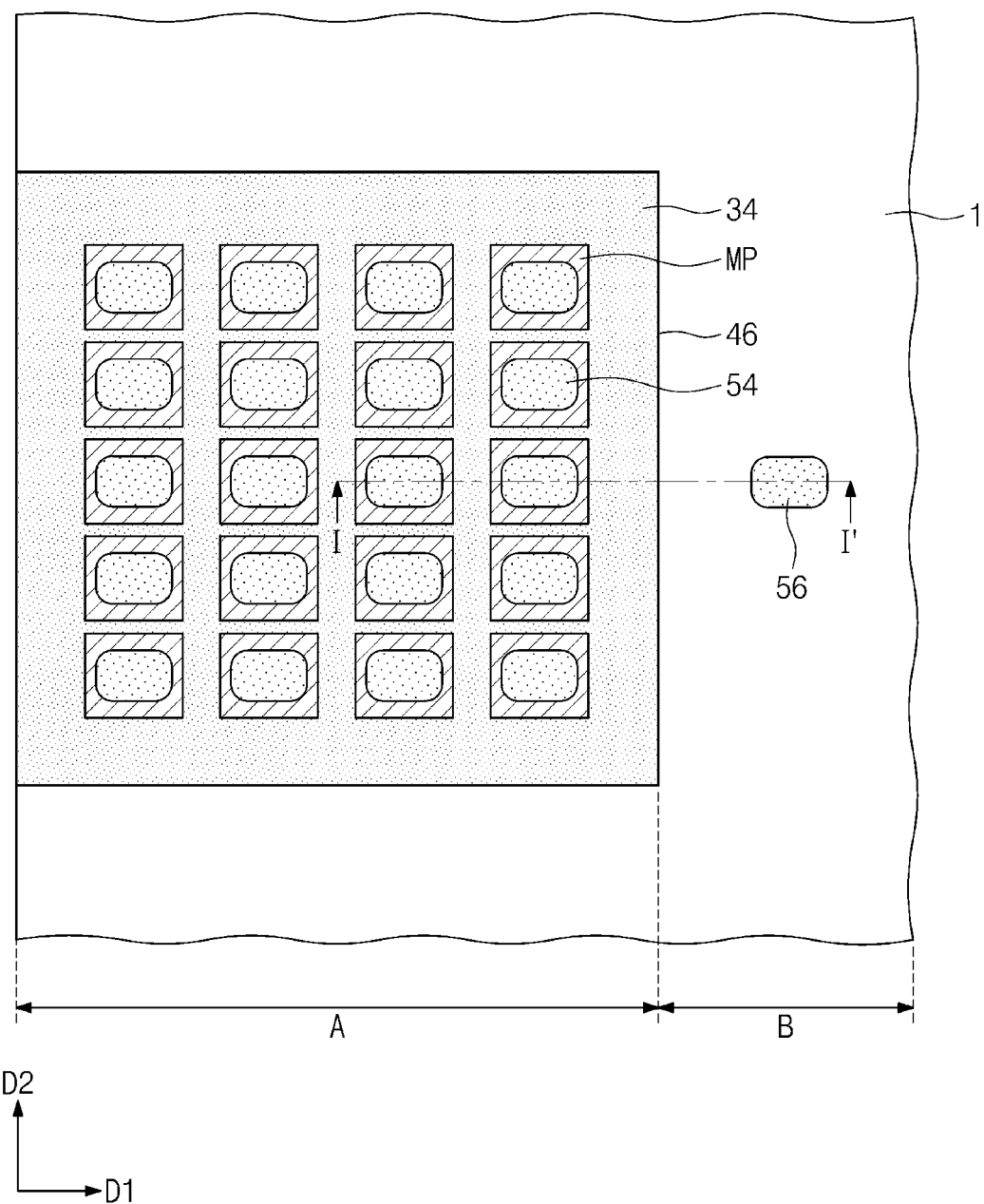
FIG. 11 is a plan view illustrating a semiconductor memory device according to an embodiment.

FIG. 11 is a plan view illustrating a semiconductor memory device according to an embodiment. A section taken along a line I-I' of FIG. 11 may correspond to that shown in FIG. 7, 8, 9, or 10.

Referring to FIGS. 11 and 7, the conductive pads MP may be provided on the top surface of the silicon germanium layer 34 to be spaced apart from each other in the first and second directions D1 and D2. The conductive pads MP may be arranged in the first and second directions D1 and D2 to form an array. Each of the conductive pads MP may have a rectangular or circular shape. The conductive pads MP may be formed at positions corresponding to the upper electrode contact plugs 54. Each of the upper electrode contact plugs 54 may be partially extended or inserted into a corresponding one of the conductive pads MP. The silicon germanium layer 34 may have the recesses R1. The recesses R1 may be spaced apart from each other in the first and second directions D1 and D2. A portion of each of the conductive pads MP may fill a corresponding one of the recesses R1. The array-shaped conductive pads MP may be provided to expose portions of the silicon germanium layer 34. A level of the top surface 44c of the silicon germanium layer 34 between the recesses R1 and a level of the top surface 44a of the edge portion of the silicon germanium layer 34 may be higher than the top surface 44b of the silicon germanium layer 34 vertically overlapped with the conductive pads MP (e.g., the bottom surface of the recess). Regions between adjacent ones of the conductive pads MP may be filled with the third interlayered insulating layer 40. The third interlayered insulating layer 40 may cover the top and side surfaces of the silicon germanium layer 3.

Alternatively, referring to FIGS. 11 and 8, the poly-silicon layer PS may be interposed between the array-shaped conductive pads MP and the silicon germanium layer 34. The poly-silicon layer PS may have the array-shaped recesses R1, which are spaced apart from each other in the first and second directions D1 and D2, and a portion of each of the conductive pads MP may be provided to fill a corresponding one of the recesses R1 of the poly-silicon layer PS. The array-shaped conductive pads MP may be provided to expose portions of the top surface of the poly-silicon layer PS. The exposed portion of the top surface of the poly-silicon layer PS may be located at a different level from the top surfaces of the poly-silicon layer PS, which are overlapped with the array-shaped conductive pads MP.

Alternatively, referring to FIGS. 11 and 9, each of the lower electrodes BE may include the first portion BEA and the second portion BEB. The first support pattern SL1, the second support pattern SL2, the third support pattern SL3, and the fourth support pattern SL4, which are spaced apart from each other in a direction normal to the top surface of the semiconductor substrate 1, may be provided between the lower electrodes BE. The array-shaped conductive pads MP may be provided on the top surface of the silicon germanium layer 34. The array-shaped conductive pads MP may be spaced apart from each other in the first and second directions D1 and D2.

Alternatively, referring to FIGS. 11 and 10, the conductive pads MP may be provided to expose the top surface of the silicon germanium layer 34. A level of the expose top surface 44a of the silicon germanium layer 34 may be lower than a level of the top surface 44b of the silicon germanium layer 34, which are overlapped with the conductive pad MP. Thus, the exposed top surface 44a of the silicon germanium layer 34, the top surface 44b of the silicon germanium layer 34 overlapped with the conductive pad MP, and a surface of the silicon germanium layer 34 connecting them may form a step structure.

In certain embodiments, the level of the exposed top surface 44a of the silicon germanium layer 34 may be substantially equal to the level of the top surface 44b of the silicon germanium layer 34, which are overlapped with the conductive pad MP.

In the silicon germanium layer 34, a surface roughness of the top surface 44 may be different from a surface roughness of the side surface 46. The surface roughness of the top surface 44 of the silicon germanium layer 34 may be less than the surface roughness of the side surface 46.

Figure 12:
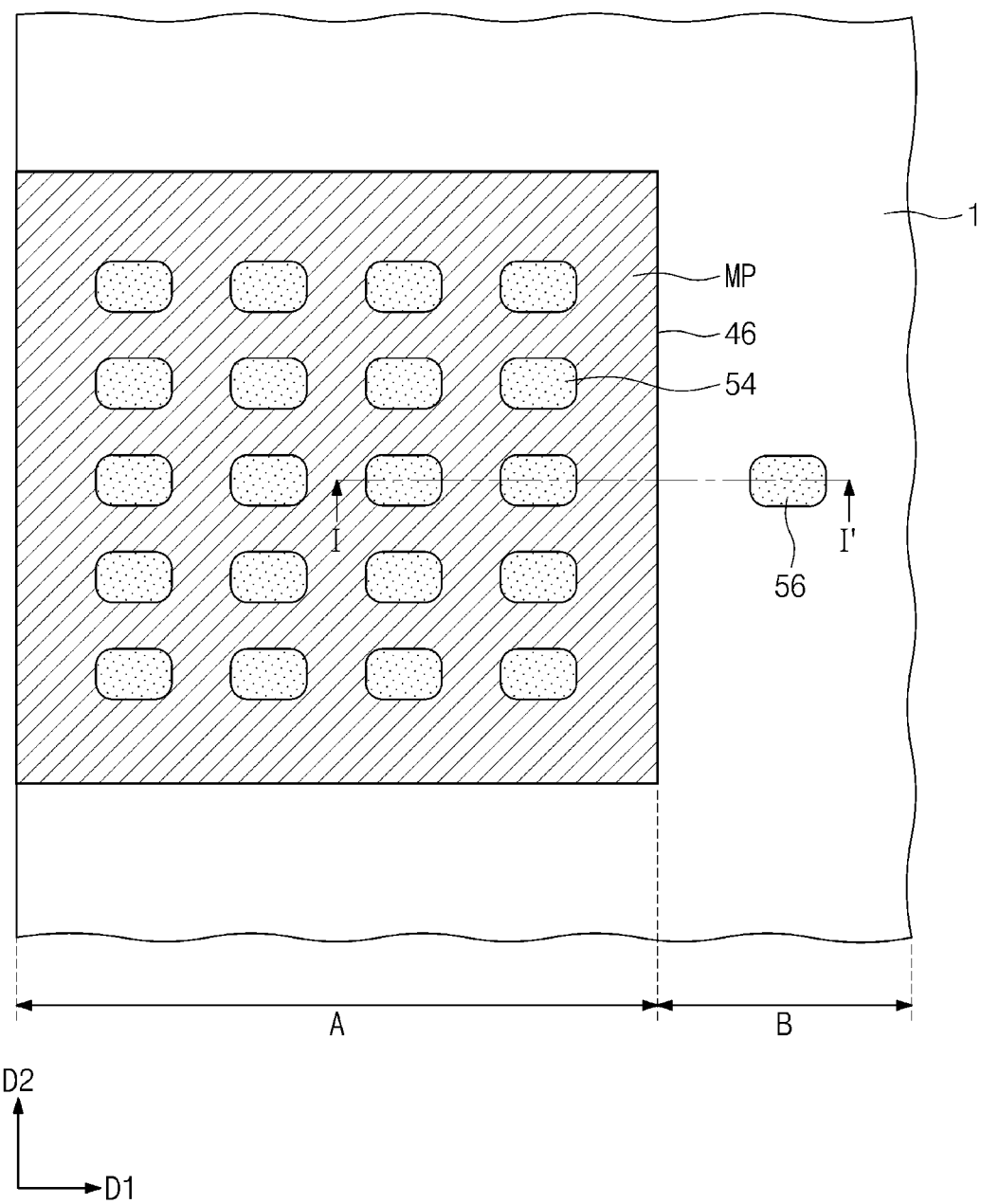
FIG. 12 is a plan view illustrating a semiconductor memory device according to an embodiment.
Figure 13:
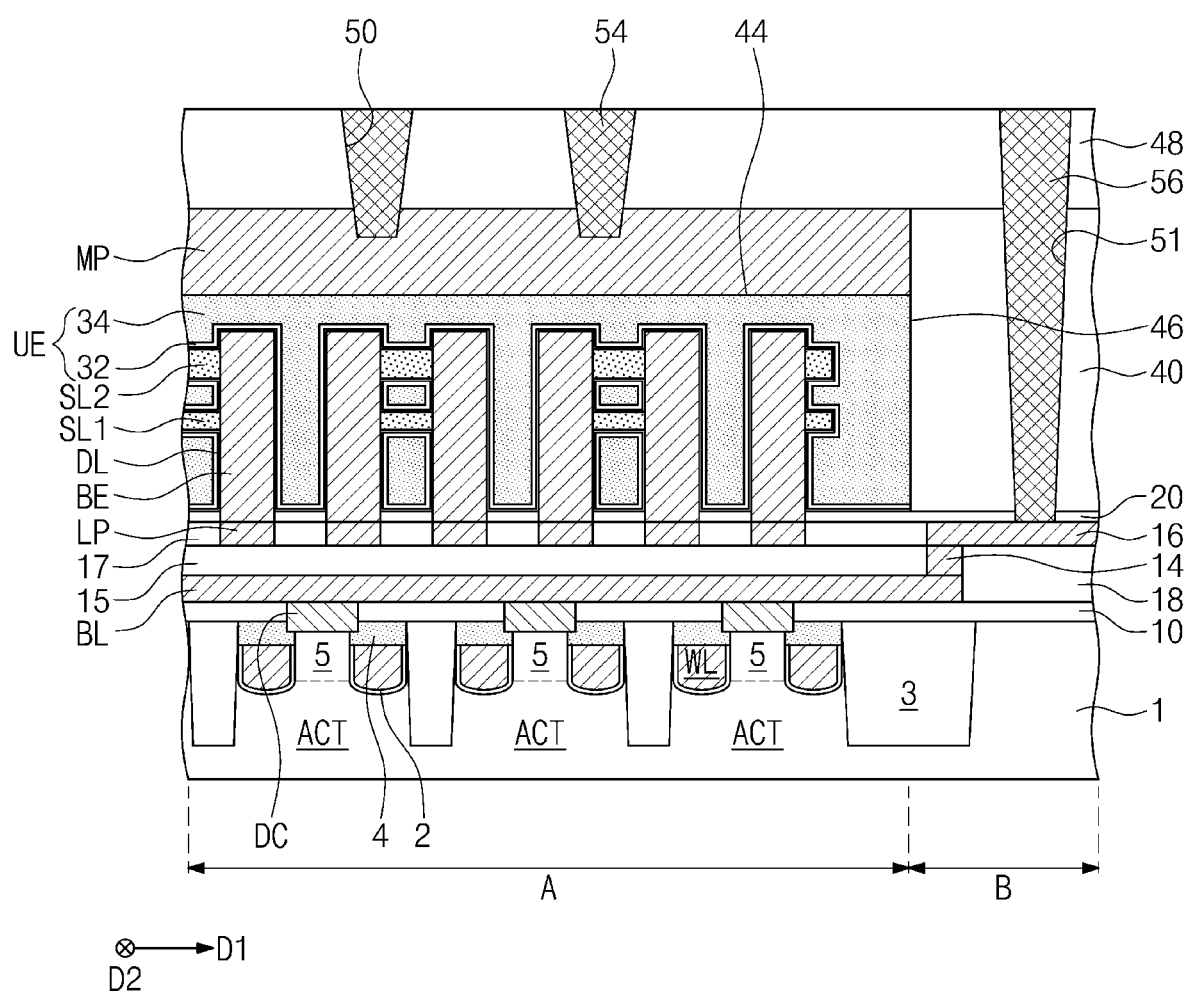
FIG. 13 is a sectional view taken along a line I-I' of FIG. 12.

FIG. 12 is a plan view illustrating a semiconductor memory device according to an embodiment. FIG. 13 is a sectional view taken along a line I-I' of FIG. 12.

Referring to FIGS. 12 and 13, the conductive pad MP may be provided on the top surface of the silicon germanium layer 34. The conductive pad MP may be overlapped with the entire top surface of the silicon germanium layer 34. The third interlayered insulating layer 40 may be provided to cover the side surface of the silicon germanium layer 34 and the top and side surfaces of the conductive pad MP.

The upper electrode contact plugs 54 may be disposed on the cell region A to penetrate the fourth interlayered insulating layer 48 and a portion of the conductive pad MP and may be electrically connected to the upper electrode UE. The peripheral contact plug 56 may be provided on the peripheral region B to penetrate the fourth interlayered insulating layer 48, the third interlayered insulating layer 40, and the etch stop layer 20 and thereby to be electrically connected to the peripheral interconnection line 16.

FIGS. 14A to 14I are sectional views illustrating a process of fabricating the semiconductor memory device of FIG. 2A.

Figure 14A:
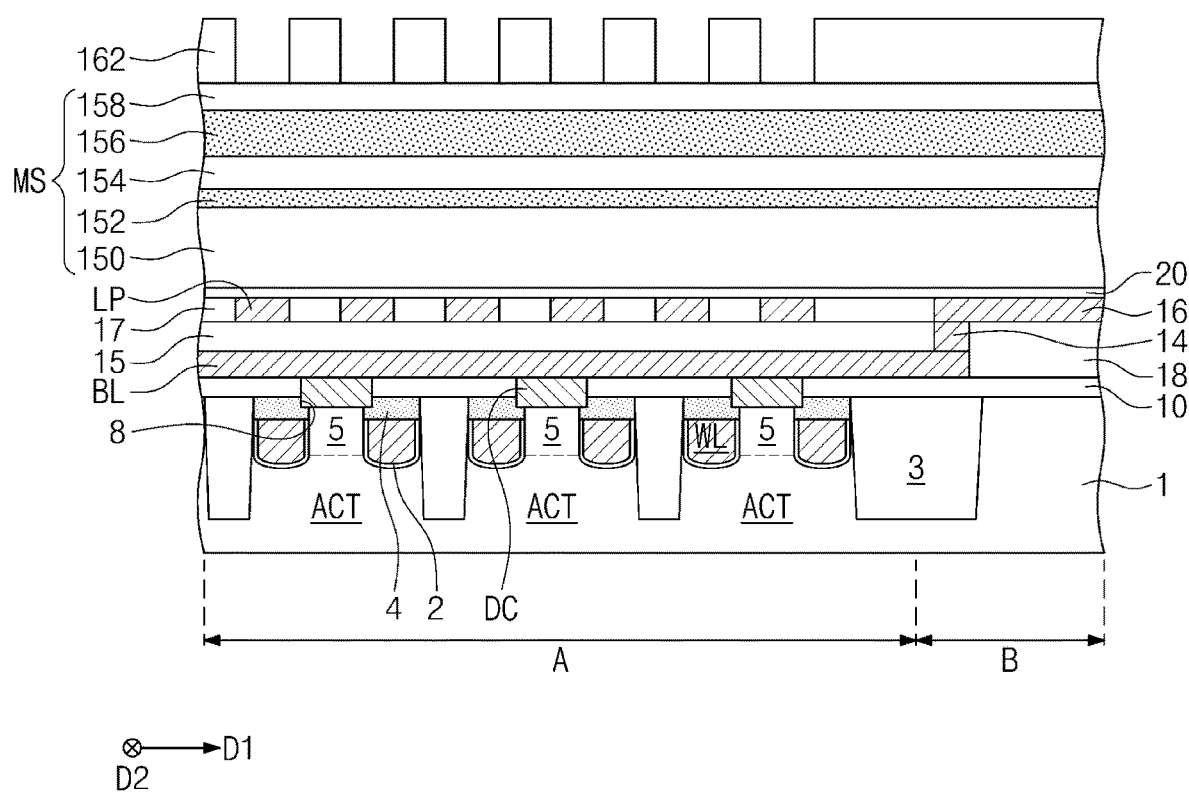
FIGS. 14A, 14B, 14C, 14D, 14E, 14F, 14G, 14H and 14I are sectional views illustrating a process of fabricating the semiconductor memory device of FIG. 2A.

Referring to FIG. 14A, the device isolation layer 3 may be formed in the semiconductor substrate 1 including the cell region A and the peripheral region B to delimit the cell region A and the peripheral region B and to define the active region ACT in each of the regions A and B. The device isolation layer 3 and the semiconductor substrate 1 may be etched to form a plurality of grooves, which are parallel to each other, and then, the cell gate insulating layer 2, the word lines WL, and the word line capping pattern 4 may be formed in the grooves. An ion implantation process may be performed to form the first and second impurity injection regions 5 and 7 at both sides of each of the word lines WL, as shown in FIG. 2B.

Thereafter, the first interlayered insulating layer 10 may be formed on the cell region A to cover the semiconductor substrate 1. The first interlayered insulating layer 10 may be patterned to form bit line contact holes 8 exposing the first and second impurity injection regions 5 and 7. A conductive layer may be formed on the semiconductor substrate 1, in which the bit line contact hole 8 is formed, to fill the bit line contact hole 8. The bit line capping pattern 15 may be formed on the conductive layer, and then the conductive layer may be etched using the bit line capping pattern 15 as an etch mask to form the bit lines BL and the bit line contact plugs DC.

The via 14, which is electrically connected to the bit line BL, and the peripheral interlayered insulating layer 18 may be formed on the peripheral region B. The second interlayered insulating layer 17 may be provided on the bit line capping pattern 15. The second interlayered insulating layer 17, the first interlayered insulating layer 10, and a portion of the semiconductor substrate 1 may be removed to form a lower electrode contact hole. The lower electrode contact plug BC, which includes at least one of a polysilicon pattern, a barrier metal layer, or a metal pattern, may be formed in the lower electrode contact hole.

In the peripheral region B, the peripheral interconnection line 16 may be formed concurrently with the landing pads LP. The peripheral interconnection line 16 may be formed on the peripheral interlayered insulating layer 18. The etch stop layer 20 may be formed on the lower electrode contact plug BC, the second interlayered insulating layer 17, and the peripheral interconnection line 16.

A mold structure MS may be formed on the etch stop layer 20. The mold structure MS may include a first mold layer 150, a first supporting layer 152, a second mold layer 154, a second supporting layer 156, and a third mold layer 158, which are sequentially formed. The mold layers 150, 154, and 158 may be formed of or include materials, whose etch rates are different from those of the supporting layers 152 and 156. The first mold layer 150, the second mold layer 154, and the third mold layer 158 may be formed of or include, for example, silicon nitride. The first supporting layer 152 and the second supporting layer 156 may be formed of or include, for example, silicon oxide. Alternatively, the first to third mold layers 150, 154, and 158 may be formed of or include, for example, silicon oxide, and the first supporting layer 152 and the second supporting layer 156 may be formed of or include, for example, silicon nitride. That is, the first to third mold layers 150, 154, and 158 may be formed of or include a material having an etch selectivity with respect to the first and second supporting layers 152 and 156. A first mask layer 162 may be formed on the mold structure MS. The first mask layer 162 may have openings. The openings may be formed to expose portions of a top surface of the third mold layer 158.

Figure 14B:
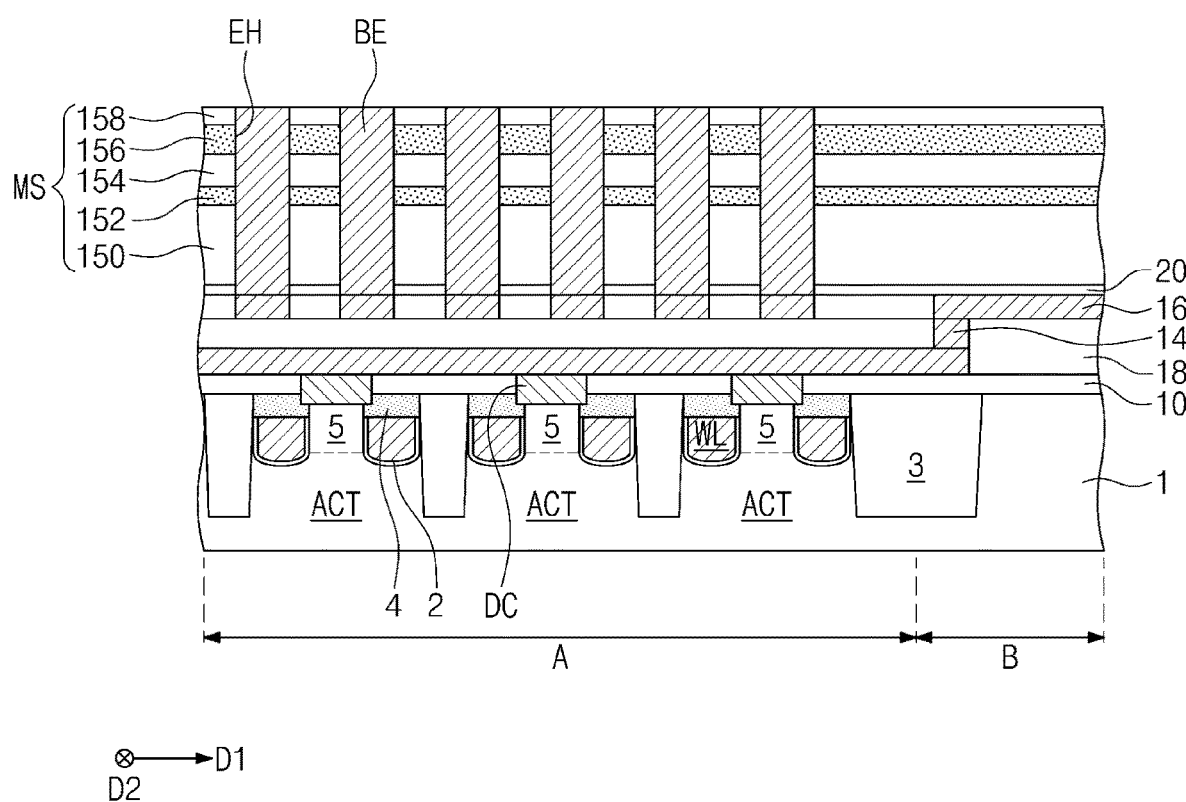

Referring to FIG. 14B, the mold structure MS may be anisotropically etched using the first mask layer 162 as an etch mask. Accordingly, electrode holes EH may be formed in the mold structure MS. For example, the electrode holes EH may be formed by sequentially and anisotropically etching the third mold layer 158, the second supporting layer 156, the second mold layer 154, the first supporting layer 152, and the first mold layer 150. Top surfaces of the lower electrode contact plugs BC may be exposed through the electrode holes EH. Portions of the first to third mold layers 150, 154, and 158 and the first and second supporting layers 152 and 156 may be exposed by side surfaces of the electrode holes EH. The anisotropic etching process may be, for example, a dry etching process. The first mask layer 162 may be removed after or during the etching process.

The lower electrodes BE may be formed by filling the electrode holes EH with at least one conductive material. The formation of the lower electrodes BE may include forming a lower electrode layer, which is formed of a conductive material, to fill the electrode holes EH and to cover the mold structure MS, and performing a planarization process on the lower electrode layer to expose the top surface of the third mold layer 158. In an embodiment, the lower electrodes BE may be formed to have a pillar shape.

Figure 14C:
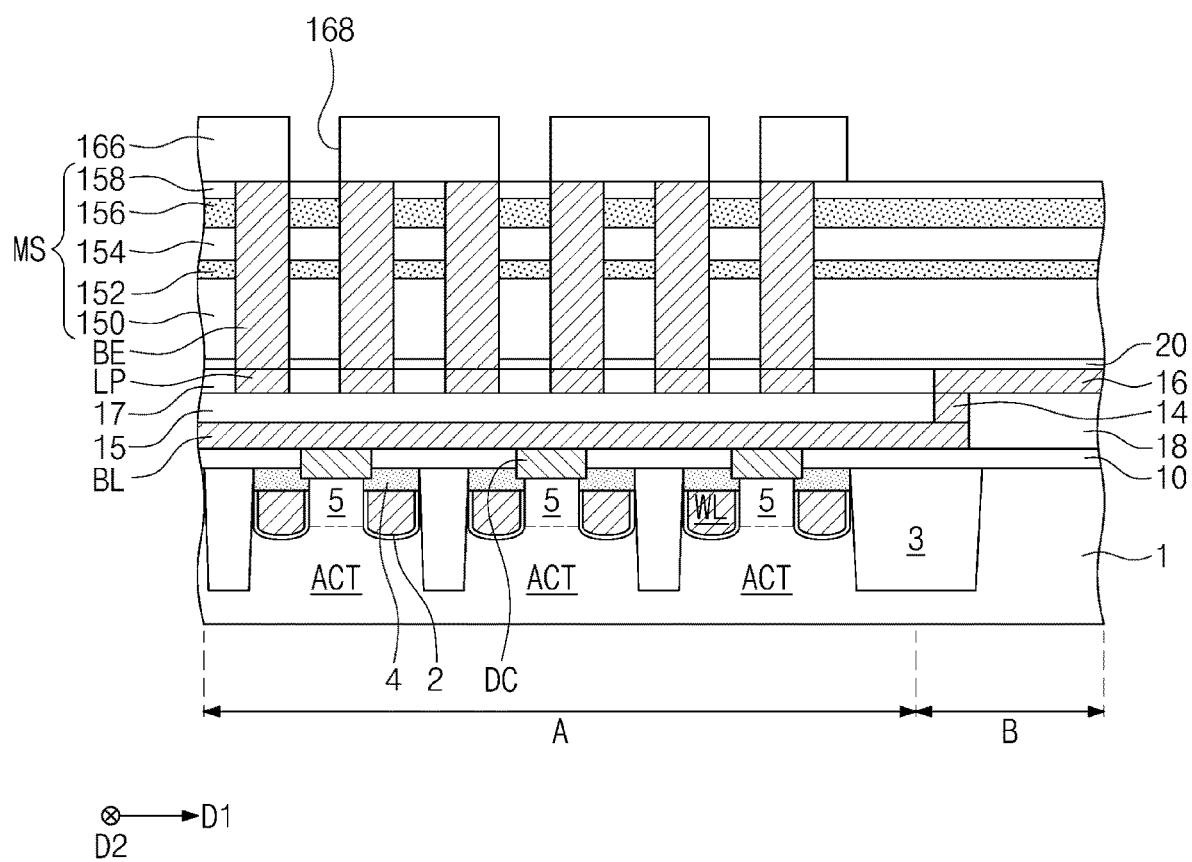
Figure 14D:
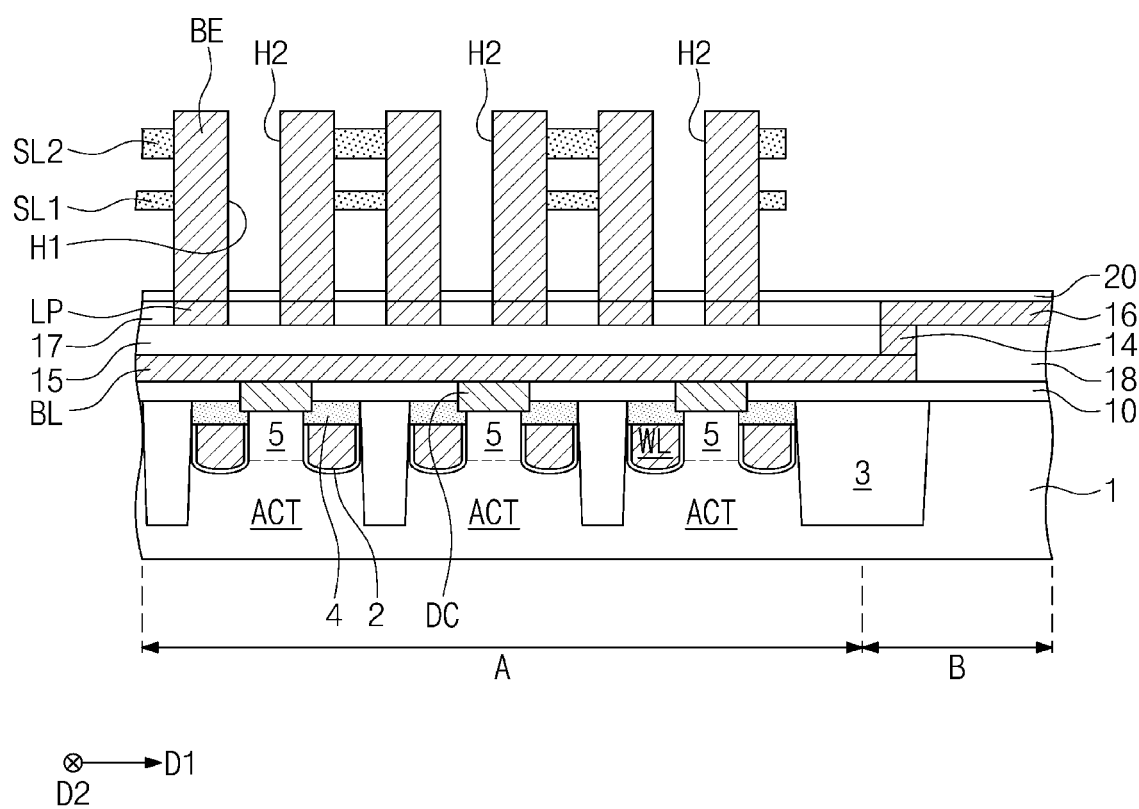

Referring to FIG. 14C and FIG. 14D, a second mask layer 166 may be formed on the mold structure MS provided with the lower electrodes BE. The second mask layer 166 may be formed to have openings 168, and here, widths of the openings 168 may be equal to or greater than a distance between adjacent ones of the lower electrodes BE. An anisotropic etching process using the second mask layer 166 as an etch mask may be performed to etch the second supporting layer 156 between the lower electrodes BE, and thus, the second support pattern SL2 and the second support hole H2 may be formed. An isotropic etching process may be performed to remove the second and third mold layers 154 and 158 through the second support hole H2. An anisotropic etching process may be again performed to etch the first supporting layer 152, and thus, the first support pattern SL1 and the first support hole H1 may be formed. The first mold layer 150 may be removed through the first support hole H1 by an isotropic etching process. The second mask layer 166 may be removed.

The top and side surfaces of the lower electrodes BE and the top surface of the etch stop layer 20 may be exposed, as a result of the removal of the first and second mold layers 150 and 154.

Figure 14E:
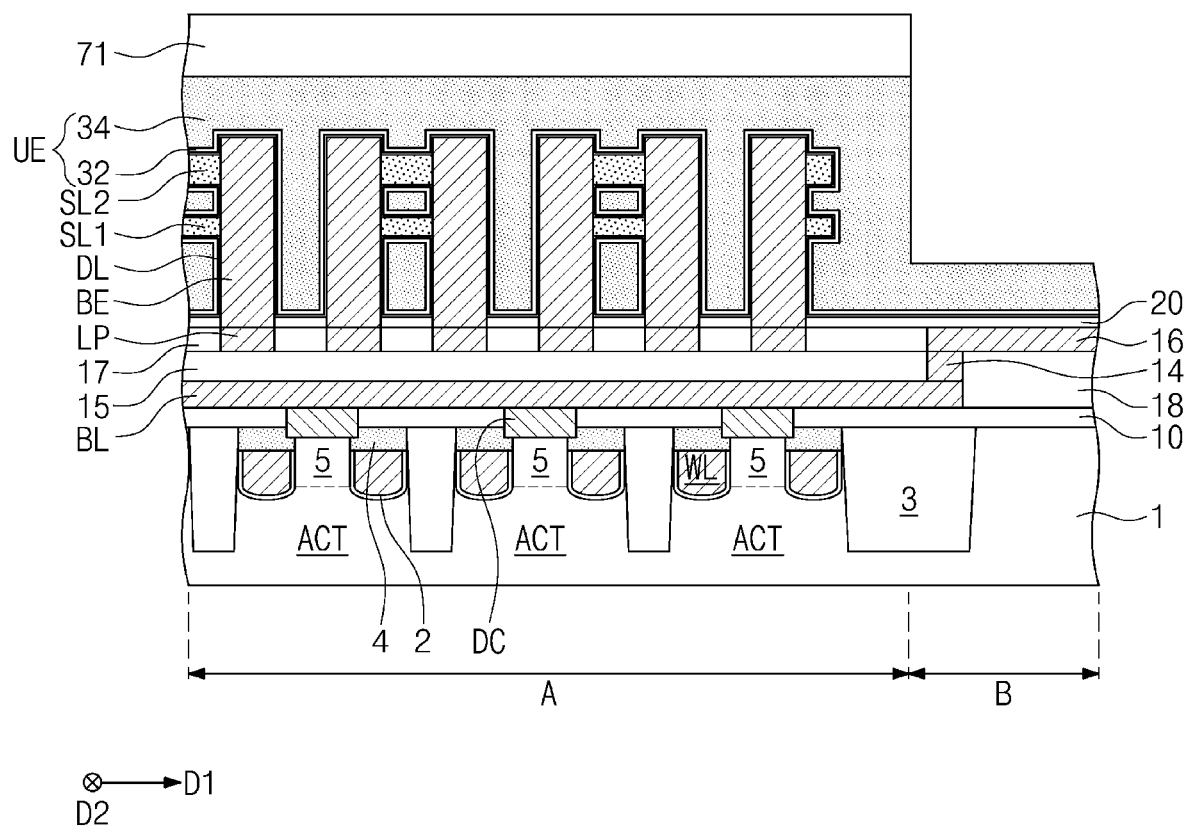

Referring to FIG. 14E, the dielectric layer DL may be formed on the cell region A and the peripheral region B. The dielectric layer DL may be formed to cover the top and side surfaces of the lower electrodes BE and the top, bottom, and side surfaces of the first and second support patterns SL1 and SL2. The dielectric layer DL may be formed by a chemical vapor deposition process and/or an atomic layer deposition process. The metal-containing layer 32 may be conformally formed on the dielectric layer DL. In an embodiment, the metal-containing layer 32 may be formed by a metal organic chemical vapor deposition (MOCVD) process. The silicon germanium layer 34 may be formed on the metal-containing layer 32. The silicon germanium layer 34 may be formed by a chemical vapor deposition process. An ion implantation process may be performed to dope the silicon germanium layer 34 with impurities. Alternatively, the silicon germanium layer 34 may be doped in-situ with the impurities, during the deposition of the silicon germanium layer 34. The third interlayered insulating layer 40 may be formed to cover the top and side surfaces of the silicon germanium layer 34.

A first mask pattern 71 may be formed to cover only the silicon germanium layer 34 on the cell region A. The first mask pattern 71 may be formed of or include a material (e.g., a photoresist material), which has an etch selectivity with respect to the silicon germanium layer 34.

An etching process using the first mask pattern 71 as an etch mask may be performed to remove the silicon germanium layer 34, the metal-containing layer 32, and the dielectric layer DL from the peripheral region B, and thus, the upper electrode UE may be formed to expose the top surface of the etch stop layer 20. The first mask pattern 71 may be removed.

Figure 14F:
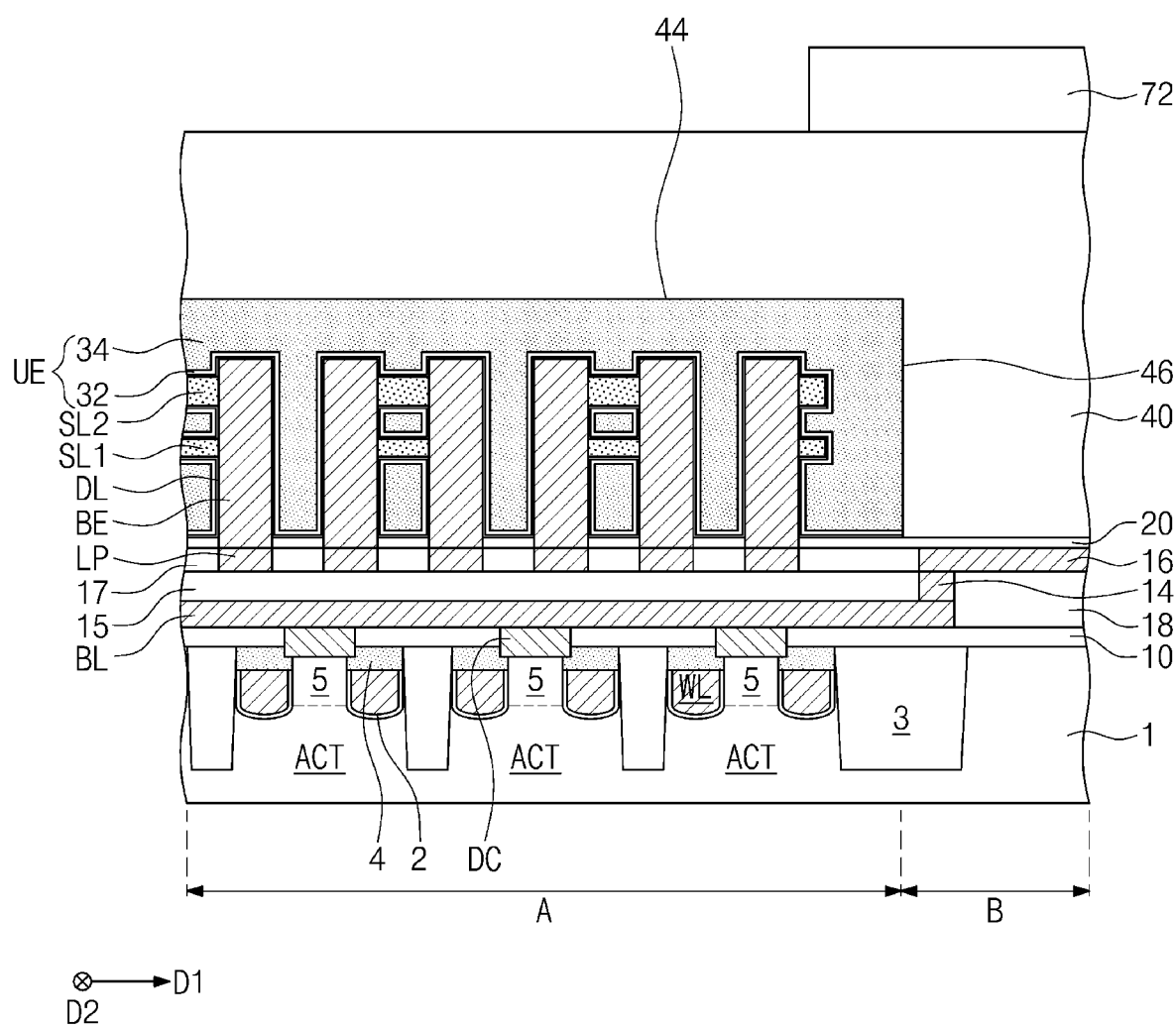

Referring to FIG. 14F, the third interlayered insulating layer 40 may be formed to cover the cell region A and the peripheral region B. The third interlayered insulating layer 40 may cover the top surface 44 and the side surface 46 of the upper electrode UE. The third interlayered insulating layer 40 may be formed of or include at least one of plasma-enhanced tetra ethyl ortho silicate (PE-TEOS), boron phosphorus silicate glass (BPSG), phosphorus silicate glass (PSG), or high-density plasma (HDP) oxide.

A second mask pattern 72 may be formed on the third interlayered insulating layer 40. The second mask pattern 72 may include, for example, a photoresist material. The second mask pattern 72 may cover the peripheral region B and a portion of the cell region A. In an embodiment, the second mask pattern 72 may cover the top surface of the edge portion of the silicon germanium layer 34, on the cell region A, but may expose all regions of the cell region A, other than the edge portion of the silicon germanium layer 34.

Figure 14G:
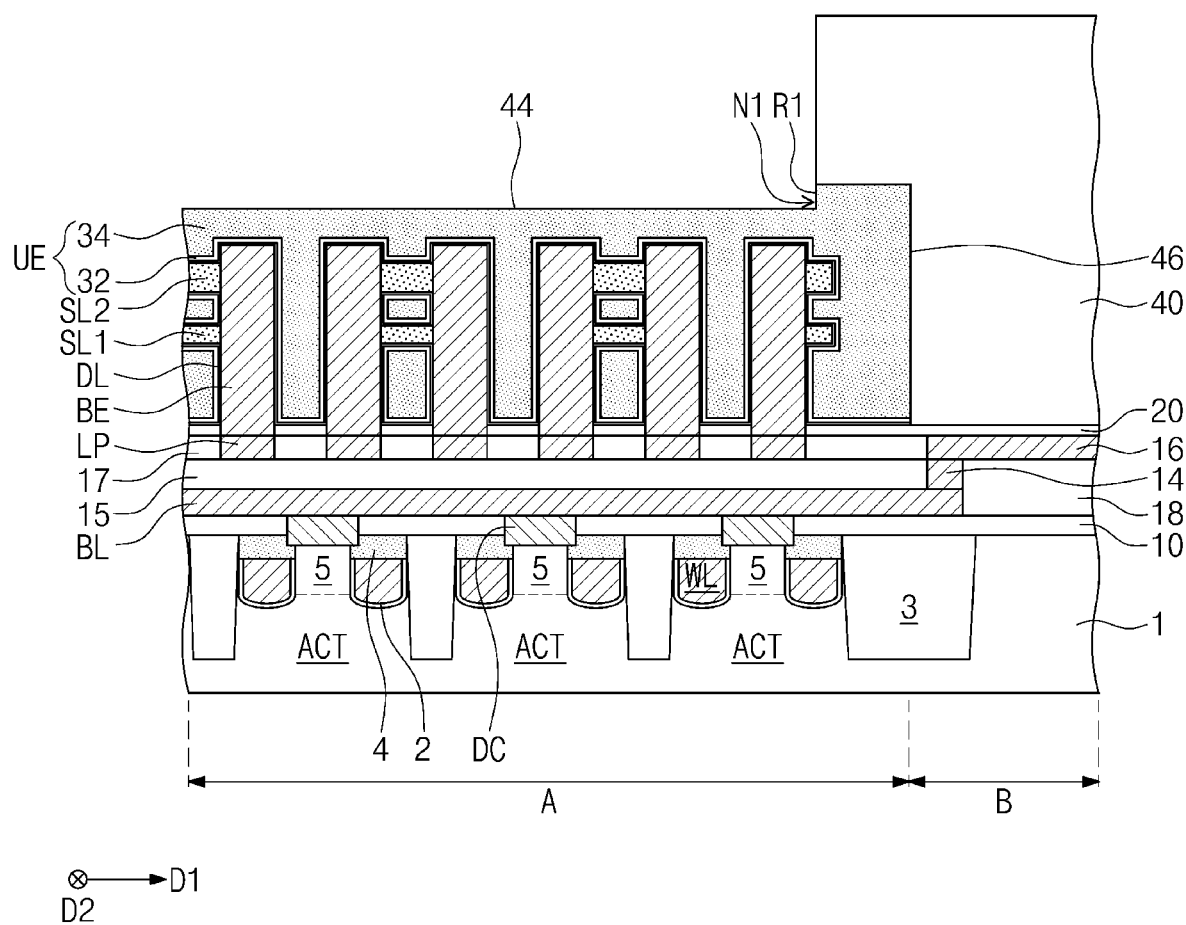

Referring to FIG. 14G, an etching process may be performed using the second mask pattern 72 as an etch mask. In an embodiment, the etching process may be a dry etching process. The etching process may be performed to etch the third interlayered insulating layer 40 and a portion of the silicon germanium layer 34, which are not veiled by the second mask pattern 72. Accordingly, the recess R1 may be formed in an upper portion of the silicon germanium layer 34. The bottom surface of the recess R1 of the silicon germanium layer 34 may be vertically spaced apart from the lower electrodes BE. As a result of the formation of the recess R1, the silicon germanium layer 34 may have the step structure N1. The second mask pattern 72 may be removed.

Figure 14H:
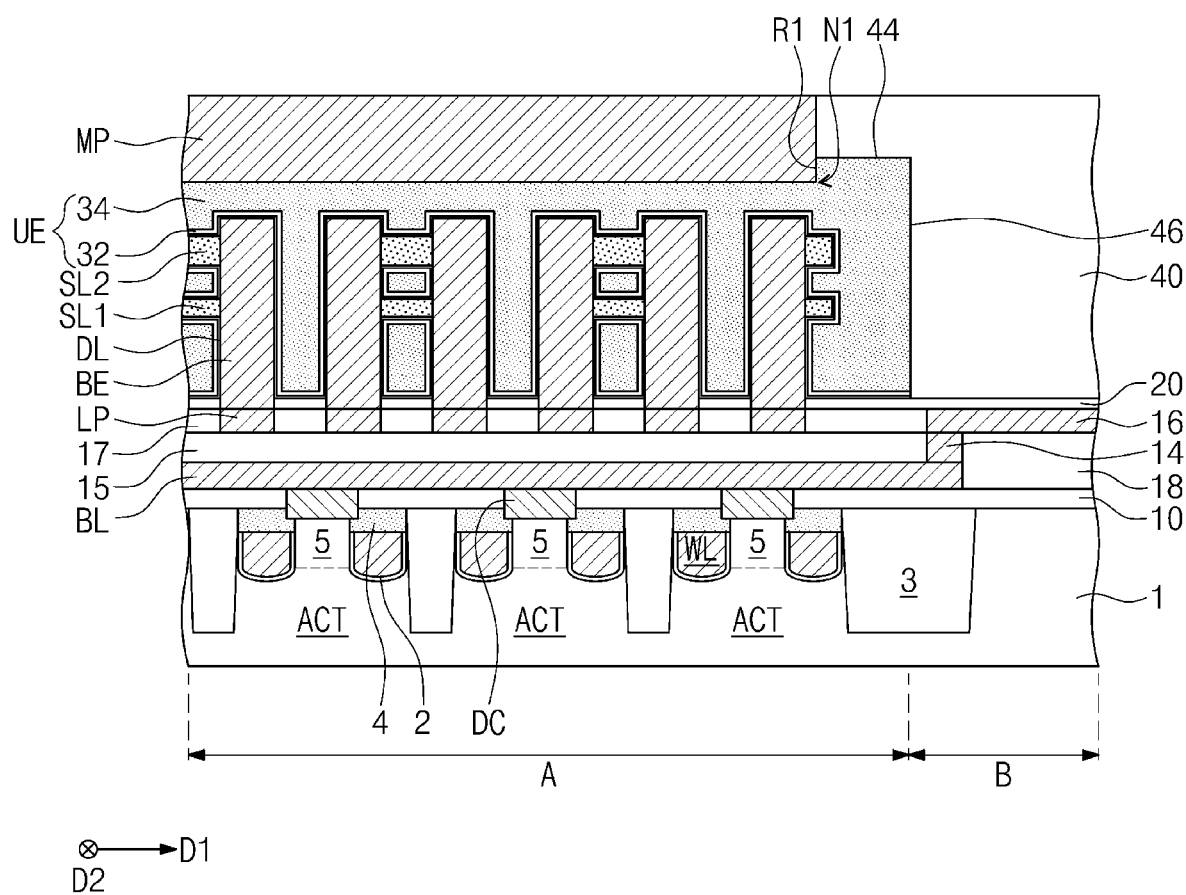

Referring to FIG. 14H, a conductive layer may be formed to fill the recess R1. The conductive layer may be formed of or include, for example, tungsten. The recess R1 may be filled with a portion of the conductive layer, and thereafter, a planarization process may be performed to planarize the top surfaces of the conductive layer and the third interlayered insulating layer 40. As a result of the planarization process on the conductive layer, the conductive pad MP may be formed to have a flat top surface.

Figure 14I:
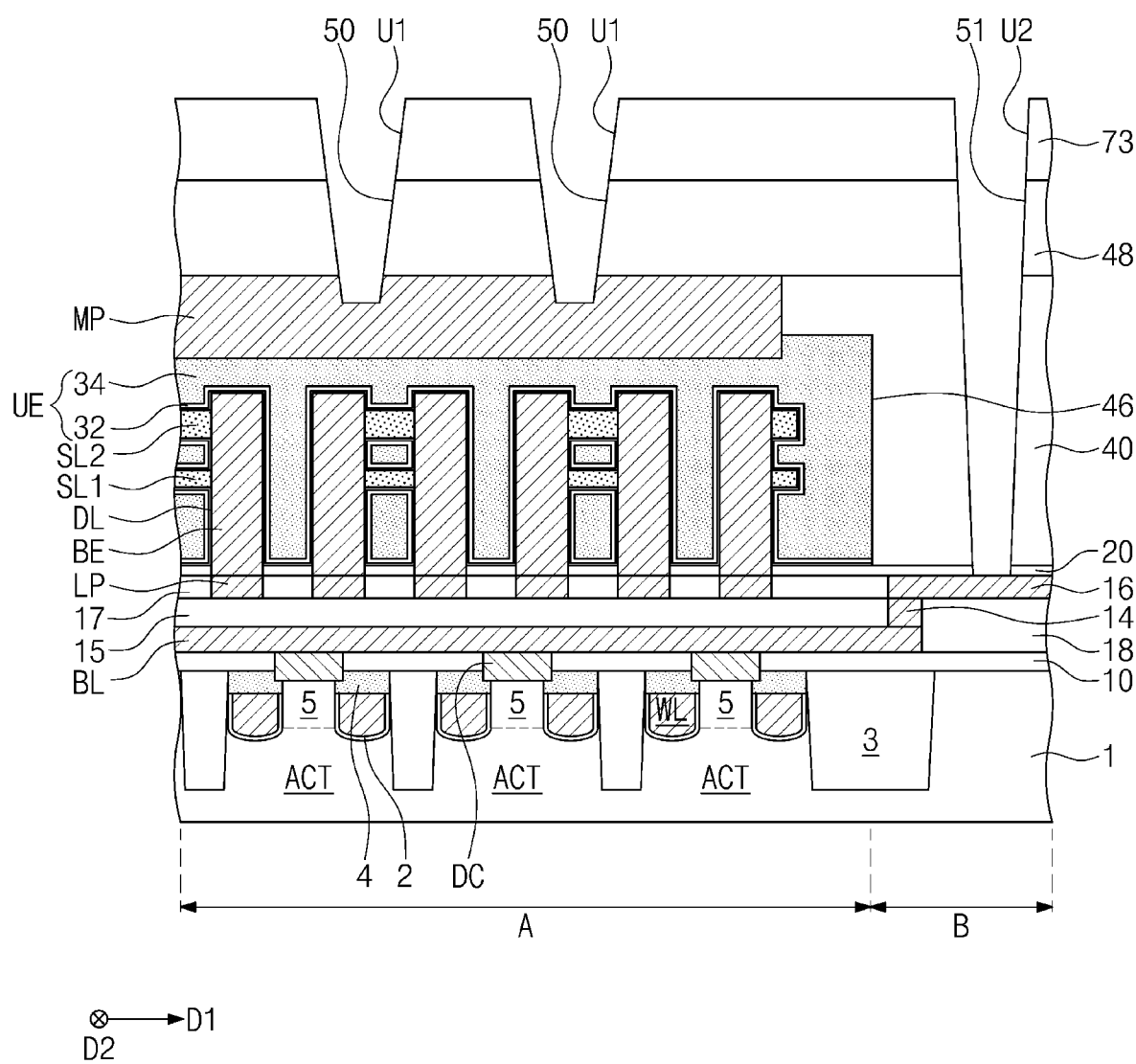

Referring to FIG. 14I, the fourth interlayered insulating layer 48 may be formed on the cell region A and the peripheral region B. The fourth interlayered insulating layer 48 may be formed to cover the top surfaces of the conductive pad MP and the third interlayered insulating layer 40. The fourth interlayered insulating layer 48 may be formed of or include the same or similar material as the third interlayered insulating layer 40. A third mask pattern 73 may be formed on the fourth interlayered insulating layer 48. The third mask pattern 73 may include first openings U1, which are overlapped with the conductive pad MP, and a second opening U2, which is overlapped with the peripheral interconnection line 16. Although not shown, the third mask pattern 73 may further include a third opening, which is overlapped with one of the source and/or drain regions of the transistor on the peripheral region B.

An etching process may be performed using the third mask pattern 73 as an etch mask. In an embodiment, the etching process may be a dry etching process. As a result of the etching process, the upper electrode contact holes 50 may be formed to expose the top surface of the conductive pad MP, and the peripheral contact hole 51 may be formed to expose the peripheral interconnection line 16. The upper electrode contact holes 50 and the peripheral contact hole 51 may be formed at the same time. The peripheral contact hole 51 may be formed to have a depth that is greater than a depth of the upper electrode contact holes 50. An etch rate of a metallic material (e.g., tungsten) in the conductive pad MP may be slower than an etch rate of the third interlayered insulating layer 40 (e.g., silicon oxide). Thus, under the same condition, an etching amount of the conductive pad MP on the cell region A may be greater than an etching amount of the third interlayered insulating layer 40 on the peripheral region B. The upper electrode contact holes 50 may be formed to have bottom surfaces, which are located in the conductive pad MP but is spaced apart from the silicon germanium layer 34. The etching process may be terminated when the peripheral interconnection line 16 is exposed.

Referring back to FIG. 2A, the third mask pattern 73 may be removed. Next, a conductive layer may be formed to fill the upper electrode contact holes 50 and the peripheral contact hole 51. The conductive layer may be formed of or include the same material as the conductive pad MP. The conductive layer may be formed by one of PVD and CVD processes. Thereafter, a planarization process may be performed on the conductive layer to form the upper electrode contact plugs 54 and the peripheral contact plug 56 in the upper electrode contact holes 50 and the peripheral contact hole 51, respectively. As a result, the semiconductor memory device may be fabricated to have the structure of FIG. 2A.

FIGS. 15A to 15E are sectional views illustrating a process of fabricating the semiconductor memory device of FIG. 3A.

Figure 15A:
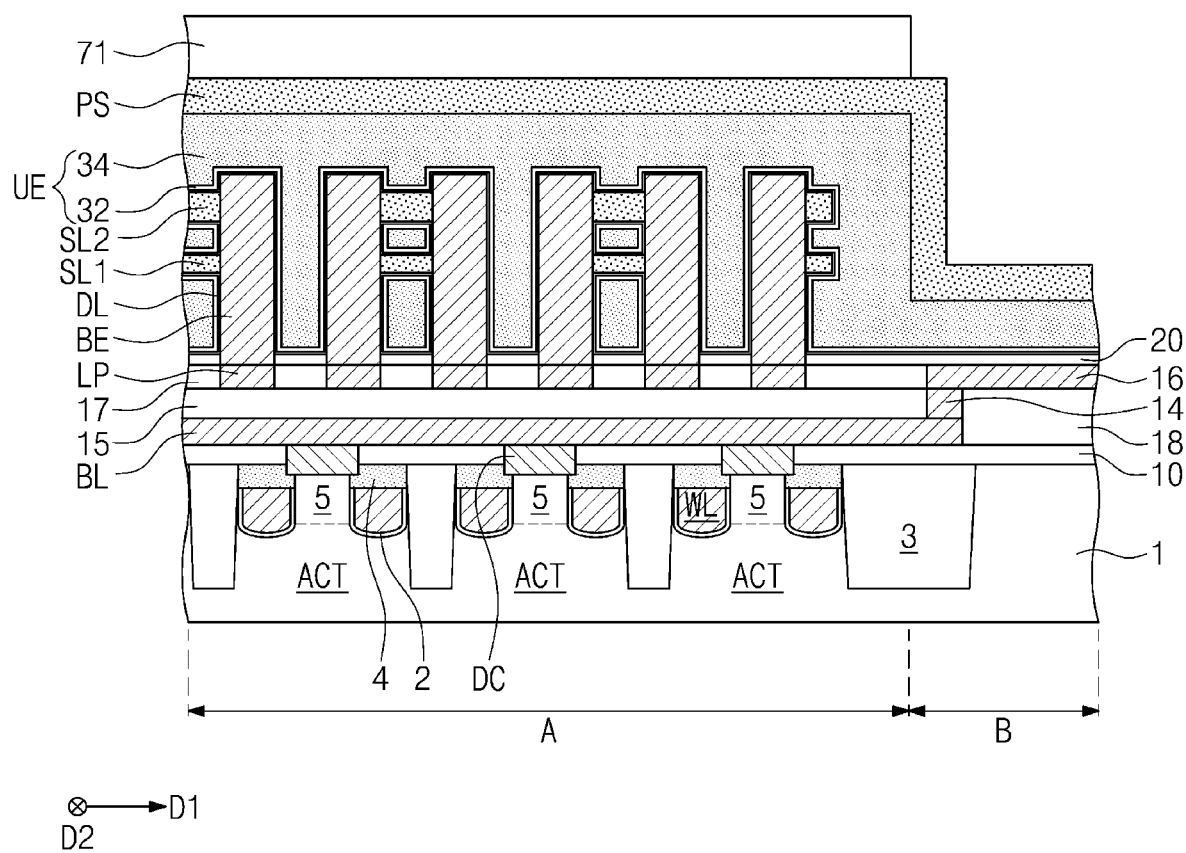
FIGS. 15A, 15B, 15C, 15D and 15E are sectional views illustrating a process of fabricating the semiconductor memory device of FIG. 3A.

Referring to FIGS. 14D and 15A, the lower electrodes BE and the first and second support patterns SL1 and SL2 may be formed. The dielectric layer DL and the metal-containing layer 32 may be formed to cover the lower electrodes BE. The silicon germanium layer 34 may be formed on the metal-containing layer 32. The poly-silicon layer PS may be formed to cover the silicon germanium layer 34. After the formation of the poly-silicon layer PS, the poly-silicon layer PS may be doped with impurities (e.g., boron) and may have a conductive property. The boron doping process may be performed by, for example, an ion implantation process.

The first mask pattern 71 may be formed on the cell region A to cover the poly-silicon layer PS. The first mask pattern 71 may selectively expose the poly-silicon layer PS on the peripheral region B.

Figure 15B:
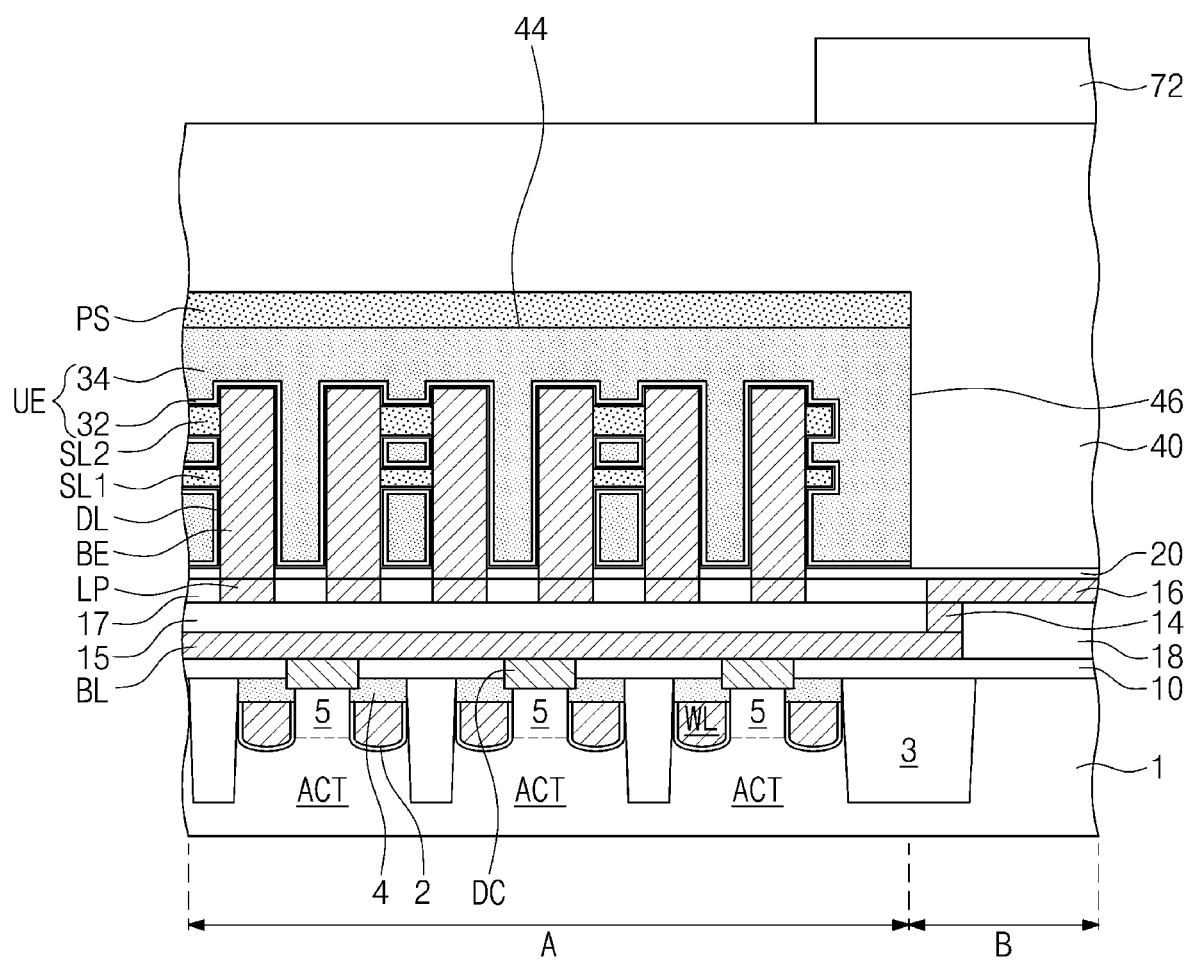

Referring to FIG. 15B, an etching process, in which the first mask pattern 71 of FIG. 15A is used as an etch mask, may be performed to remove the poly-silicon layer PS and the silicon germanium layer 34 from the peripheral region B. In an embodiment, the etching process may be a dry etching process. The poly-silicon layer PS and the silicon germanium layer 34 on the peripheral region B may be removed, as a result of the etching process. In an embodiment, a portion of the poly-silicon layer PS, which is disposed on the cell region A to cover the side surface 46 of the silicon germanium layer 34, may be removed during the etching process. Accordingly, the side surface 46 of the silicon germanium layer 34 may be exposed. The first mask pattern 71 may then be removed.

The third interlayered insulating layer 40 may be formed to cover the side surface 46 of the silicon germanium layer 34 and a top surface 81 and a side surface 82 of the poly-silicon layer PS. The third interlayered insulating layer 40 may be formed on the cell region A and the peripheral region B. Thereafter, the second mask pattern 72 may be formed to expose a portion of the cell region A. The second mask pattern 72 may be formed of or include, for example, a photoresist material. The second mask pattern 72 may cover the edge portion of the top surface of the polysilicon film PS of the cell region A and the peripheral region B, and expose the remaining portion.

Figure 15C:
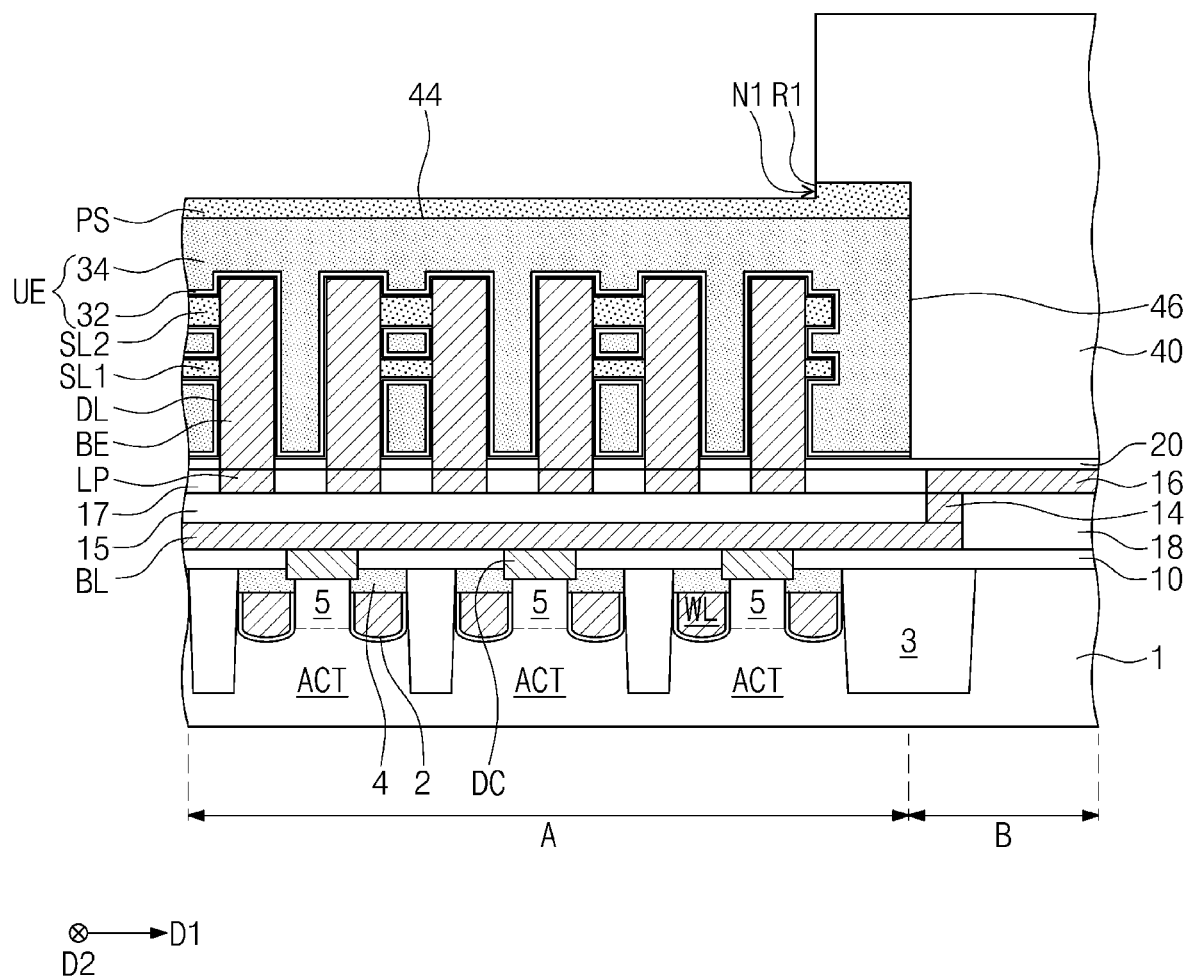

Referring to FIGS. 15B and 15C, an etching process may be performed using the second mask pattern 72 of FIG. 15B as an etch mask. In an embodiment, the etching process may be a dry etching process. The etching process may be performed to etch the third interlayered insulating layer 40 and an upper portion of the poly-silicon layer PS, which are not veiled by the second mask pattern 72. Accordingly, the recess R1 may be formed in the upper portion of the poly-silicon layer PS. The recess R1 of the poly-silicon layer PS may have a bottom surface that is vertically spaced apart from the lower electrodes BE. In certain embodiments, the top surface of the silicon germanium layer 34 may be exposed. The second mask pattern 72 may be removed.

Figure 15D:
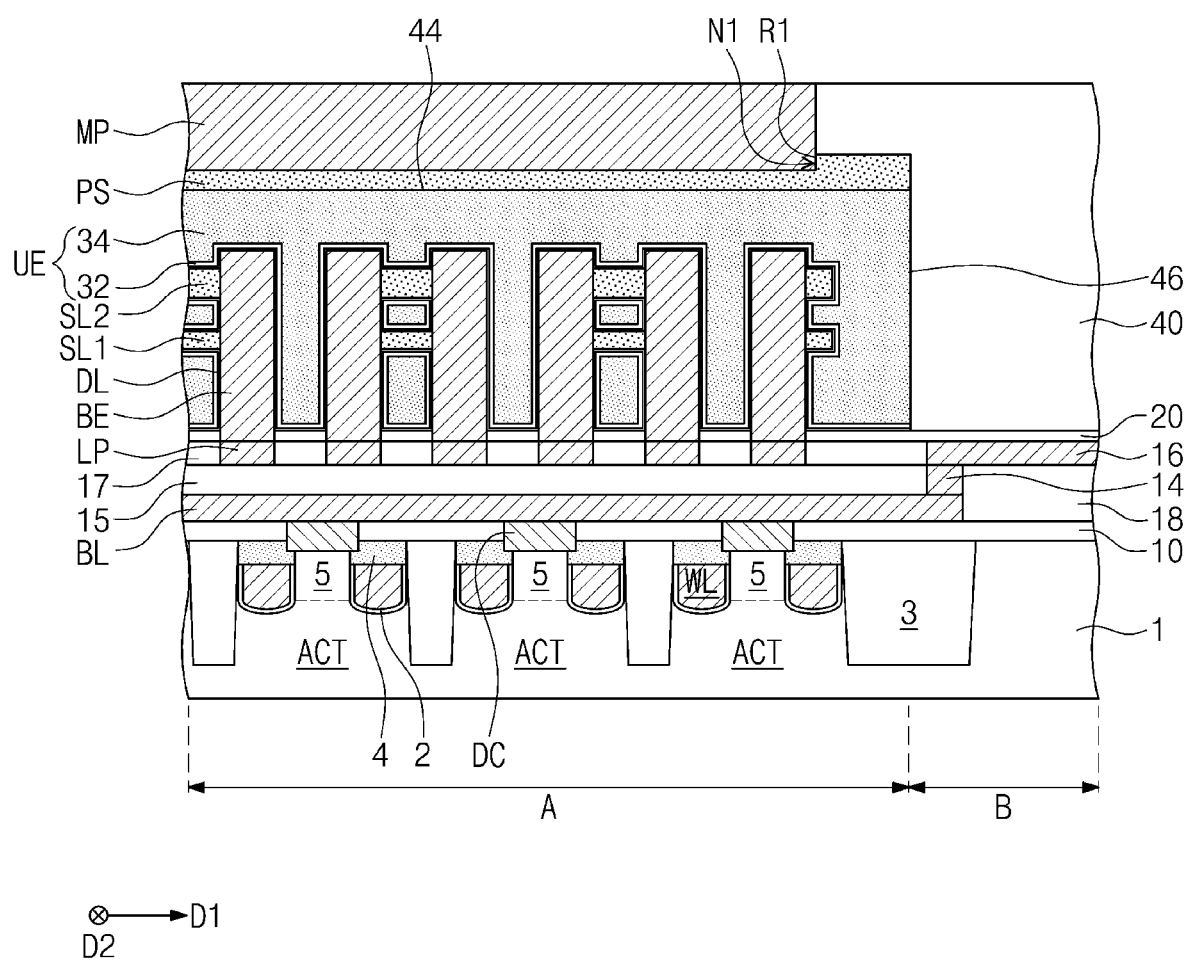

Referring to FIG. 15D, a conductive layer may be formed to fill the recess R1. The conductive layer may be formed of or include, for example, tungsten. The recess R1 may be filled with a portion of the conductive layer, and thereafter, a planarization process may be performed to planarize the top surfaces of the conductive layer and the third interlayered insulating layer 40. As a result of the planarization process on the conductive layer, the conductive pad MP may be formed to have a flat top surface.

Figure 15E:
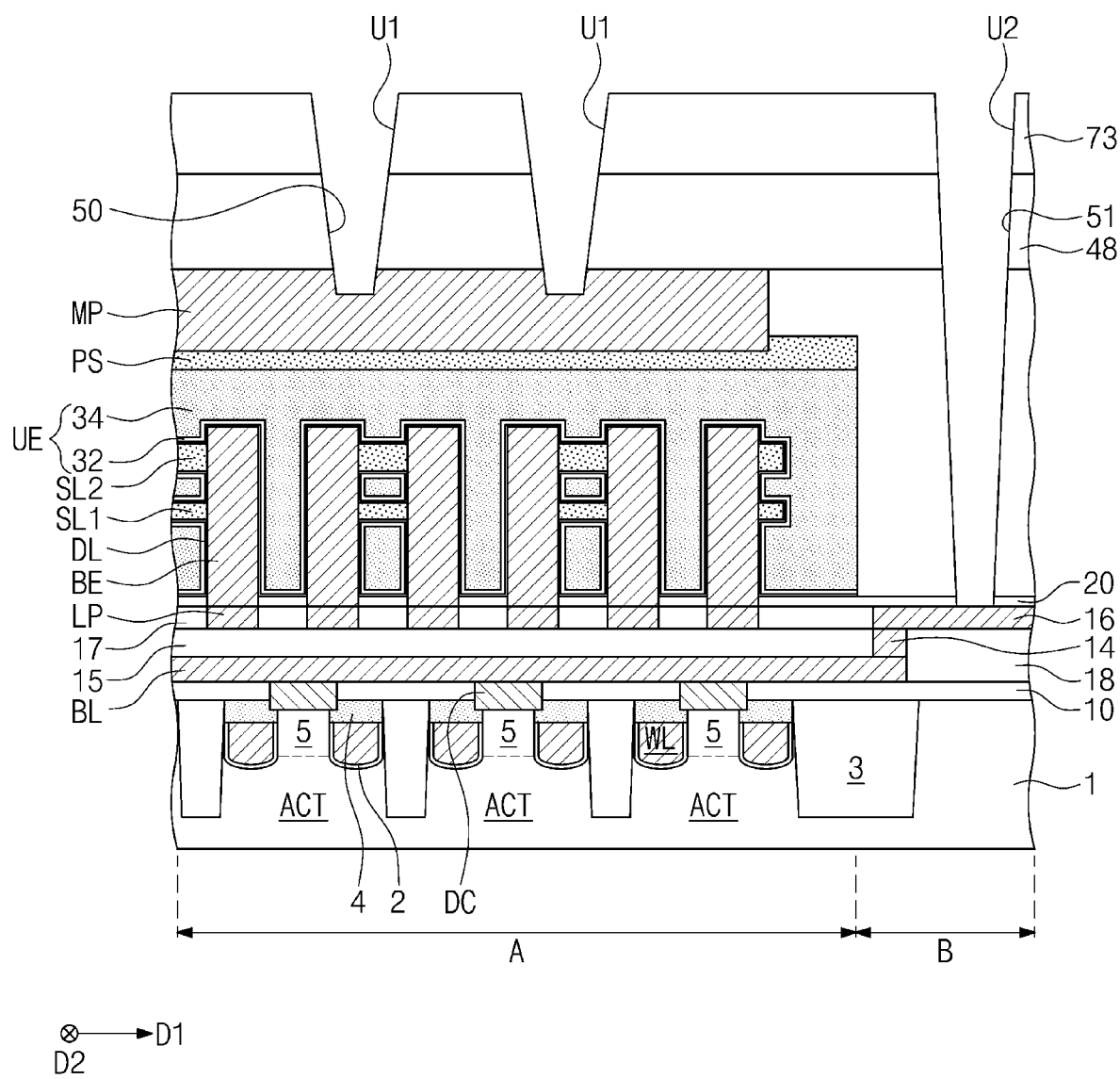

Referring to FIG. 15E, the fourth interlayered insulating layer 48 may be formed to cover the top surfaces of the conductive pad MP and the third interlayered insulating layer 40. The third mask pattern 73 may be formed on the fourth interlayered insulating layer 48.

An etching process may be performed using the third mask pattern 73 as an etch mask. As a result of the etching process, the upper electrode contact holes 50 may be formed to expose the top surface of the conductive pad MP, and the peripheral contact hole 51 may be formed to expose the peripheral interconnection line 16. The upper electrode contact holes 50 and the peripheral contact hole 51 may be formed at the same time.

Referring back to FIG. 3A, the third mask pattern 73 may be removed. Next, a conductive layer may be formed to fill the upper electrode contact holes 50 and the peripheral contact hole 51. Thereafter, a planarization process may be performed on the conductive layer to form the upper electrode contact plugs 54 and the peripheral contact plug 56 in the upper electrode contact holes 50 and the peripheral contact hole 51, respectively. As a result, the semiconductor memory device may be fabricated to have the structure of FIG. 3A.

FIGS. 16A to 16H are sectional views illustrating a process of fabricating a semiconductor memory device, according to an embodiment.

Figure 16A:
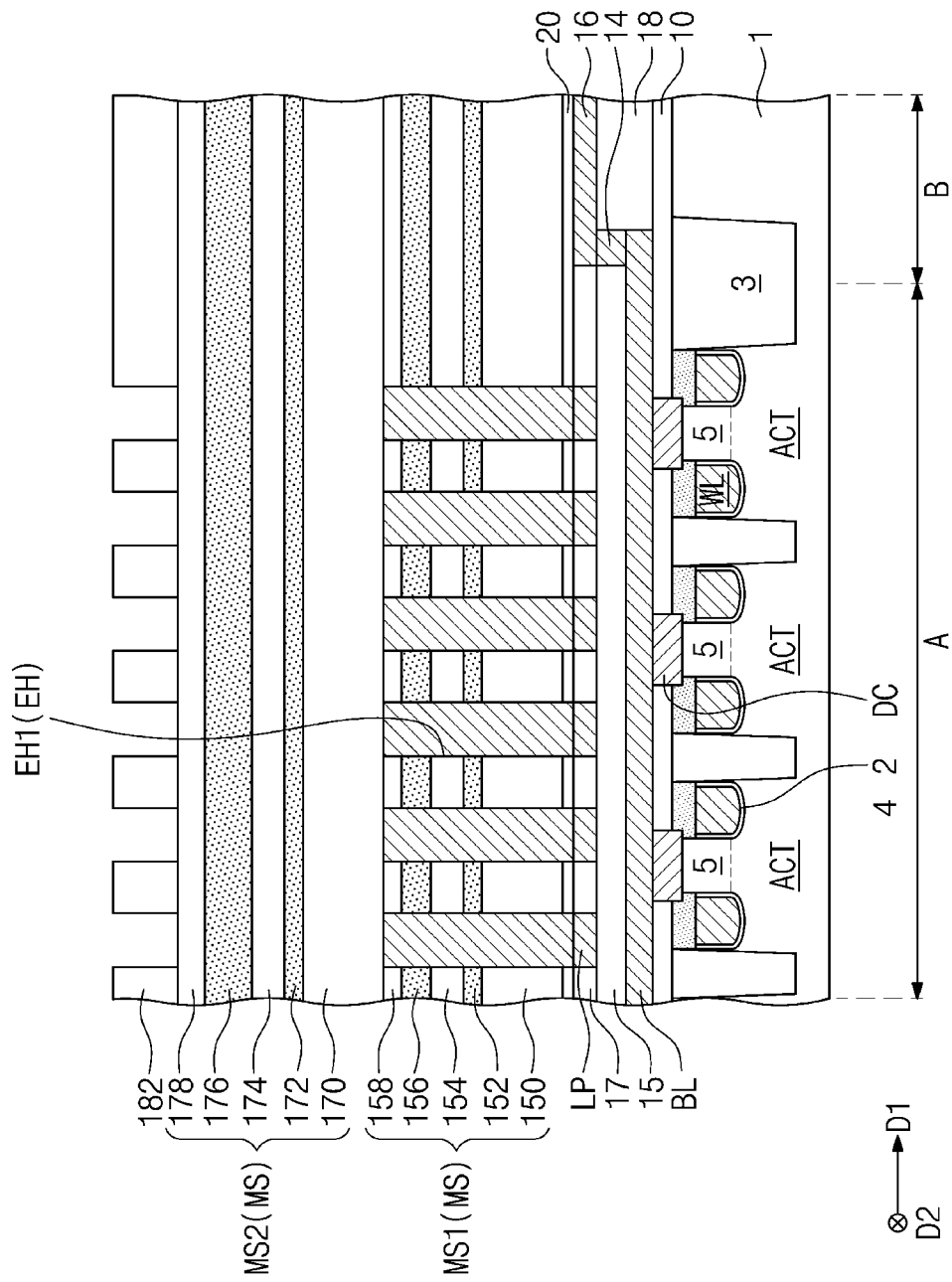
FIGS. 16A, 16B, 16C, 16D, 16E, 16F, 16G, 16H and 16I are sectional views illustrating a process of fabricating the semiconductor memory device of FIG. 4.

Referring to FIGS. 14B and 16A, the lower electrodes BE and a first mold structure MS1 may be formed. A second mold structure MS2 may be formed on the third mold layer 158 of the first mold structure MS1. The second mold structure MS2 may include a fourth mold layer 170, a third supporting layer 172, a fifth mold layer 174, a fourth supporting layer 176, and a sixth mold layer 178. The fourth mold layer 170, the third supporting layer 172, the fifth mold layer 174, the fourth supporting layer 176, and the sixth mold layer 178 may be sequentially formed. In an embodiment, the fourth to sixth mold layers 170, 174, and 178 may be formed of or include substantially the same materials as the first to second mold layers 150, 154, and 158, respectively. The fourth to sixth mold layers 170, 174, and 178 may be formed of or include, for example, silicon nitride. The third supporting layer 172 and the fourth supporting layer 176 may be formed of or include, for example, silicon oxide. Alternatively, the fourth to sixth mold layers 170, 174, and 178 may be formed of or include, for example, silicon oxide, and the third supporting layer 172 and the fourth supporting layer 176 may be formed of or include, for example, silicon nitride.

A third mask layer 182 may be formed on the sixth mold layer 178. The third mask layer 182 may have openings 188. The openings 188 may be formed to expose portions of a top surface of a sixth mold layer 180.

Figure 16B:
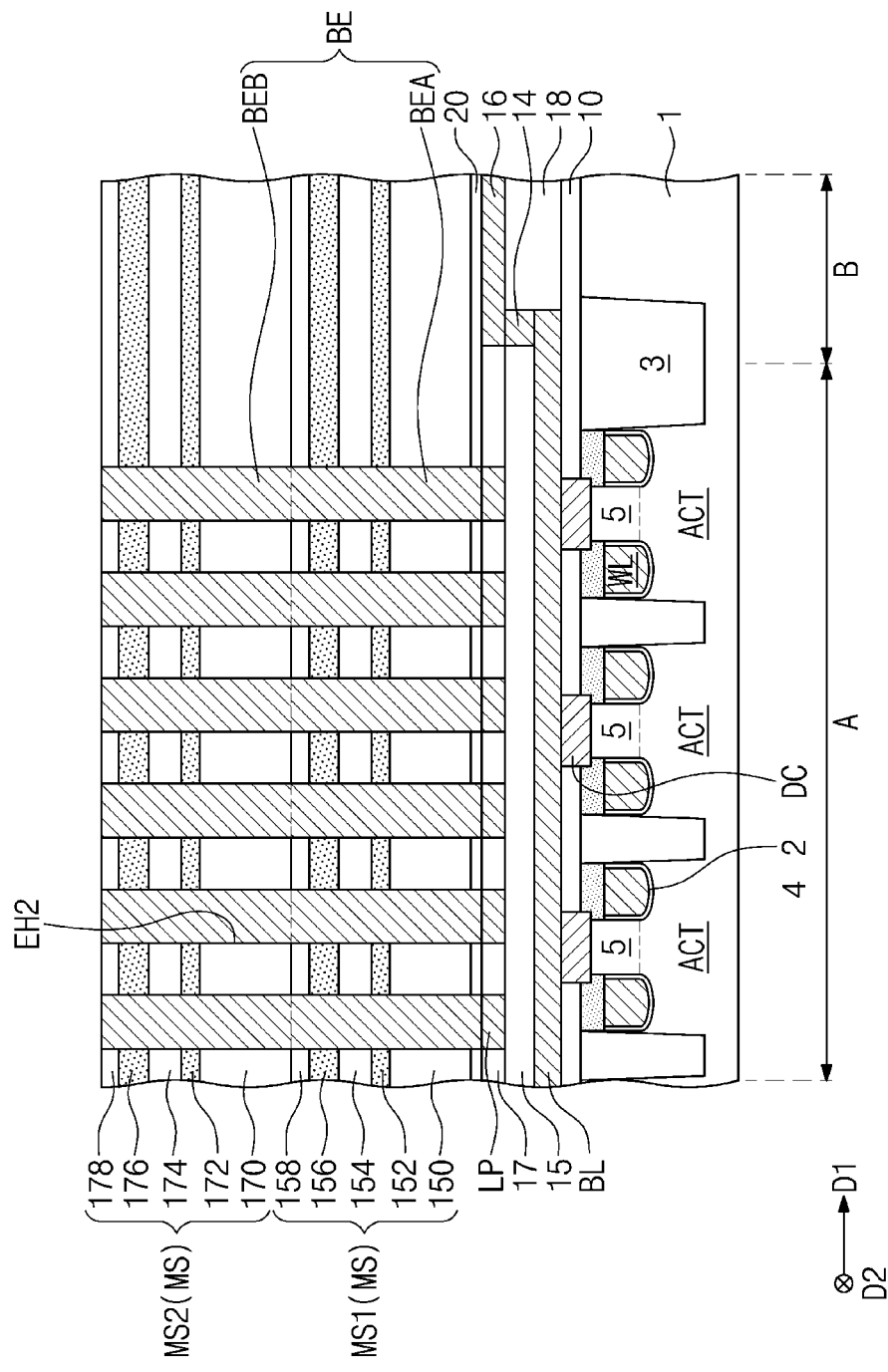

Referring to FIG. 16B, the second mold structure MS2 may be anisotropically etched using the third mask layer 182 as an etch mask. Accordingly, second electrode holes EH2 may be formed in the second mold structure MS2. For example, the second electrode holes EH2 may be formed by sequentially and anisotropically etching the sixth mold layer 178, the fourth supporting layer 176, the fifth mold layer 174, the third supporting layer 172, and the fourth mold layer 170. Top surfaces of the lower electrodes BE may be exposed through the second electrode holes EH2. Portions of the fourth to sixth mold layers 170, 174, and 178 and the first and second supporting layers 172 and 176 may be exposed by side surfaces of the second electrode holes EH2. The anisotropic etching process may be, for example, a dry etching process. The third mask layer 182 may be removed after or during the etching process.

The lower electrodes BE including the first and second portions BEA and BEB may be formed by filling the second electrode holes EH2 with at least one electrode material. The second portion BEB may be formed by a process of filling the second electrode holes EH2.

Figure 16C:
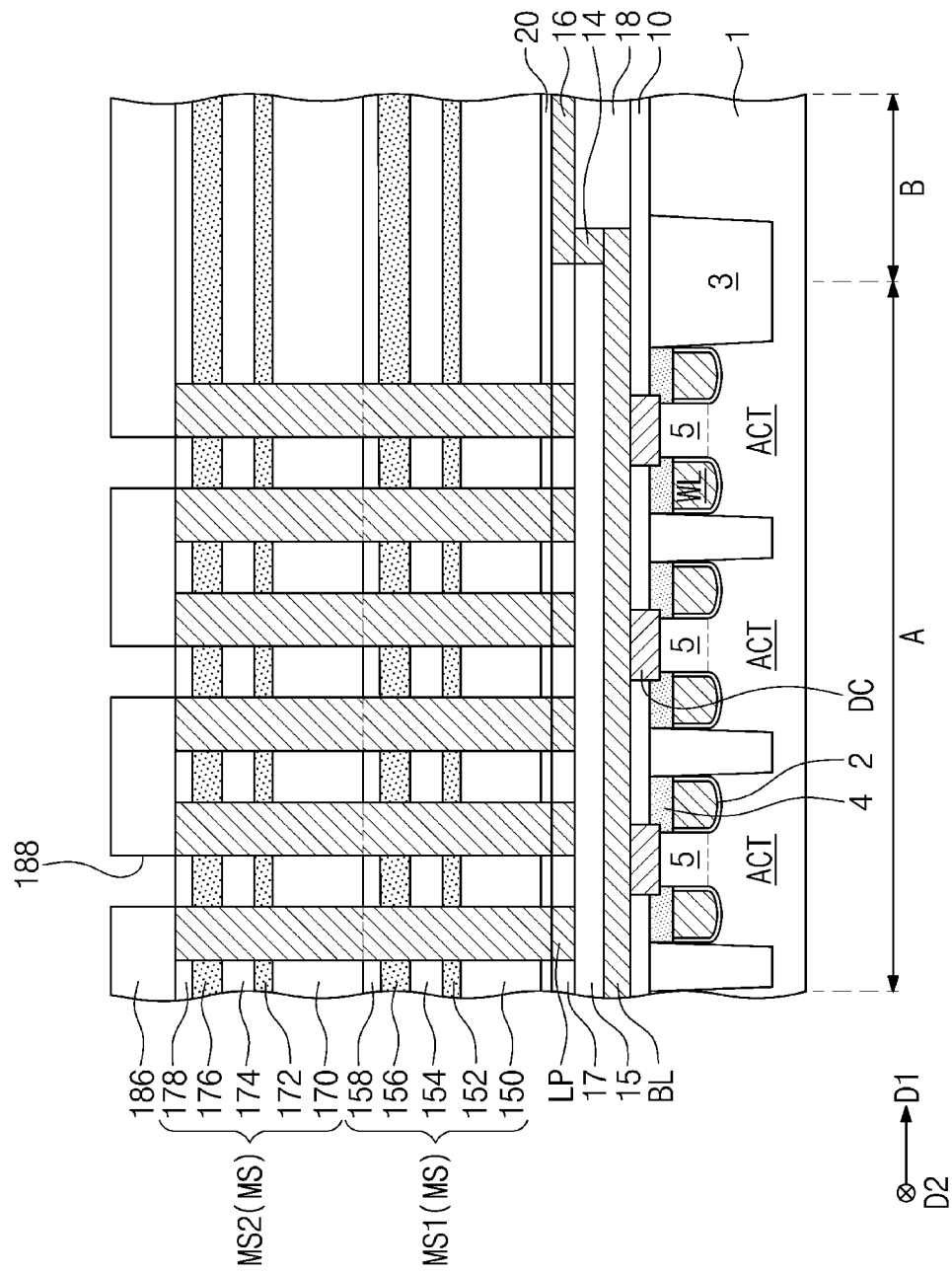
Figure 16D:
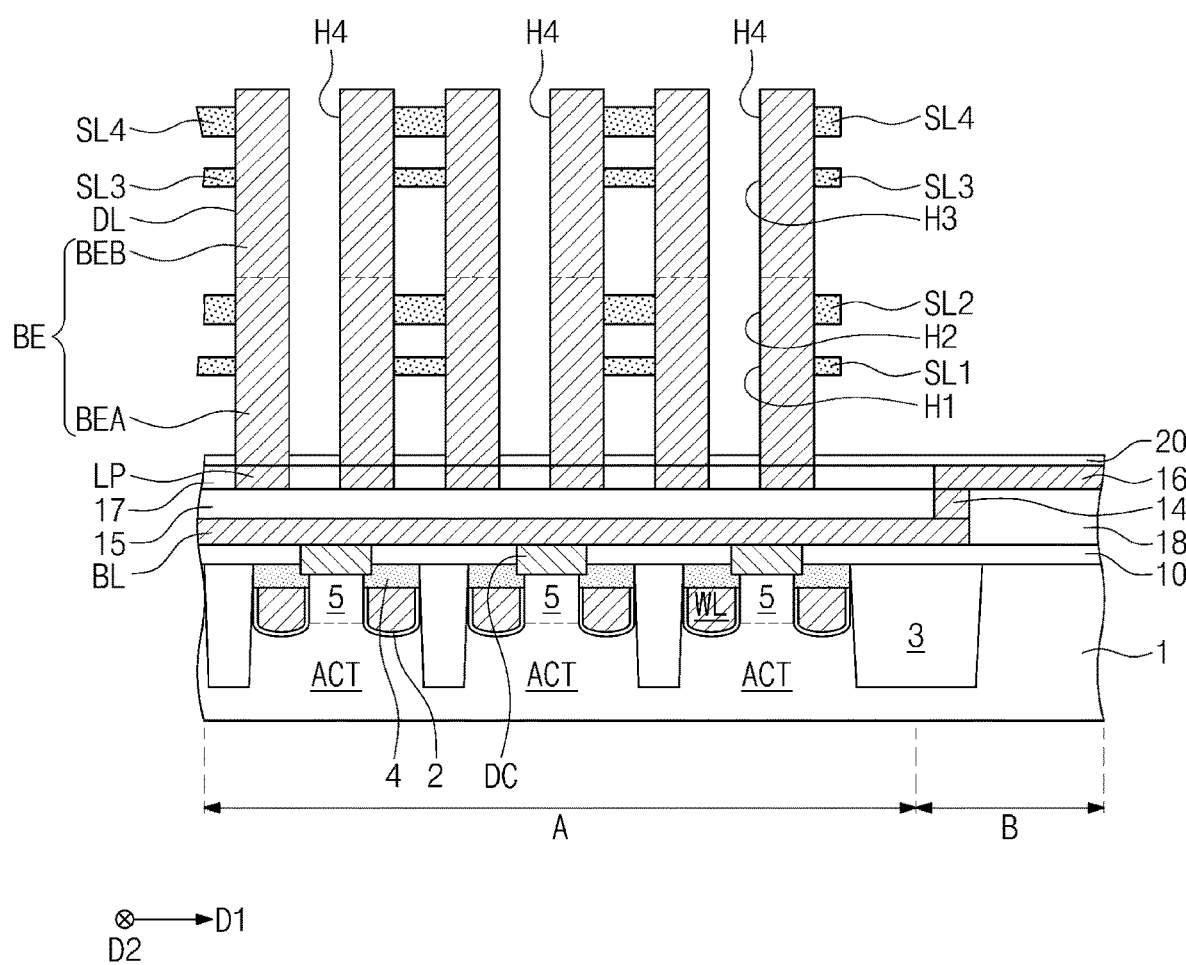

Referring to FIGS. 16C and 16D, a fourth mask layer 186 may be formed on the second mold structure MS2, in which the second portion BEB of the lower electrodes BE is formed. The fourth mask layer 186 may have the openings 188, and here, widths of the openings 188 may be equal to or greater than a distance between adjacent ones of the lower electrode BE. An anisotropic etching process using the fourth mask layer 186 as an etch mask may be performed to etch the fourth supporting layer 176 between the lower electrodes BE, and thus, the fourth support pattern SL4 and the fourth support hole H4 may be formed. The sixth and fifth mold layers 178 and 174 may be removed through the fourth support hole H4 by an isotropic etching process. An anisotropic process may be performed to etch the third supporting layer 172, and thus, the third support pattern SL3 and the third support hole H3 may be formed. The fourth mold layer 170 may be removed through the third support hole H3. The formation of the first and second support patterns SL1 and SL2 and the first and second support holes H1 and H2 and the removal of the first to third mold layers 150, 152, and 154 may be performed in the same manner as those described with reference to FIGS. 14C and 14B.

As a result of the removal of the first to sixth mold layers 150, 154, 158, 170, 174, and 178, the top and side surfaces of the lower electrodes BE and the top surface of the etch stop layer 20 may be exposed. The fourth mask layer 186 may be removed.

Figure 16E:
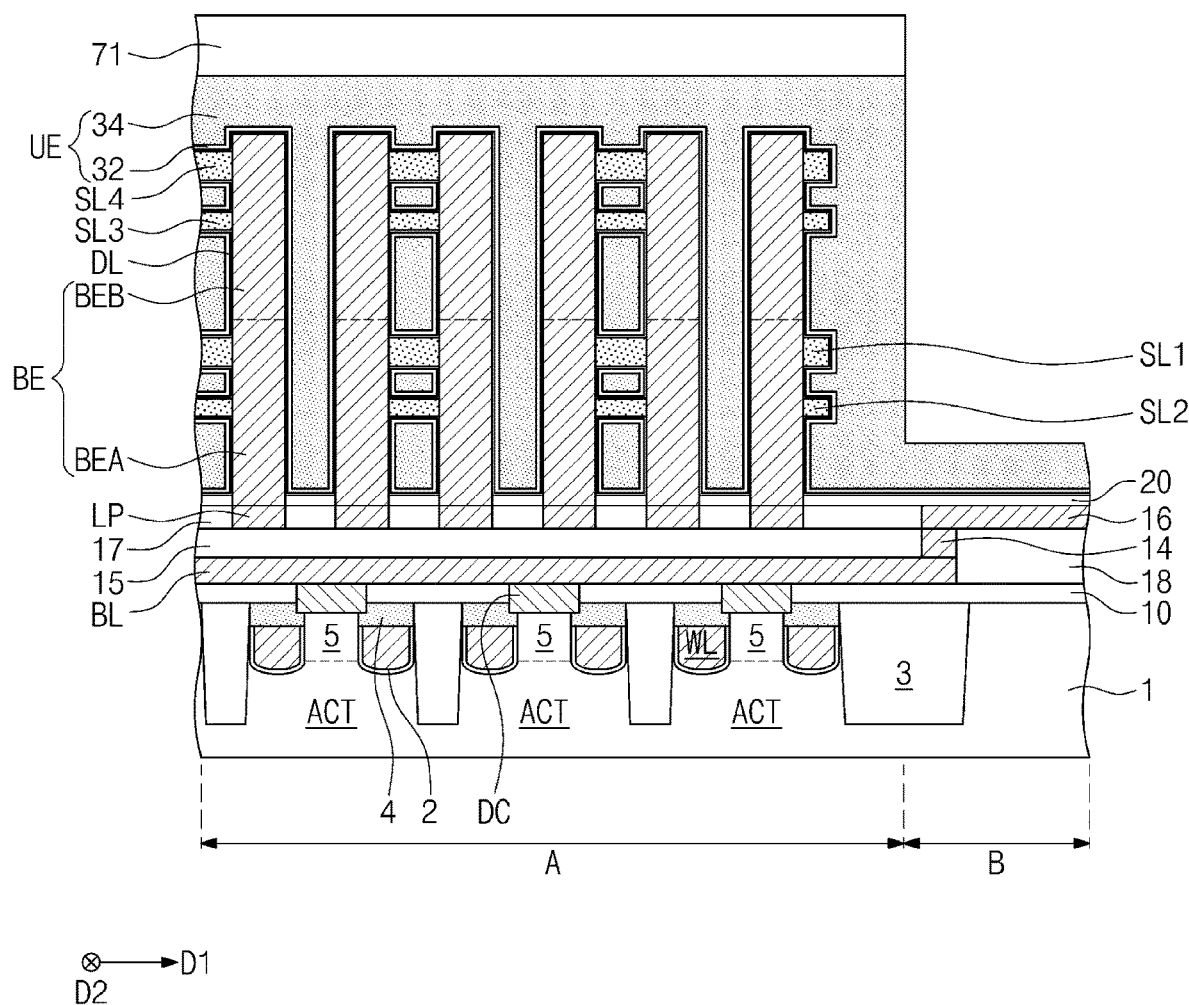

Referring to FIG. 16E, the dielectric layer DL may be formed on the cell region A and the peripheral region B. The dielectric layer DL may be formed to cover the top and side surfaces of the lower electrodes BE and the top, bottom, and side surfaces of the first to fourth support patterns SL1, SL2, SL3, and SL4. The metal-containing layer 32 may be conformally formed on the dielectric layer DL. The silicon germanium layer 34 may be formed on the metal-containing layer 32. Thereafter, the first mask pattern 71 may be formed to cover the silicon germanium layer 34 on the cell region A.

Figure 16F:
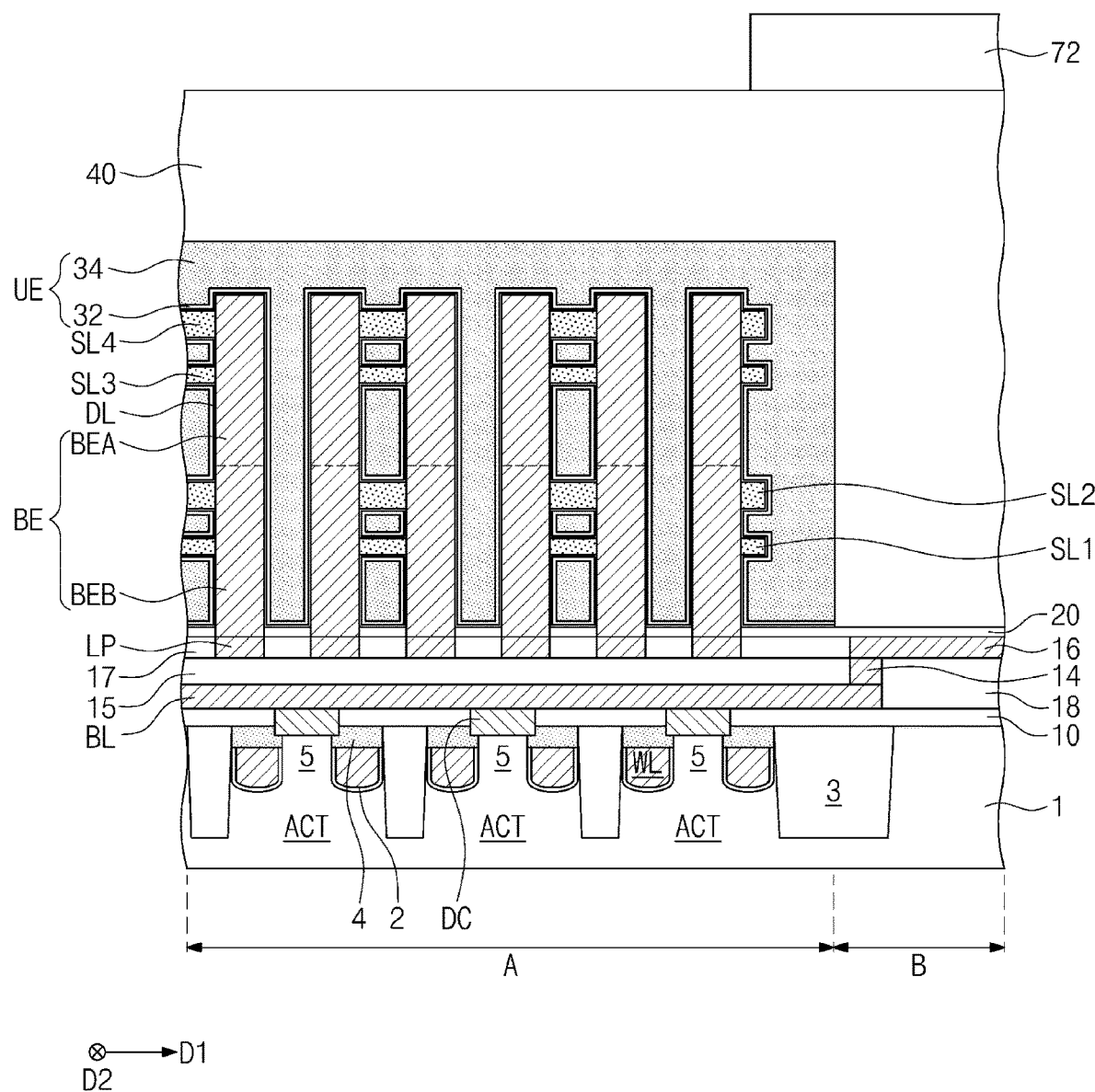

Referring to FIG. 16F, the silicon germanium layer 34, the metal-containing layer 32, and the dielectric layer DL may be removed from the peripheral region B using the first mask pattern 71 of FIG. 16E as an etch mask, and thus, the upper electrode UE may be formed to expose a portion of the top surface of the etch stop layer 20. The first mask pattern 71 may be removed.

The third interlayered insulating layer 40 may be formed to cover the cell region A and the peripheral region B. The third interlayered insulating layer 40 may cover the top surface 44 and the side surface 46 of the upper electrode UE. The second mask pattern 72 may be formed on the third interlayered insulating layer 40. The second mask pattern 72 may be formed of or include, for example, a photoresist material. The second mask pattern 72 may cover the peripheral region B and a portion of the cell region A. In an embodiment, the second mask pattern 72 may cover the top surface of the edge portion of the silicon germanium layer 34, on the cell region A, but may expose all regions of the cell region A, other than the edge portion of the silicon germanium layer 34.

Figure 16G:
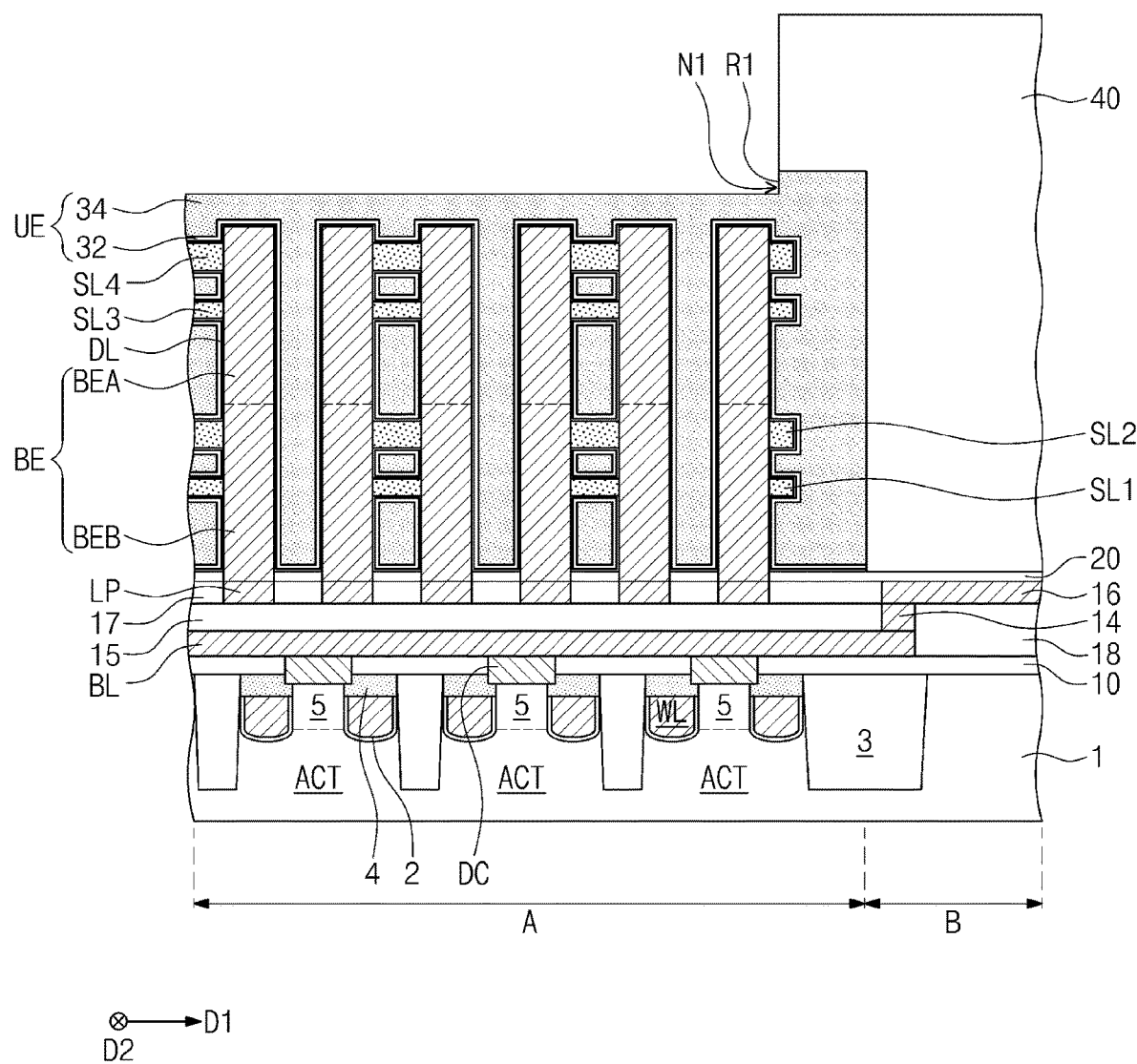

Referring to FIG. 16G, an etching process may be performed using the second mask pattern 72 of FIG. 16F as an etch mask. In an embodiment, the etching process may be a dry etching process. The etching process may be performed to etch the third interlayered insulating layer 40 and a portion of the silicon germanium layer 34, which are not veiled by the second mask pattern 72. Accordingly, the recess R1 may be formed in an upper portion of the silicon germanium layer 34. The bottom surface of the recess R1 of the silicon germanium layer 34 may be vertically spaced apart from the lower electrodes BE. As a result of the formation of the recess R1, an upper portion of the edge portion of the silicon germanium layer 34 may have the step structure N1. The second mask pattern 72 may be removed.

Figure 16H:
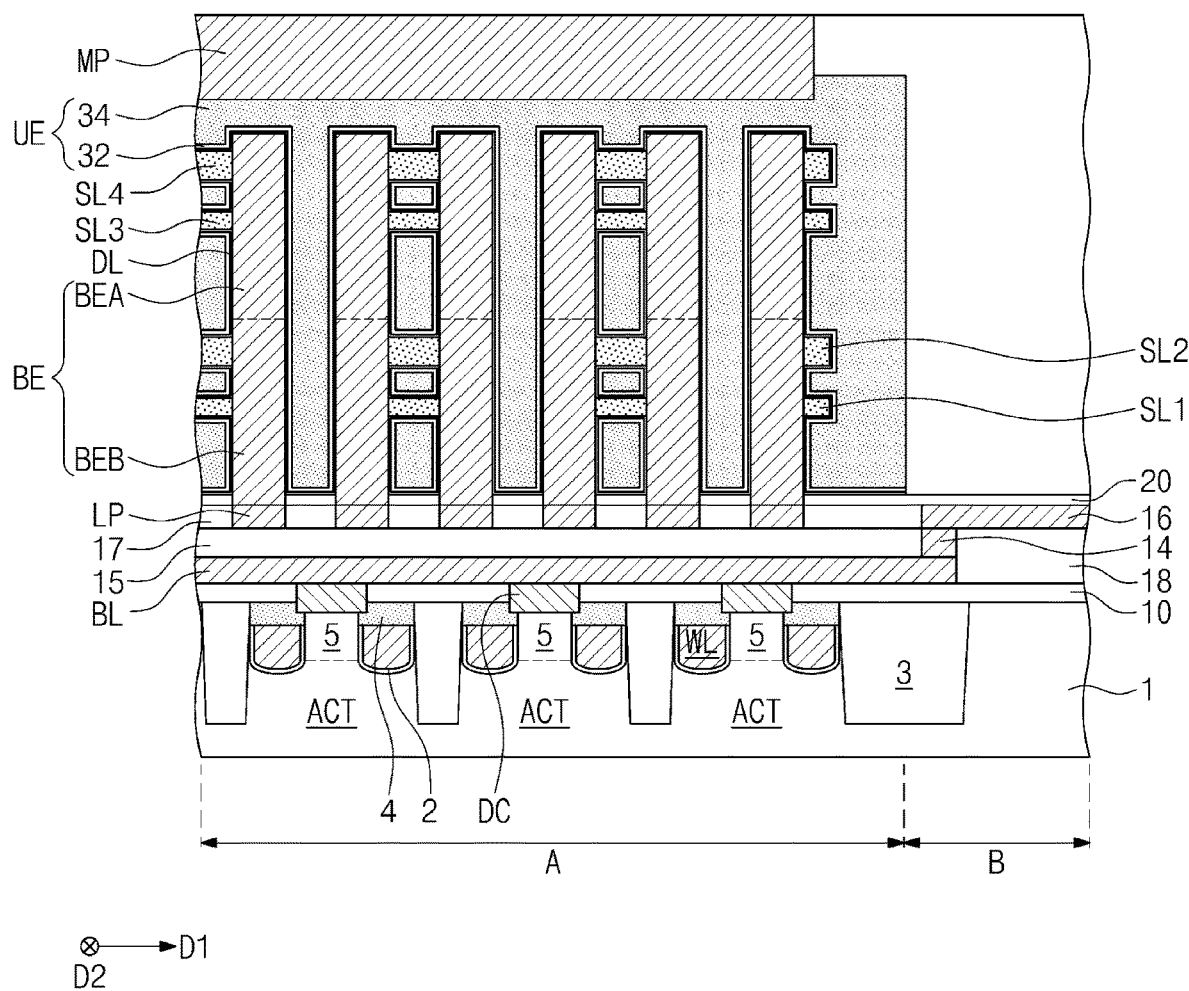

Referring to FIG. 16H, a conductive layer may be formed to fill the recess R1. The conductive layer may be formed of or include, for example, tungsten. The recess R1 may be filled with a portion of the conductive layer, and thereafter, a planarization process may be performed to planarize the top surfaces of the conductive layer and the third interlayered insulating layer 40. As a result of the planarization process on the conductive layer, the conductive pad MP may be formed to have a flat top surface.

Figure 16I:
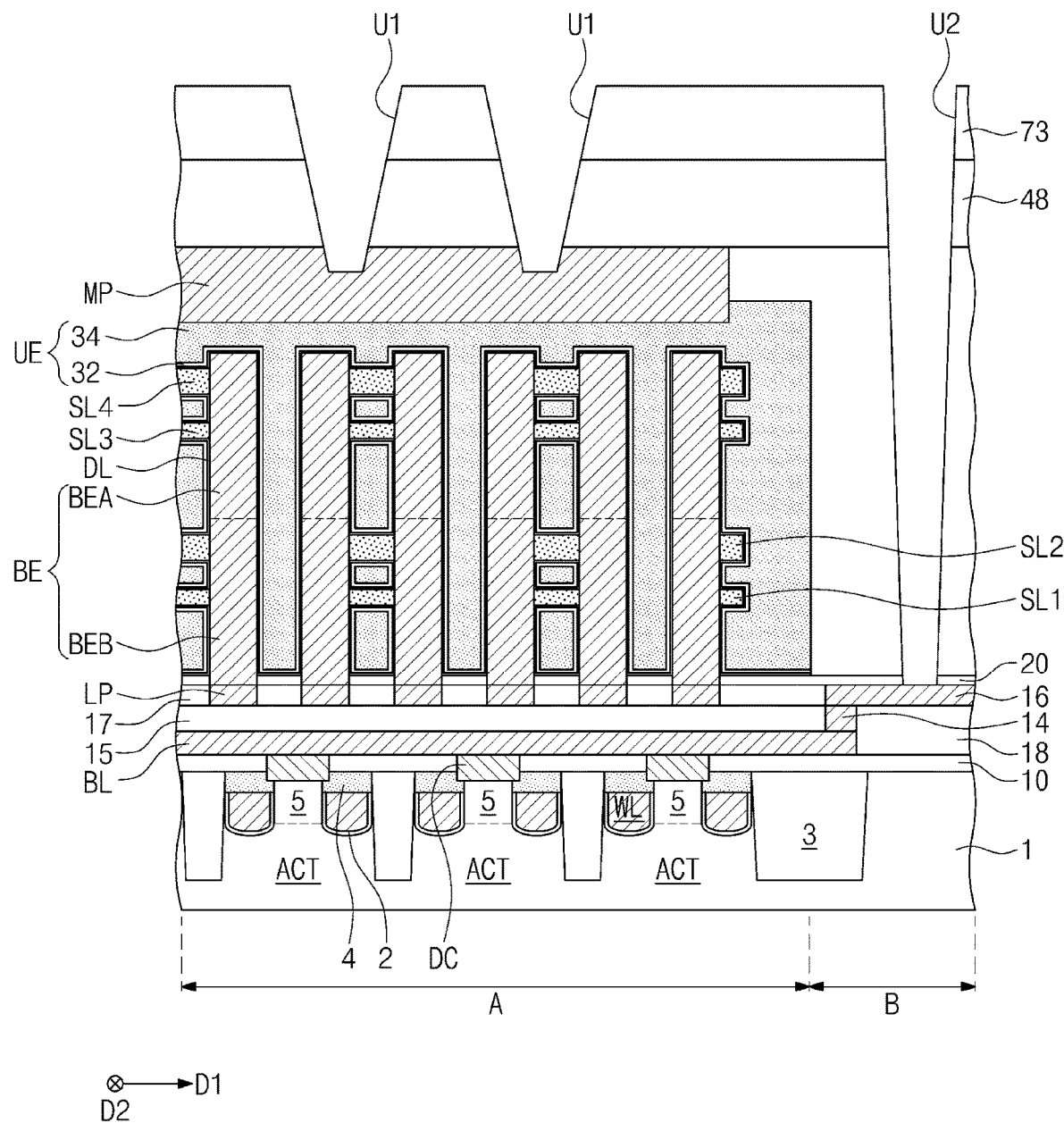

Referring to FIG. 16I, the fourth interlayered insulating layer 48 may be formed on the cell region A and the peripheral region B. The fourth interlayered insulating layer 48 may be formed to cover the top surfaces of the conductive pad MP and the third interlayered insulating layer 40. The fourth interlayered insulating layer 48 may be formed of or include the same or similar material as the third interlayered insulating layer 40. The third mask pattern 73 may be formed on the fourth interlayered insulating layer 48. The third mask pattern 73 may include the first openings U1, which are overlapped with the conductive pad MP, and the second opening U2, which is overlapped with the peripheral interconnection line 16.

Referring back to FIG. 9, the third mask pattern 73 may be removed. Next, a conductive layer may be formed to fill the upper electrode contact holes 50 and the peripheral contact hole 51. Thereafter, a planarization process may be performed on the conductive layer to form the upper electrode contact plugs 54 and the peripheral contact plug 56 in the upper electrode contact holes 50 and the peripheral contact hole 51, respectively. As a result, the semiconductor memory device may be fabricated to have the structure of FIG. 9.

FIGS. 17A to 17E are sectional views illustrating a process of fabricating a semiconductor memory device, according to an embodiment.

Figure 17A:
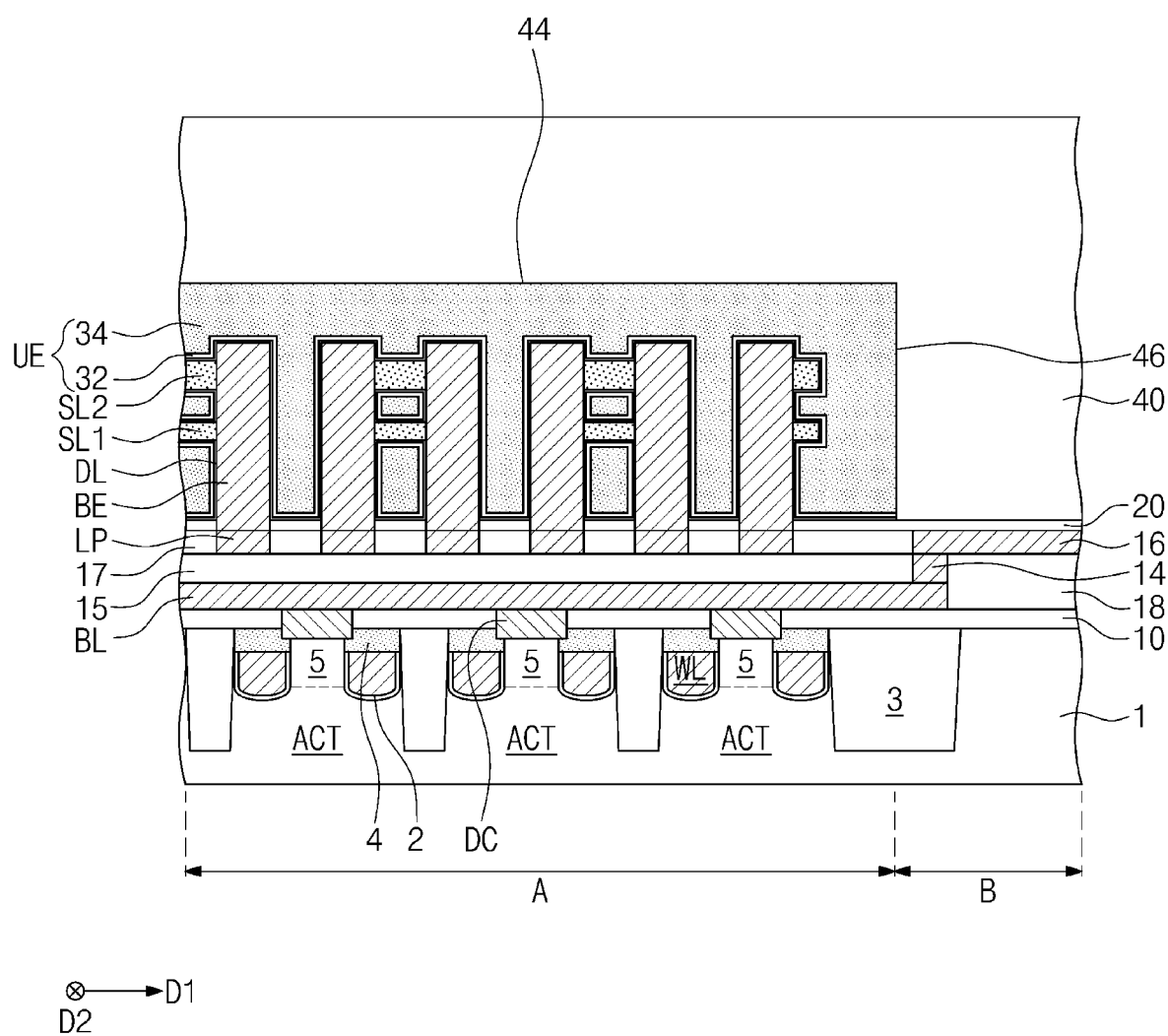
FIGS. 17A, 17B, 17C, 17D and 17E are sectional views illustrating a process of fabricating the semiconductor memory device of FIG. 5.

Referring to FIG. 14E and FIG. 17A, the dielectric layer DL, the metal-containing layer 32, and the silicon germanium layer 34 may be formed on the cell region A and the peripheral region B. The silicon germanium layer 34, the metal-containing layer 32, and the dielectric layer DL on the peripheral region B may not be protected by the first mask pattern 71 on the cell region A and thus may be removed from the peripheral region B.

The third interlayered insulating layer 40 may be formed on the cell region A and the peripheral region B. The third interlayered insulating layer 40 may be formed to cover the top surface 44 and the side surface 46 of the silicon germanium layer 34.

Figure 17B:
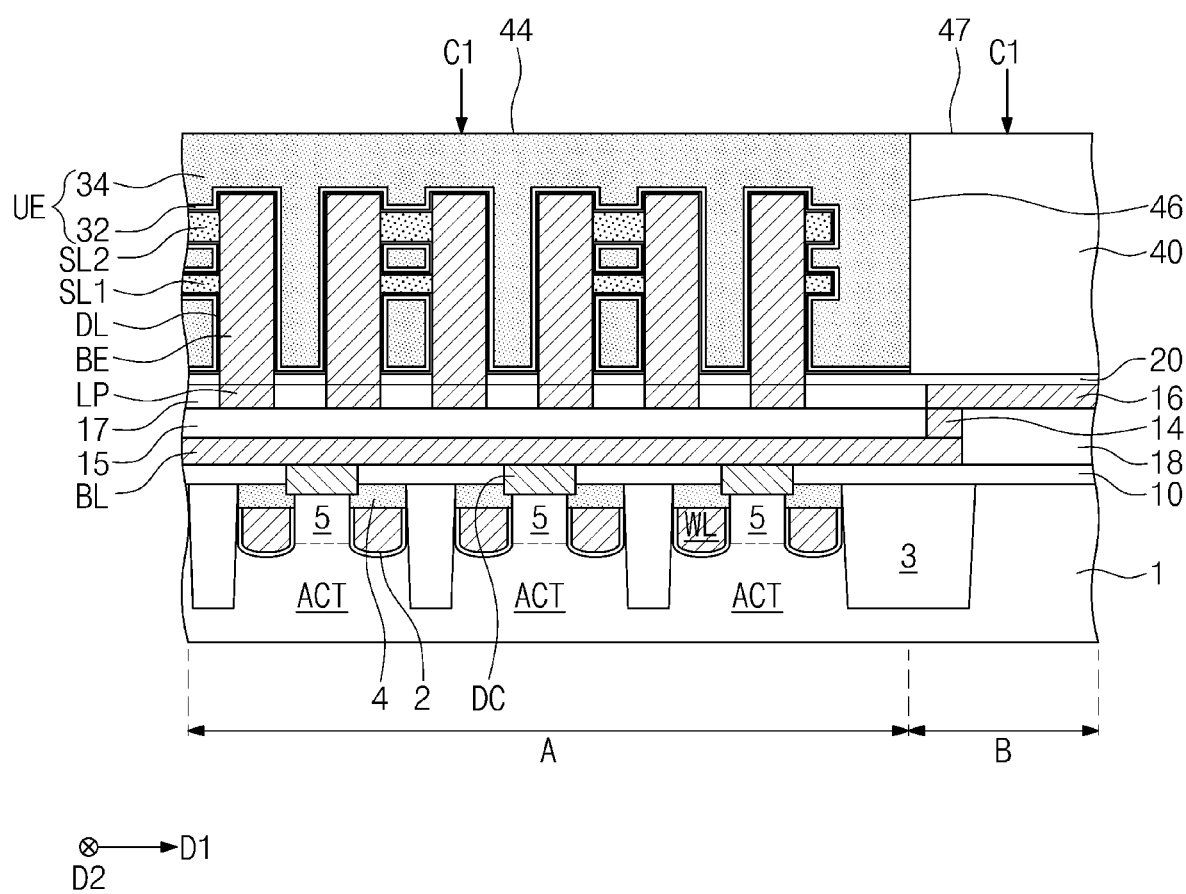

Referring to FIG. 17B, a planarization process Cl may be performed on not only the cell region A but also the peripheral region B. The planarization process Cl may be performed until the top surface 44c of the silicon germanium layer 34 on the cell region A is exposed. As a result of the planarization process Cl, the top surface 44 of the silicon germanium layer 34 on the cell region A may be coplanar with a top surface 47 of the third interlayered insulating layer 40 on the peripheral region B. As a result of the planarization process Cl, the surface roughness of the top surface 44 of the silicon germanium layer 34 may be less than the surface roughness of the side surface 46. Since the silicon germanium layer 34 has a large grain size, the silicon germanium layer 34 may have an uneven surface, when the silicon germanium layer 34 is formed. As a result of the planarization process Cl, the top surface 47 of the silicon germanium layer 34 may have a flat or even shape.

Figure 17C:
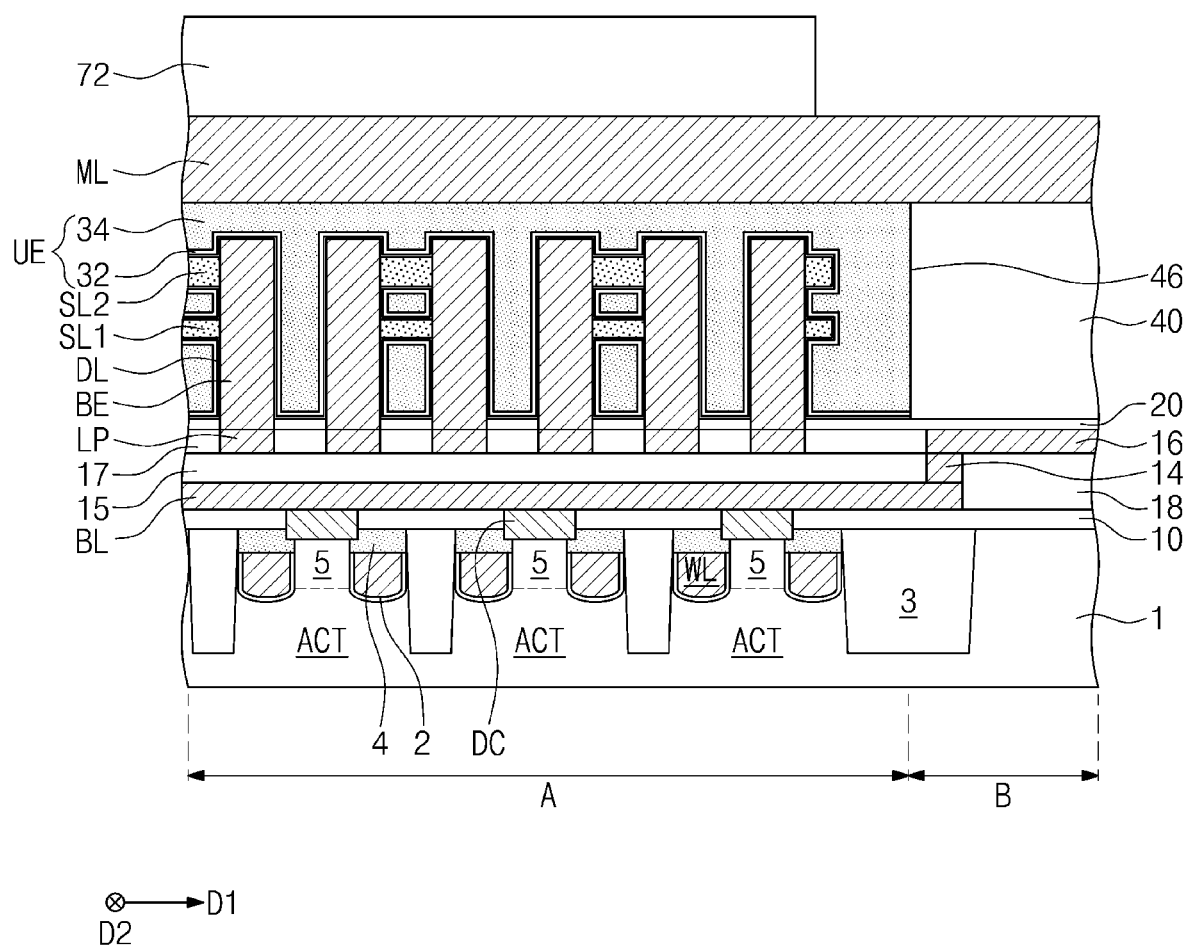

Referring to FIG. 17C, a conductive layer ML may be formed on the cell region A and the peripheral region B. The conductive layer ML may be formed of or include, for example, tungsten (W). The second mask pattern 72 may be formed to expose a portion of the conductive layer ML. In an embodiment, the second mask pattern 72 may be formed to expose the top surface of the conductive layer ML on the peripheral region B and the top surface of the edge portion of the conductive layer ML on the cell region A.

Figure 17D:
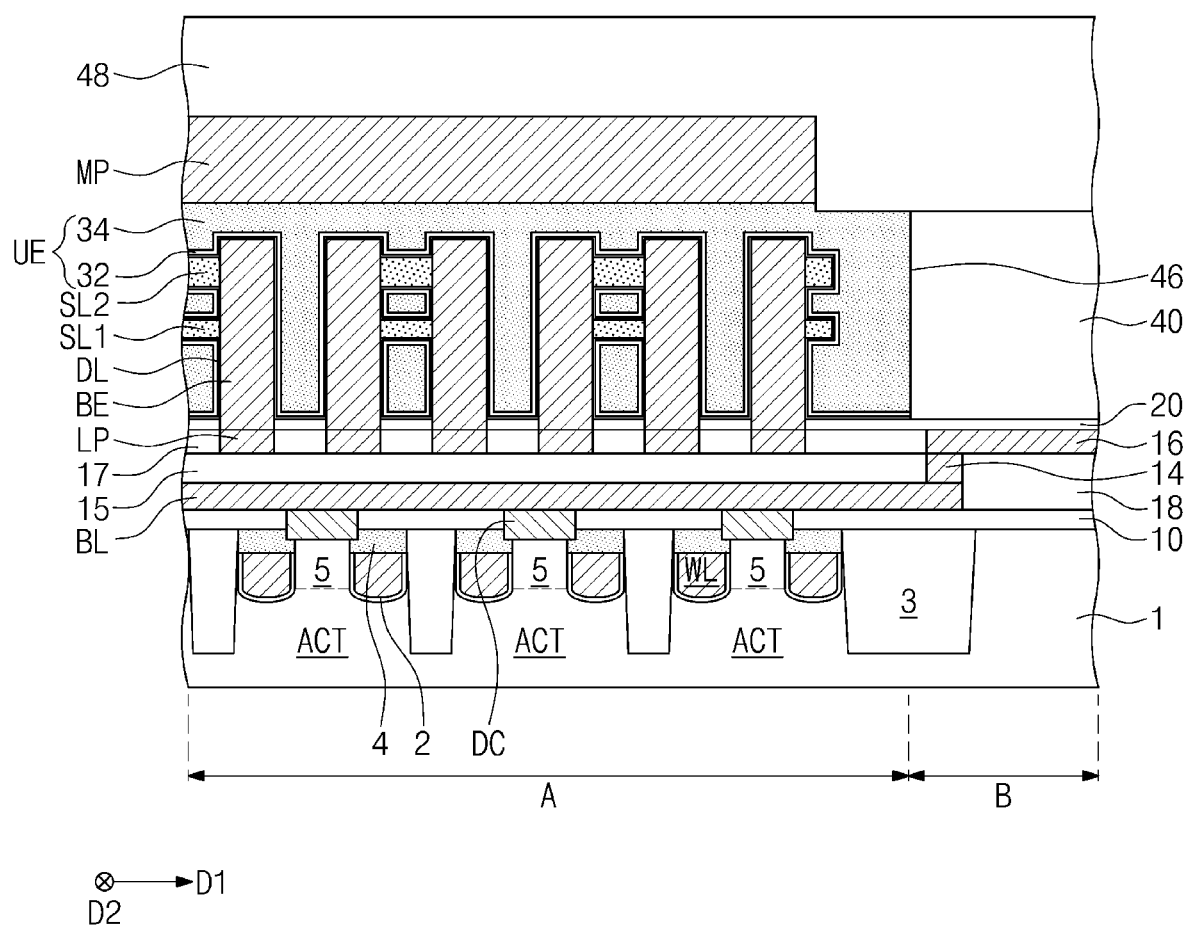

Referring to FIG. 17D, an etching process may be performed on a portion of the conductive layer ML exposed by the second mask pattern 72 of FIG. 17C. As a result of the etching process, the portion of the conductive layer ML may be etched to form the conductive pad MP. The etching process may be performed until the top surface of the silicon germanium layer 34 is exposed. When the top surface of the silicon germanium layer 34 is exposed, the top surface of the silicon germanium layer 34 and the third interlayered insulating layer 40 may be partially etched to form a step structure. The second mask pattern 72 may be removed.

Figure 17E:
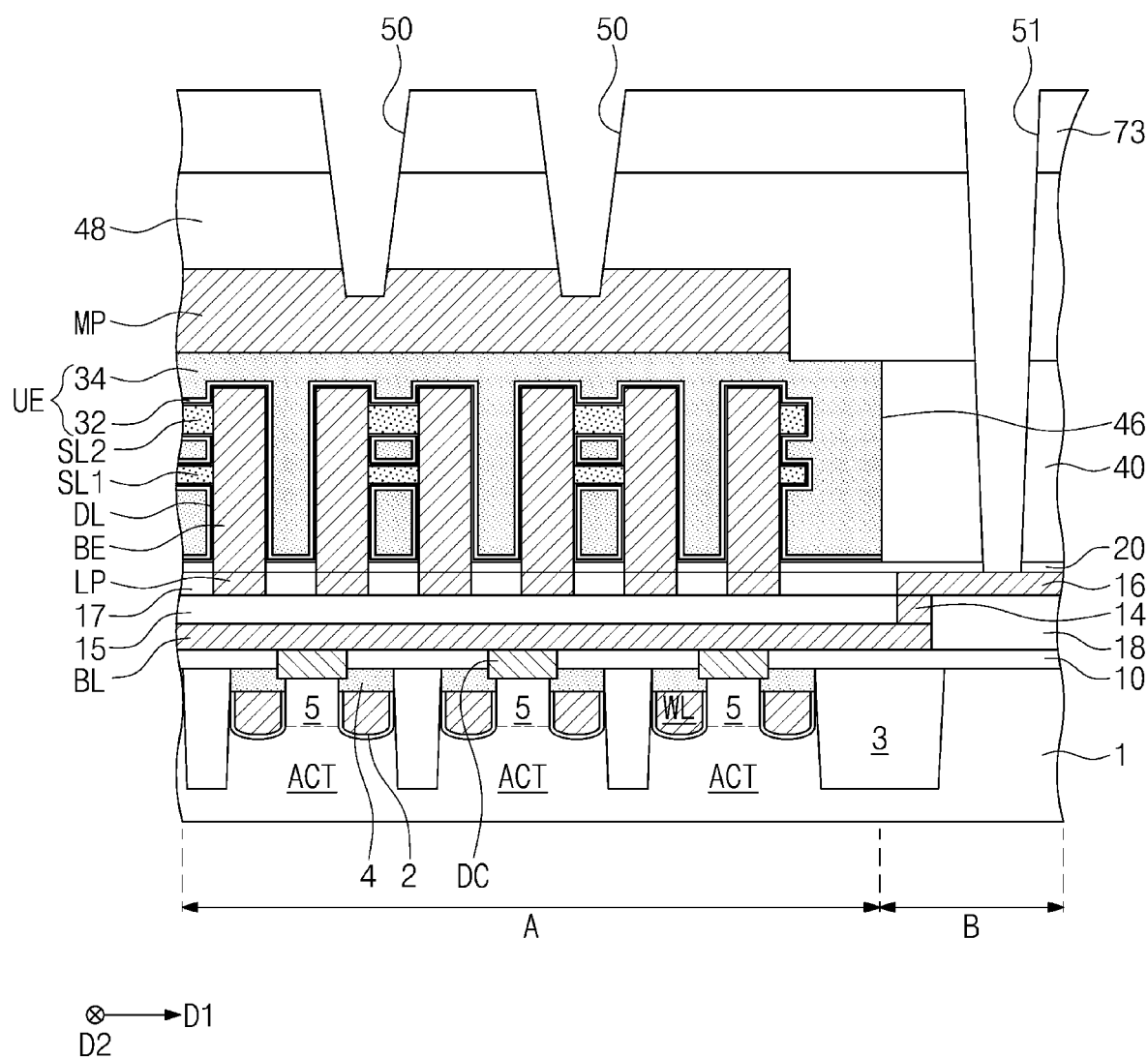

Referring to FIGS. 17D and 17E, the fourth interlayered insulating layer 48 may be formed to cover the top and side surfaces of the conductive pad MP, the exposed top surface of the silicon germanium layer 34, and the top surface of the third interlayered insulating layer 40. The third mask pattern 73 may be formed on the fourth interlayered insulating layer 48. The third mask pattern 73 may include the first openings U1, which are overlapped with the conductive pad MP, and the second opening U2, which is overlapped with the peripheral interconnection line 16. An etching process may be performed using the third mask pattern 73 as an etch mask. In an embodiment, the etching process may be a dry etching process. As a result of the etching process, the upper electrode contact holes 50 may be formed to expose the top surface of the conductive pad MP, and the peripheral contact hole 51 may be formed to expose the peripheral interconnection line 16. The upper electrode contact holes 50 and the peripheral contact hole 51 may be formed at the same time.

Referring back to FIG. 5, the third mask pattern 73 may be removed. Next, a conductive layer may be formed to fill the upper electrode contact holes 50 and the peripheral contact hole 51. Thereafter, a planarization process may be performed on the conductive layer to form the upper electrode contact plugs 54 and the peripheral contact plug 56 in the upper electrode contact holes 50 and the peripheral contact hole 51, respectively. As a result, the semiconductor memory device may be fabricated to have the structure of FIG. 5.

FIGS. 18A to 18D are sectional views illustrating a process of fabricating the semiconductor memory device of FIG. 6.

Figure 18A:
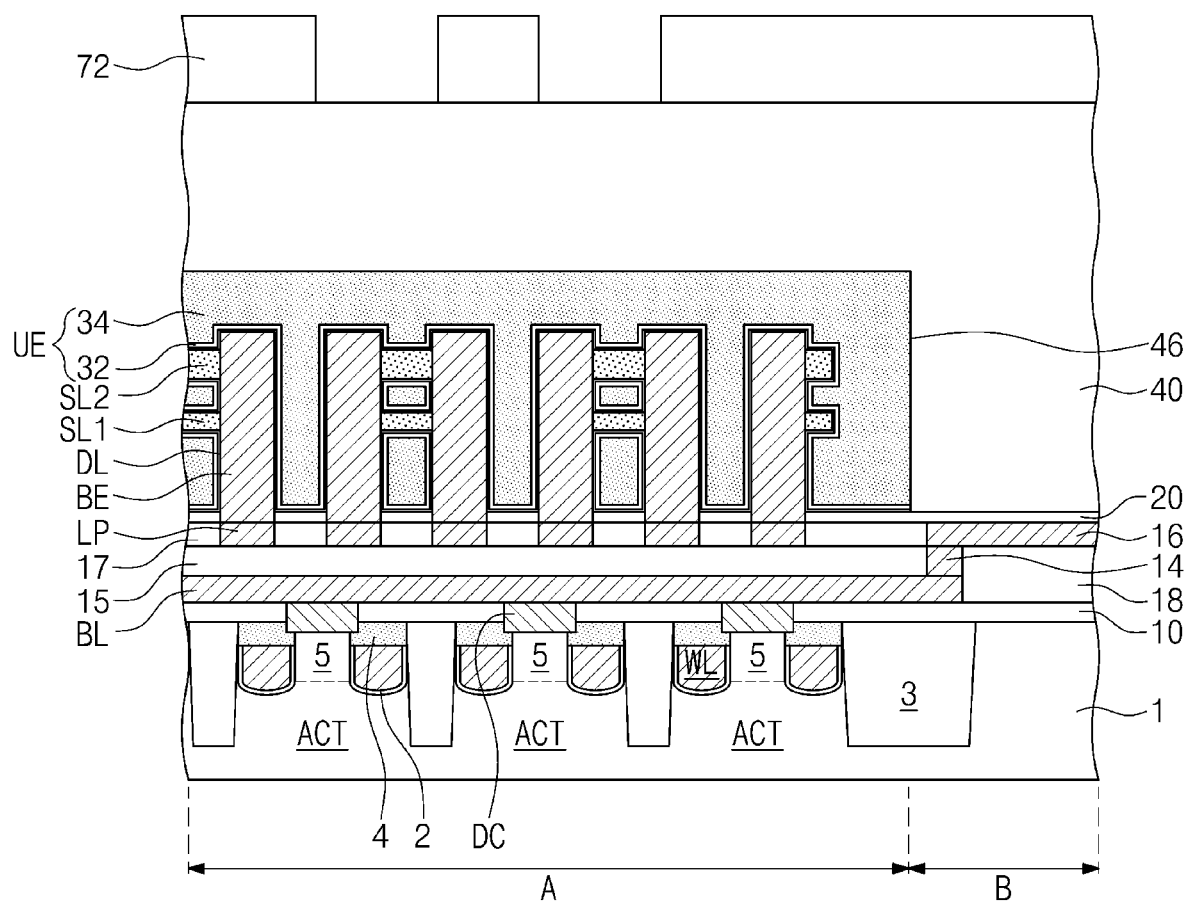
FIGS. 18A, 18B, 18C and 18D are sectional views illustrating a process of fabricating the semiconductor memory device of FIG. 6.

Referring to FIGS. 14E and 18A, the dielectric layer DL, the metal-containing layer 32, and the silicon germanium layer 34 may be formed on the cell region A and the peripheral region B. The first mask pattern 71 may be formed. The first mask pattern 71 may be formed to cover the top surface of the silicon germanium layer 34 on the cell region A, and then, the silicon germanium layer 34, the metal-containing layer 32, and the dielectric layer DL may be removed from the peripheral region B by an etching process.

The third interlayered insulating layer 40 may be formed to cover the silicon germanium layer 34. The third interlayered insulating layer 40 may cover the top surface 44 and the side surface 46 of the silicon germanium layer 34. The second mask pattern 72 with an opening may be formed on the third interlayered insulating layer 40. The second mask pattern 72 may be a photoresist pattern having a plurality of line-shaped openings, which are spaced apart from each other in the first direction D1 and are extended in the second direction D2.

Figure 18B:
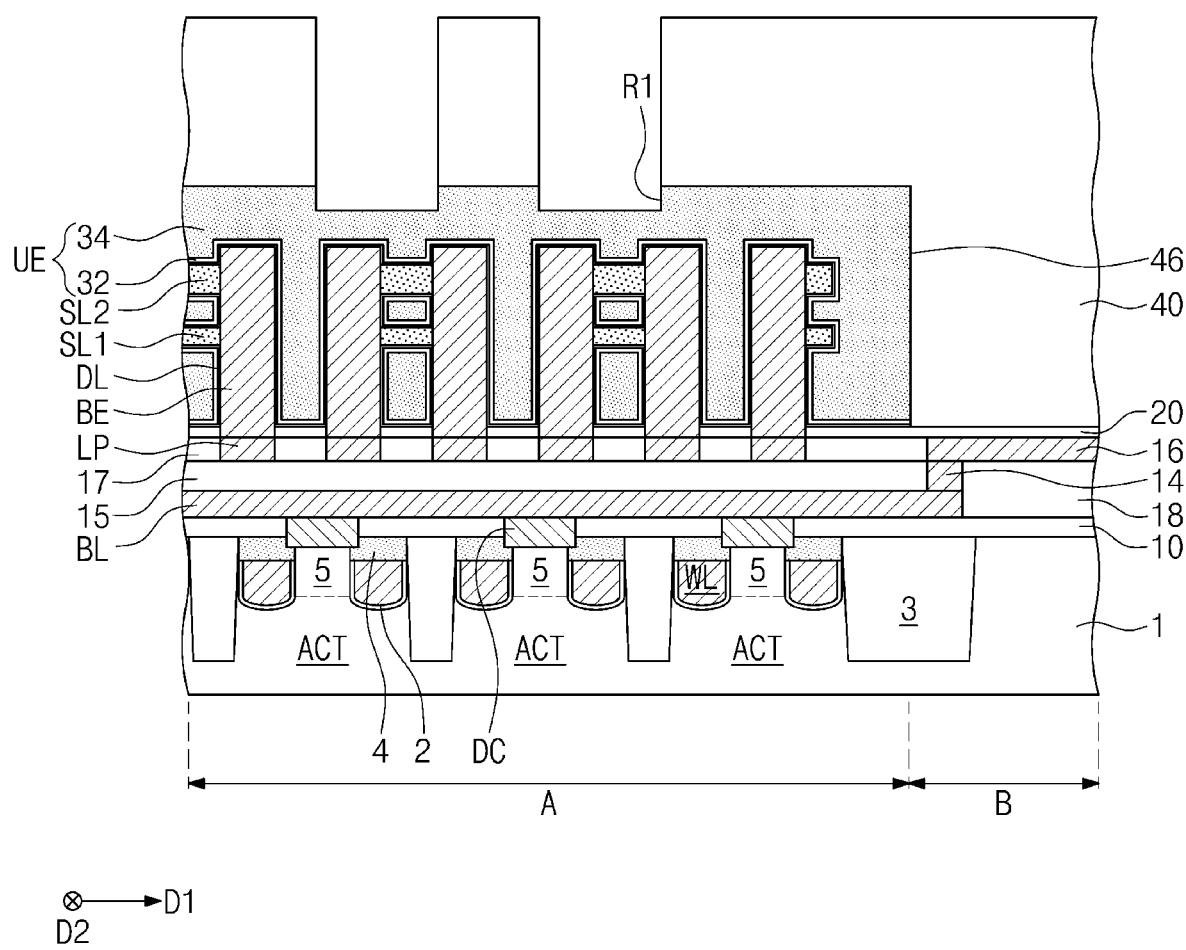

Referring to FIG. 18B, the third interlayered insulating layer 40 and a portion of the silicon germanium layer 34 may be etched using the second mask pattern 72 of FIG. 18A as an etch mask. The top surface of the silicon germanium layer 34 may have line-shaped portions, which are exposed and are extended in the second direction D2. The silicon germanium layer 34 may have the recesses R1. In other words, each of the recesses R1 may have a line shape extending in the second direction D2. Thereafter, the second mask pattern 72 may be removed.

Figure 18C:
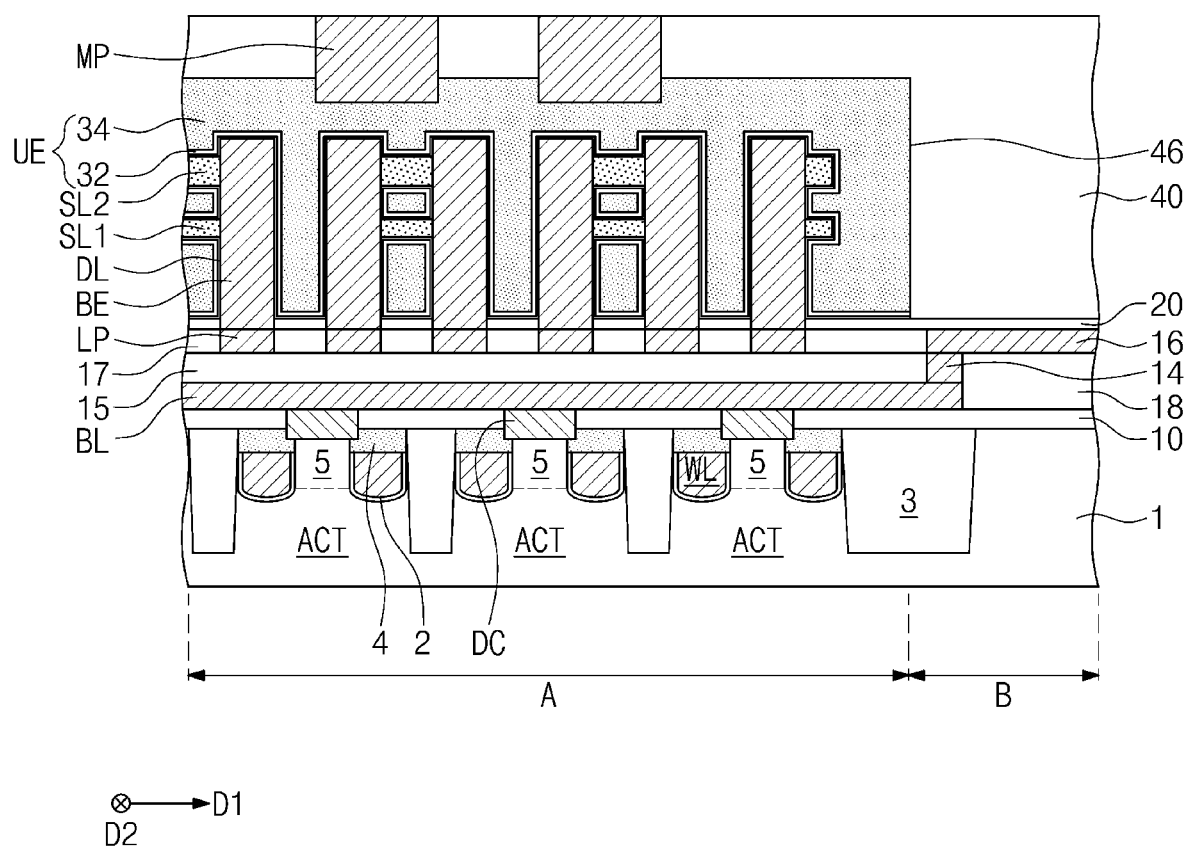

Referring to FIG. 18C, a conductive layer may be formed in the recesses R1. The conductive layer may be formed of or include tungsten. The recesses R1 may be filled with a portion of the conductive layer, and thereafter, a planarization process may be performed to planarize the top surfaces of the conductive layer and the third interlayered insulating layer 40. As a result of the planarization process on the conductive layer, the conductive pads MP may be formed to have flat top surfaces.

Figure 18D:
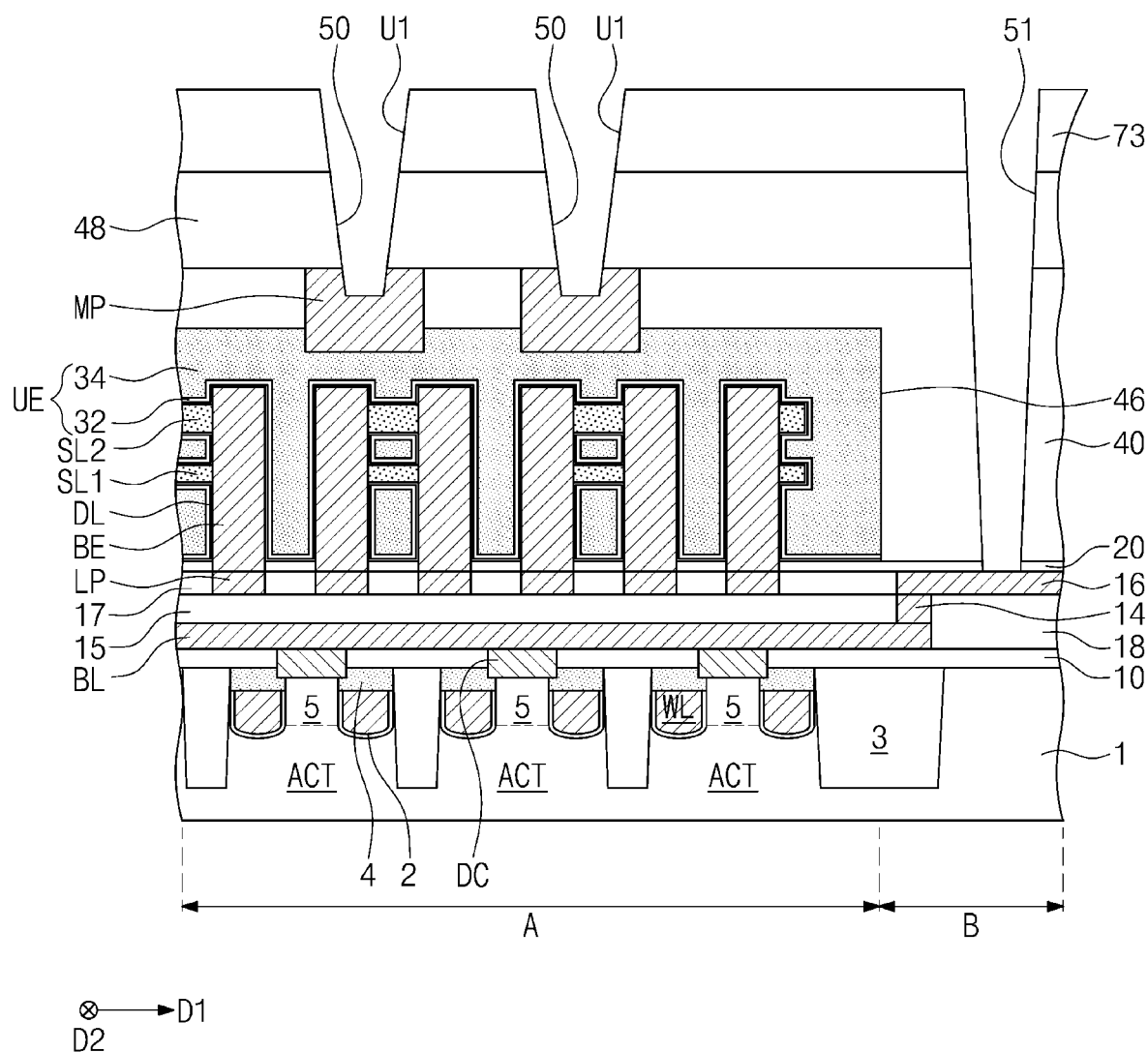

Referring to FIG. 18D, the fourth interlayered insulating layer 48 may be formed. The fourth interlayered insulating layer 48 may be formed on the third interlayered insulating layer 40 and the conductive pads MP. Thereafter, the third mask pattern 73 may be formed on the fourth interlayered insulating layer 48. The third mask pattern 73 may include the first openings U1, which are overlapped with the conductive pad MP, and the second opening U2, which is overlapped with the peripheral interconnection line 16. An etching process may be performed using the third mask pattern 73 as an etch mask. The etching process may be performed to penetrate the fourth interlayered insulating layer 48 and a portion of the conductive pad MP on the cell region A. As a result of the etching process, the upper electrode contact holes 50 may be formed to expose the top surface of the conductive pad MP, and the peripheral contact hole 51 may be formed to expose the peripheral interconnection line 16.

Referring back to FIG. 7, the third mask pattern 73 may be removed. Next, a conductive layer may be formed to fill the upper electrode contact holes 50 and the peripheral contact hole 51. The conductive layer may be formed of or include the same material as the conductive pad MP. Thereafter, a planarization process may be performed on the conductive layer to form the upper electrode contact plugs 54 and the peripheral contact plug 56 in the upper electrode contact holes 50 and the peripheral contact hole 51, respectively. As a result, the semiconductor memory device may be fabricated to have the structure of FIG. 7.

FIGS. 19A to 19E are sectional views illustrating a process of fabricating the semiconductor memory device of FIG. 13.

Figure 19A:
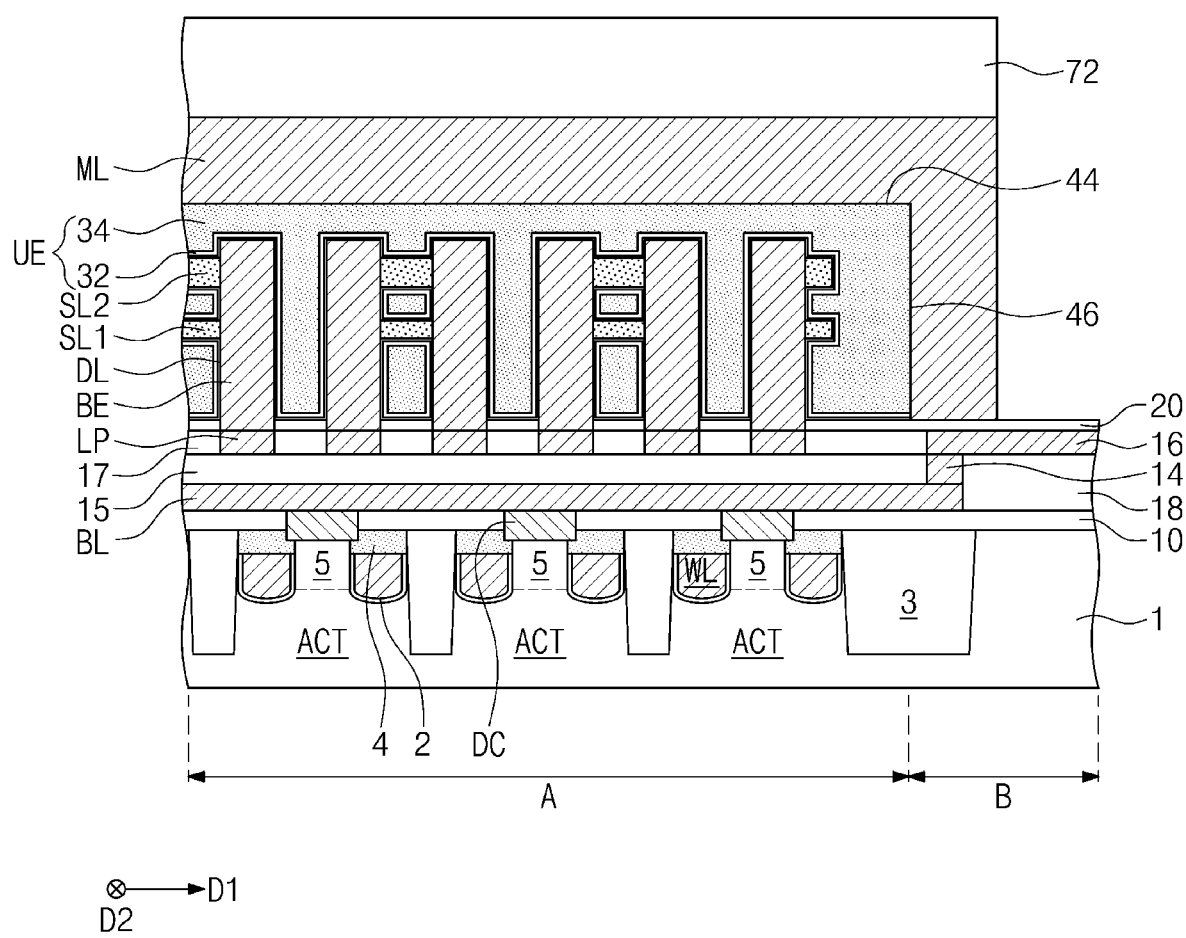
FIGS. 19A, 19B, 19C, 19D and 19E are sectional views illustrating a process of fabricating the semiconductor memory device of FIG. 13.

Referring to FIGS. 14E and 19A, the dielectric layer DL, the metal-containing layer 32, and the silicon germanium layer 34 may be formed on the cell region A and the peripheral region B. The first mask pattern 71 may be formed. The first mask pattern 71 may be formed to cover the top surface of the silicon germanium layer 34 on the cell region A, and then, the silicon germanium layer 34, the metal-containing layer 32, and the dielectric layer DL may be removed from the peripheral region B by an etching process.

The conductive layer ML may be formed to cover the silicon germanium layer 34. The conductive layer ML may be in contact with the top surface 44 and the side surface 46 of the silicon germanium layer 34. The second mask pattern 72 may be formed on the top surface of the conductive layer ML. The second mask pattern 72 may be formed to cover the top surface 44 of the conductive layer ML but expose the side surface 46.

Figure 19B:
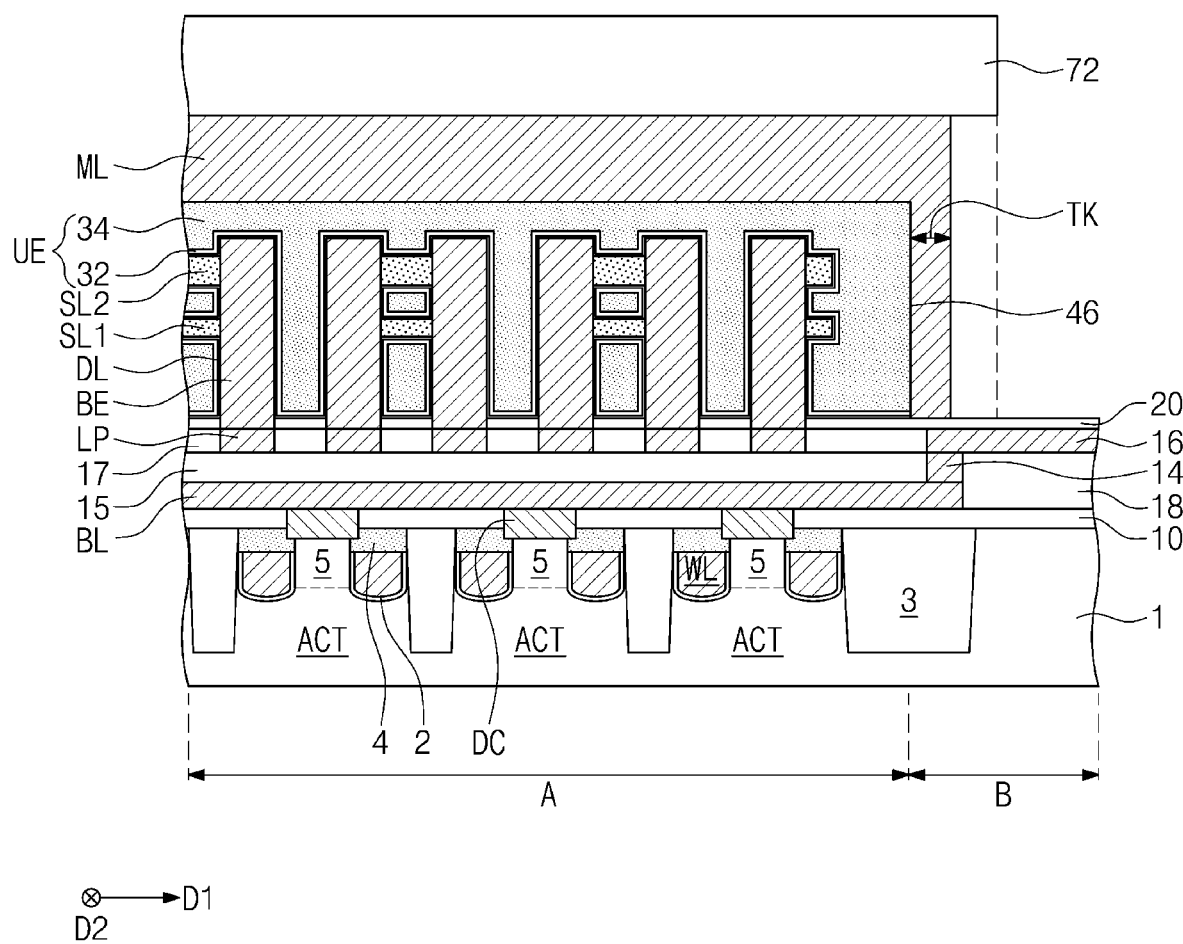
Figure 19C:
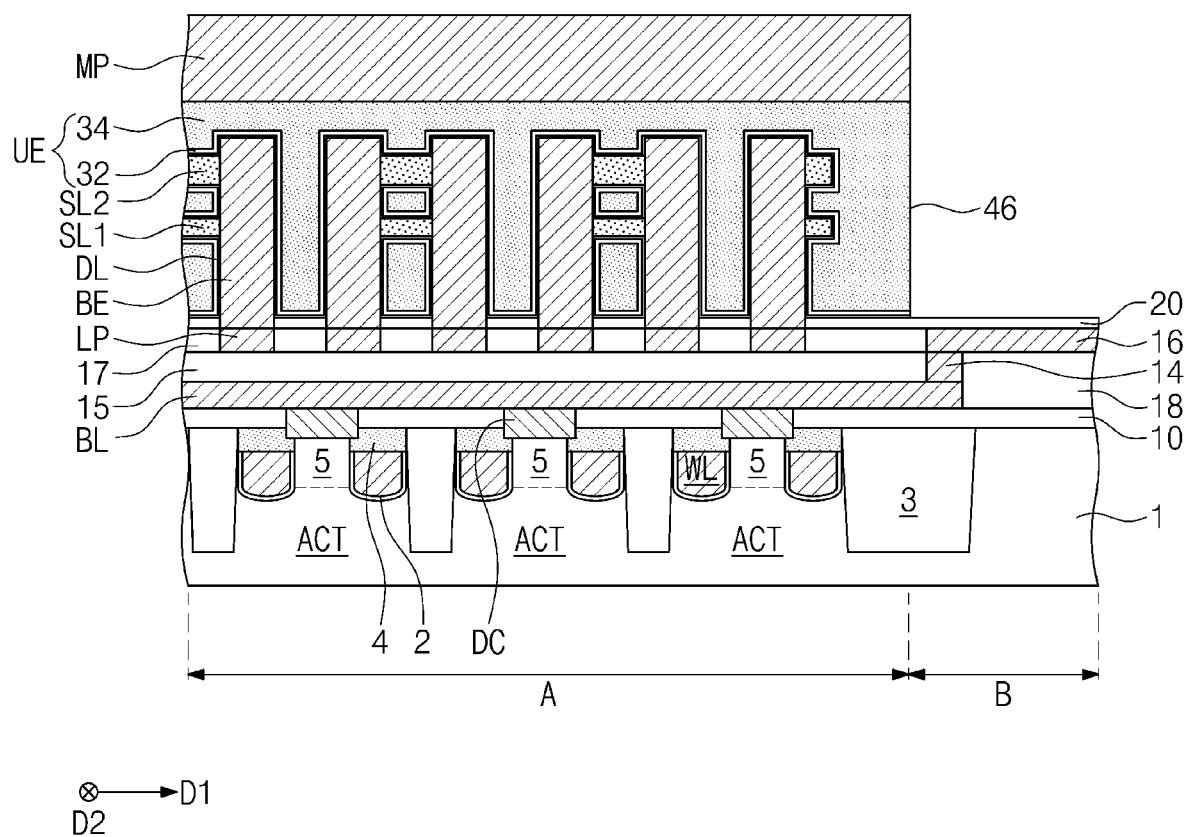

Referring to FIGS. 19B and 19C, an etching process using the second mask pattern 72 as an etch mask may be performed to etch the side surface of the conductive layer ML. The second mask pattern 72 may protect the conductive layer ML, which is overlapped with the top surface of the silicon germanium layer 34, from the etching process. The etching process may be, for example, a wet etching process. In an embodiment, the wet etching process may be an isotropic etching process, and in this case, the side surface of the conductive layer ML under the second mask pattern 72 may be laterally etched. A thickness TK of a sidewall of the conductive layer ML may be controlled by adjusting a process time for the etching process.

In an embodiment, the etching process on the conductive layer ML may be performed until the side surface of the silicon germanium layer 34 is exposed. The conductive pad MP may be formed as a result of the etching process on the conductive layer ML. In certain embodiments, the etching process may be terminated before the silicon germanium layer 34 is exposed. The second mask pattern 72 may be removed.

Figure 19D:
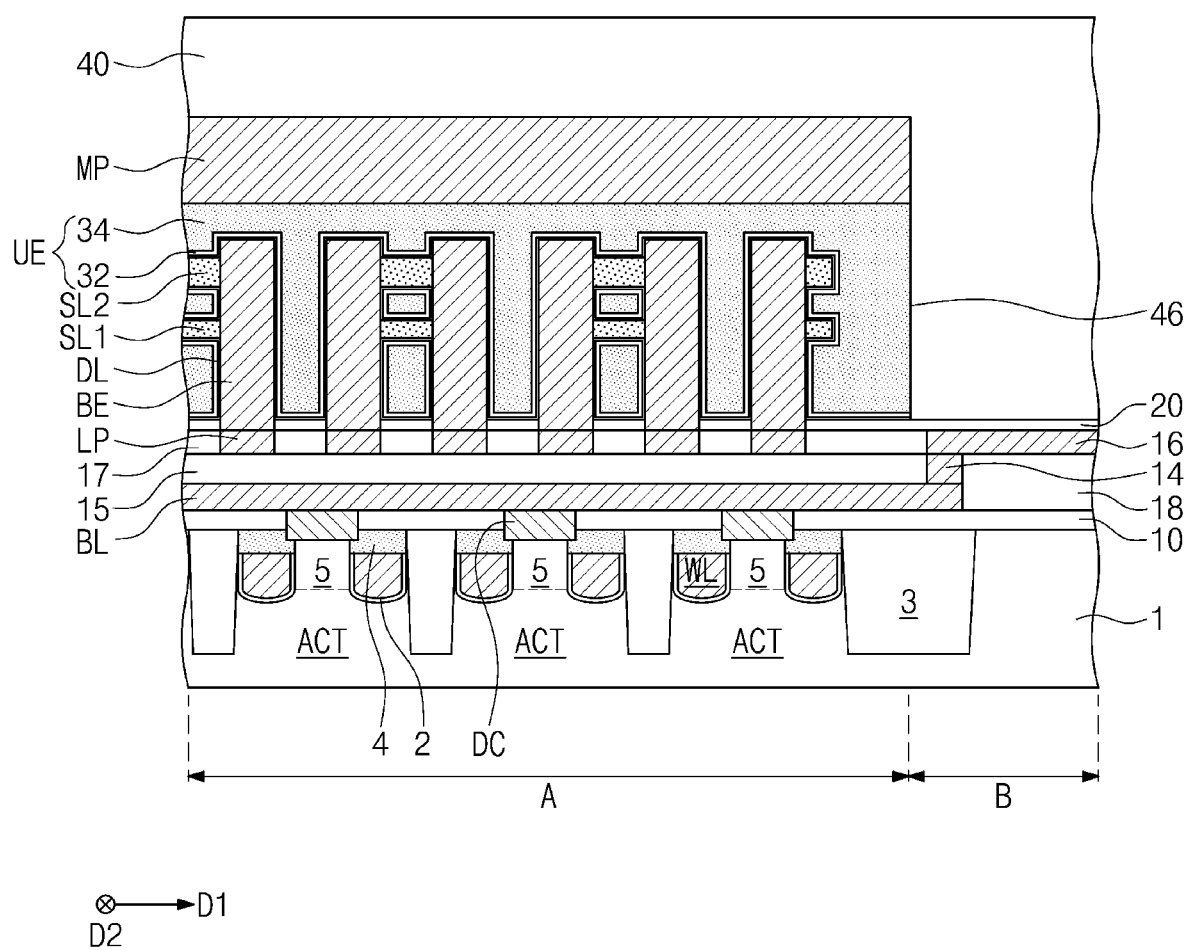

Referring to FIG. 19D, the third interlayered insulating layer 40 may be formed on the cell region A and the peripheral region B. The third interlayered insulating layer 40 may be formed to cover the top and side surfaces of the conductive pad MP and the side surface 46 of the silicon germanium layer 34.

Figure 19E:
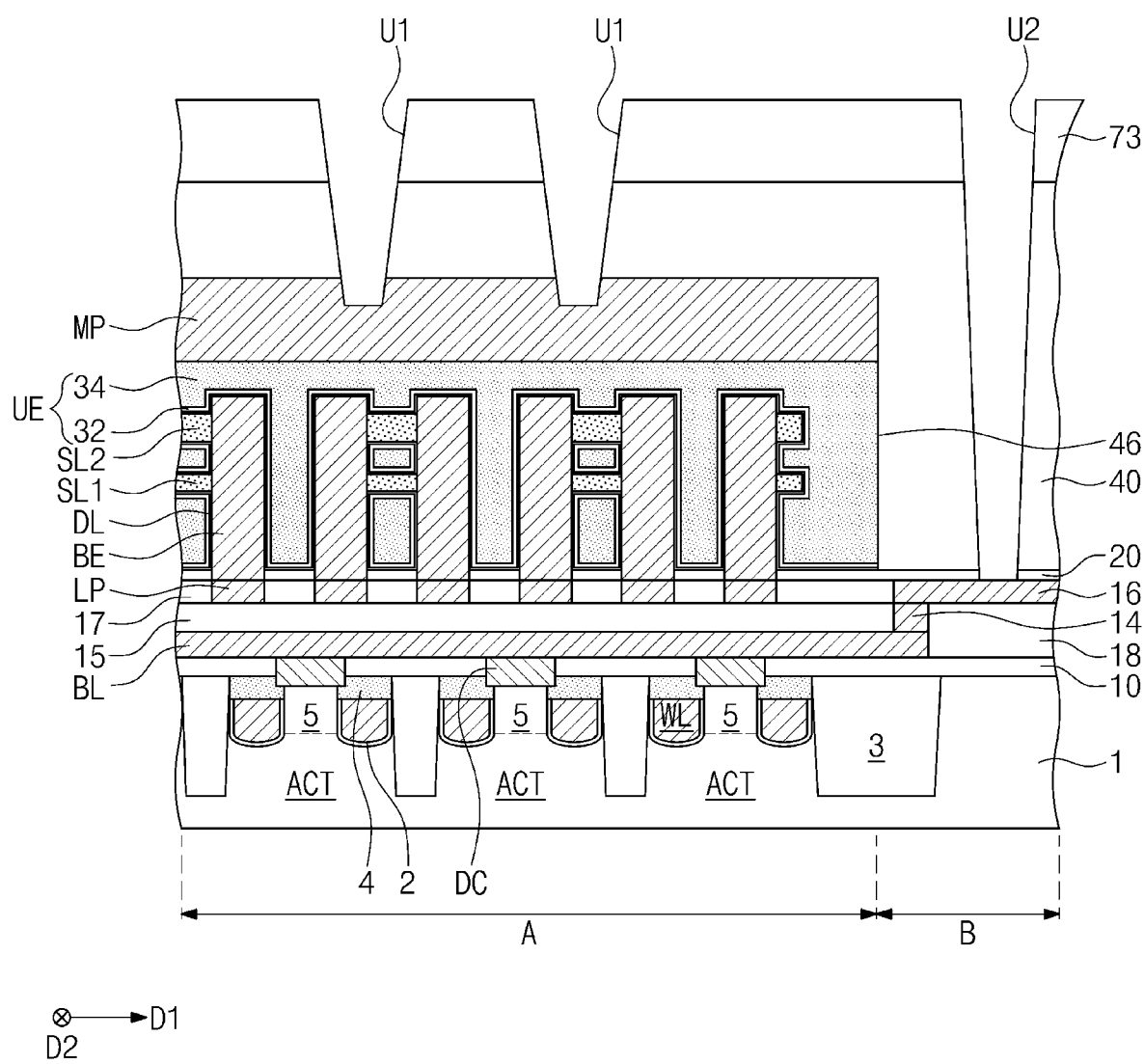

Referring to FIG. 19E, the third mask pattern 73 may be formed on the cell region A and the peripheral region B. The third mask pattern 73 may include the first openings U1, which are overlapped with the conductive pad MP, and the second opening U2, which is overlapped with the peripheral interconnection line 16.

An etching process using the third mask pattern 73 as an etch mask may be performed to simultaneously form the upper electrode contact holes 50 and the peripheral contact hole 51.

Referring back to FIG. 13, the third mask pattern 73 may be removed. Next, a conductive layer may be formed to fill the upper electrode contact holes 50 and the peripheral contact hole 51, and then, a planarization process may be performed on the conductive layer to form the upper electrode contact plugs 54 and the peripheral contact plug 56. As a result, the semiconductor memory device may be fabricated to have the structure of FIG. 13.

According to an embodiment, the conductive pad may be provided on the silicon germanium layer constituting the upper electrode, and thus, it may be possible to reduce a thickness of the silicon germanium layer, compared with the case that the upper electrode is formed of only the silicon germanium layer. In addition, a width of the silicon germanium layer may be reduced at the edge portion of the silicon germanium layer, and this may make it possible to reduce a chip size of a semiconductor device.

When the upper electrode contact plugs are formed on the silicon germanium layer, the upper electrode contact plug may be in contact with the conductive pad, and thus, the contact plugs may not penetrate the silicon germanium layer. Accordingly, it may be possible to prevent the contact plugs from being connected to the lower electrodes and thereby to prevent a short circuit from being formed between the memory cells.

In addition, the conductive pad may be formed of a different material from the silicon germanium layer and may include a metal material with high conductivity, and thus, it may be possible to reduce electric resistance between the silicon germanium layer and the upper electrode contact plug.

While example embodiments have been particularly shown and described, it will be understood by one of ordinary skill in the art that variations in form and detail may be made therein without departing from the spirit and scope of the attached claims.

What is claimed is:

1. A semiconductor device comprising:
   a substrate including a cell region and a peripheral region;
   a plurality of lower electrodes disposed on the substrate in the cell region;
   a dielectric layer disposed on the plurality of lower electrodes;
   a metal containing layer disposed on the dielectric layer;
   a silicon germanium layer disposed on and electrically connected to the metal containing layer;
   a conductive pad disposed on and electrically connected to the silicon germanium layer;
   an upper electrode contact plug disposed on and electrically connected to the conductive pad;
   a bit line that is disposed on the substrate in the cell region and extends in a first direction; and
   a plurality of word lines provided in the substrate in the cell region and extending in a second direction that crosses the first direction,
   wherein the conductive pad extends from the upper electrode contact plug towards the peripheral region in the first direction, and
   wherein the silicon germanium layer includes an edge portion that extends past the conductive pad in the first direction.

2. The semiconductor device of claim 1, wherein a width of the silicon germanium layer is greater than a width of the conductive pad.

3. The semiconductor device of claim 1, wherein the edge portion of the silicon germanium layer is interposed between the peripheral region and a side surface of the conductive pad.

4. The semiconductor device of claim 3, wherein the side surface of the conductive pad is substantially perpendicular to the first direction and a surface of the substrate.

5. The semiconductor device of claim 1, wherein a top surface of the silicon germanium layer includes a first surface that is covered by the conductive pad and a second surface corresponding to the edge portion that is not covered by the conductive pad and extends in the first direction past the conductive pad.

6. The semiconductor device of claim 5, wherein, relative to the substrate, the first surface of the silicon germanium layer is offset from the second surface of the silicon germanium layer.

7. The semiconductor device of claim 5, wherein the first surface of the silicon germanium layer, the second surface of the silicon germanium layer, and a side surface of the silicon germanium layer between the first surface and the second surface of the silicon germanium layer form a step structure.

8. The semiconductor device of claim 1, further comprising a peripheral contact plug electrically connected to the bit line and disposed in the peripheral region.

9. The semiconductor device of claim 8, wherein a lower surface of the upper electrode contact plug is farther from the substrate than a top surface of a portion of the silicon germanium layer that is covered by the conductive pad.

10. The semiconductor device of claim 1, further comprising a poly-silicon layer interposed between the silicon germanium layer and the conductive pad.

11. The semiconductor device of claim 1, further comprising a poly-silicon layer disposed on a top surface of the edge portion of the silicon germanium layer.

12. The semiconductor device of claim 11, wherein the conductive pad is disposed directly on the silicon germanium layer.

13. A semiconductor device comprising:
a substrate including a cell region and a peripheral region;
a plurality of lower electrodes disposed on the substrate in the cell region;
a dielectric layer disposed on the plurality of lower electrodes;
a metal containing layer disposed on the dielectric layer;
a silicon germanium layer disposed on and electrically connected to the metal containing layer;
a first conductive pad and a second conductive pad that are disposed on and electrically connected to the silicon germanium layer;
a first upper electrode contact plug disposed on and electrically connected to the first conductive pad;
a second upper electrode contact plug disposed on and electrically connected to the second conductive pad;
an interlayer insulator disposed on a first portion of the silicon germanium layer between the first conductive pad and the second conductive pad, and a second portion of the silicon germanium layer between the second conductive pad and the peripheral region;
a bit line that is disposed on the substrate in the cell region and extends in a first direction; and
a plurality of word lines provided in the substrate in the cell region and extending in a second direction that crosses the first direction.

14. The semiconductor device of claim 13, wherein a recess is formed in the first conductive pad and a recess is formed in the second conductive pad,
wherein the recess in the first conductive pad is filled by part of the first upper electrode contact plug, and
wherein the recess in the second conductive pad is filled by part of the second upper electrode contact plug.

15. The semiconductor device of claim 13, further comprising a third conductive pad and a fourth conductive pad that are disposed on and electrically connected to the silicon germanium layer,
wherein the first conductive pad and the second conductive pad are spaced apart from each other along the first direction,
wherein the third conductive pad and the fourth conductive pad are spaced apart from each other along the first direction, and
wherein the first conductive pad and the third conductive pad are spaced apart from each other along the second direction.

16. The semiconductor device of claim 15, wherein the interlayer insulator is interposed between each of the first conductive pad, the second conductive pad, the third conductive pad and the fourth conductive pad.

17. The semiconductor device of claim 13, further comprising a poly-silicon layer interposed between the silicon germanium layer, and both the first conductive pad and the second conductive pad.

18. The semiconductor device of claim 13, wherein an etch rate of the first conductive pad is less than an etch rate of the interlayer insulator.

19. A method of manufacturing a semiconductor device, the method comprising:
providing a substrate including a cell region and a peripheral region;
forming a plurality of lower electrodes on the substrate in the cell region;
forming a dielectric layer on the plurality of lower electrodes;
forming a metal containing layer on the dielectric layer;
forming a silicon germanium layer that is electrically connected to the metal containing layer on the metal containing layer;
forming a conductive layer that is disposed in the cell region and the peripheral region of the substrate, and is in contact with a top surface of the silicon germanium layer and a side surface of the silicon germanium layer;
forming a first etch mask pattern on the top surface of the silicon germanium layer;
performing an etch process using the first etch mask pattern to laterally etch the side surface of the conductive layer;
forming an interlayered insulating layer on the top surface and the side surface of the silicon germanium layer;
forming a second etch mask pattern on the interlayered insulating layer, the second etch mask pattern defining a first opening that overlaps the cell region and a second opening that overlaps the peripheral region;
performing an etch process using the second etch mask pattern to form an upper electrode contact hole in the cell region and a peripheral contact hole in the peripheral region, the peripheral contact hole being deeper than the upper electrode contact hole; and
filling the upper electrode contact hole and the peripheral contact hole with a conductive material to form an upper contact plug in the upper electrode contact hole and a peripheral contact plug in the peripheral contact hole.

20. The method of claim 19, wherein the side surface of the silicon germanium layer is exposed by the etch process performed using the first etch mask pattern to laterally etch the side surface of the conductive layer.

* * * * *